(12) United States Patent
Oh et al.

(10) Patent No.: US 9,391,117 B2
(45) Date of Patent: Jul. 12, 2016

(54) LIGHT EMITTING DIODE PACKAGE

(71) Applicant: LG INNOTEK CO., LTD., Seoul (KR)

(72) Inventors: Nam Seok Oh, Seoul (KR); Young Jun Cho, Seoul (KR); Kwang Kyu Choi, Seoul (KR); Young Min Moon, Seoul (KR); Sun Mi Moon, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 14/406,159

(22) PCT Filed: Jun. 7, 2013

(86) PCT No.: PCT/KR2013/005005
§ 371 (c)(1),
(2) Date: Dec. 5, 2014

(87) PCT Pub. No.: WO2013/183950
PCT Pub. Date: Dec. 12, 2013

(65) Prior Publication Data
US 2015/0155330 A1    Jun. 4, 2015

(30) Foreign Application Priority Data
Jun. 8, 2012  (KR) .................. 10-2012-0061289

(51) Int. Cl.
*H01L 33/62* (2010.01)
*H01L 33/64* (2010.01)
(Continued)

(52) U.S. Cl.
CPC ................ *H01L 27/15* (2013.01); *H01L 33/30* (2013.01); *H01L 33/32* (2013.01); *H01L 33/486* (2013.01);
(Continued)

(58) Field of Classification Search
CPC .................. H01L 25/0753; H01L 2224/48091; H01L 2224/48465; H01L 2224/49113; H01L 33/62
USPC .......................................................... 257/678
See application file for complete search history.

(56) References Cited

U.S. PATENT DOCUMENTS

| 2004/0238930 | A1  | 12/2004 | Arndt |
| 2006/0065957 | A1  | 3/2006  | Hanya |
| 2009/0309111 | A1* | 12/2009 | Grillot et al. .................... 257/94 |
| 2010/0155748 | A1  | 6/2010  | Chan et al. |
| 2012/0132937 | A1* | 5/2012  | Chan et al. ...................... 257/89 |
| 2013/0027930 | A1  | 1/2013  | Kobayakawa et al. |

FOREIGN PATENT DOCUMENTS

| EP | 0 356 037 A2 | 2/1990 |
| EP | 1 848 037 A2 | 10/2007 |

(Continued)

OTHER PUBLICATIONS

English Translation of JP 2010034221 A.*

*Primary Examiner* — Evan Pert
*Assistant Examiner* — Changhyun Yi
(74) *Attorney, Agent, or Firm* — Birch, Stewart, Kolasch & Birch, LLP

(57) ABSTRACT

One embodiment comprises first and second light-emitting chips, each comprising: a package body having a cavity; first to fourth lead frames disposed inside the package body; a first semiconductor layer; an active layer; and a second semiconductor layer and emitting light of a different wavelength from each other, wherein each of the first to fourth lead frames comprises: an upper surface part exposed to the cavity; and a side surface part bent from one side portion of the upper surface part and exposed by one surface of the package body. In addition, the first light-emitting chip is disposed on the upper surface part of the first lead frame, and the second light-emitting chip is disposed on the upper surface part of the third lead frame.

19 Claims, 30 Drawing Sheets

(51) Int. Cl.
*H01L 27/15* (2006.01)
*H01L 33/48* (2010.01)
*H01L 33/30* (2010.01)
*H01L 33/32* (2010.01)
*H01L 33/60* (2010.01)
*H01L 25/075* (2006.01)

(52) U.S. Cl.
CPC ............... *H01L 33/60* (2013.01); *H01L 33/62* (2013.01); *H01L 33/64* (2013.01); *H01L 33/647* (2013.01); *H01L 25/0753* (2013.01); *H01L 2224/45139* (2013.01); *H01L 2224/48091* (2013.01); *H01L 2224/48465* (2013.01); *H01L 2224/49113* (2013.01); *H01L 2924/3025* (2013.01)

(56) References Cited

FOREIGN PATENT DOCUMENTS

| | | | |
|---|---|---|---|
| EP | 2 650 935 A2 | 10/2013 | |
| JP | 2006-93435 A1 | 4/2006 | |
| JP | 2007-36294 A | 2/2007 | |
| JP | 2009-152268 A | 7/2009 | |
| JP | 2010-34221 A | 2/2010 | |
| JP | 2010034221 A * | 2/2010 | ............... H01S 5/343 |
| JP | 2011-166007 A | 8/2011 | |
| KR | 10-0993903 B1 | 11/2010 | |
| WO | WO 2011/136250 A1 | 10/2007 | |

\* cited by examiner

LIGHT EMITTING DIODE PACKAGE

TECHNICAL FIELD

Embodiments relate to light emitting diode packages, light source modules, and light emitting lamps for generation of light.

BACKGROUND ART

Lamps refer to devices that supply or regulate light for specific purposes. As light sources of lamps, incandescent bulbs, fluorescent lamps and neon lamps may be used and Light Emitting Diodes (LEDs) have recently been used.

LEDs are elements that change electrical signals into infrared light or other light using compound semiconductor properties. LEDs do not use any harmful material, such as mercury or the like, differently from fluorescent lamps, thus having less environmental pollution causing factors. In addition, LEDs have a longer lifespan than incandescent bulbs, fluorescent lamps, and neon lamps. In addition, as compared with incandescent bulbs, fluorescent lamps, and neon lamps, LEDs have lower power consumption and a higher color temperature, thus having excellent visibility and reduced glare.

Lamps using LEDs may be used, according to use purposes thereof, in backlights, display apparatuses, luminaires, automobile indicator lights, headlamps, and the like.

Such a lamp may include LED packages mounted on a board. Each LED package may include a package body and light emitting chips disposed on the package body. The light emitting chips increase in temperature upon light emission of the lamp. This temperature increase may vary properties of the light emitting chips (e.g., luminous intensity and wavelength variation) and, therefore, it is necessary to provide means for restricting increase in the temperature of light emitting chips.

DISCLOSURE

Technical Problem

Embodiments provide light emitting diode packages capable of generating two or more colors of light.

Technical Solution

In one embodiment, a light emitting diode package includes a package body having a cavity, first to fourth lead frames disposed within the package body, a first light emitting chip and a second light emitting chip each including a first semiconductor layer, an active layer, and a second semiconductor layer, the first light emitting chip and the second light emitting chip emitting light of different wavelength ranges, wherein each of the first to fourth lead frames includes an upper surface portion exposed to the cavity, and a side surface portion bent from one side of the upper surface portion, the side surface portion being exposed from one surface of the package body, wherein the first light emitting chip is placed on the upper surface portion of the first lead frame, and wherein the second light emitting chip is placed on the upper surface portion of the third lead frame.

The first lead frame may be located between the second lead frame and the fourth lead frame, and the third lead frame may be located between the first lead frame and the fourth lead frame.

The first light emitting chip may be configured to emit red light having a wavelength range of 600 nm-690 nm, and the second light emitting chip may be configured to emit amber light having a wavelength range of 550 nm-600 nm.

At least one of the first to fourth lead frames may have a through-hole at a boundary between the upper surface portion and the side surface portion.

Part of the package body may be located between the first lead frame and the second lead frame, between the first lead frame and the third lead frame, and between the third lead frame and the fourth lead frame.

The upper surface portion of the first lead frame and the upper surface portion of the third lead frame may be connected to each other. The side surface portion of the first lead frame and the side surface portion of the third lead frame may be connected to each other.

The upper surface portion of the second lead frame may be configured to surround two neighboring side surfaces of the upper surface portion of the first lead frame, and the upper surface portion of the fourth lead frame may be configured to surround two neighboring side surfaces of the upper surface portion of the second lead frame.

The side surface portion of each of the first lead frame and the third lead frame may include an upper end portion and a lower end portion, and the lower end portion may protrude from the upper end portion in a lateral direction.

The light emitting diode package may further include a first wire configured to electrically connect the first light emitting chip and the upper surface portion of the second lead frame to each other, and a second wire configured to electrically connect the second light emitting chip and the upper surface portion of the fourth lead frame to each other.

The light emitting diode package may further include a first Zener diode placed on the upper surface portion of the second lead frame, a second Zener diode placed on the upper surface portion of the fourth lead frame, a third wire configured to electrically connect the first Zener diode and the upper surface portion of the first lead frame to each other, and a fourth wire configured to electrically connect the second Zener diode and the upper surface portion of the third lead frame to each other.

Each of the first light emitting chip and the second light emitting chip may include a first electrode layer disposed on the first semiconductor layer, a reflective layer disposed under the second semiconductor layer, and a second electrode layer disposed under the reflective layer.

The first semiconductor layer and the second semiconductor layer may comprise any one of AlGaInP, AlN, AlGaN, InAlGaN, AlInN, AlGaAs and AlInP, and a content of Al in the second light emitting chip may be greater than a content of Al in the first light emitting chip. The content of Al in the first light emitting chip is 0.65~0.75, and the content of Al in the second light emitting chip is 0.85~0.95.

Advantageous Effects

Embodiments may achieve emission of two or more colors of light as well as reduction in the number and occupation area of light emitting chips to be mounted.

BEST MODE

Figure 1:
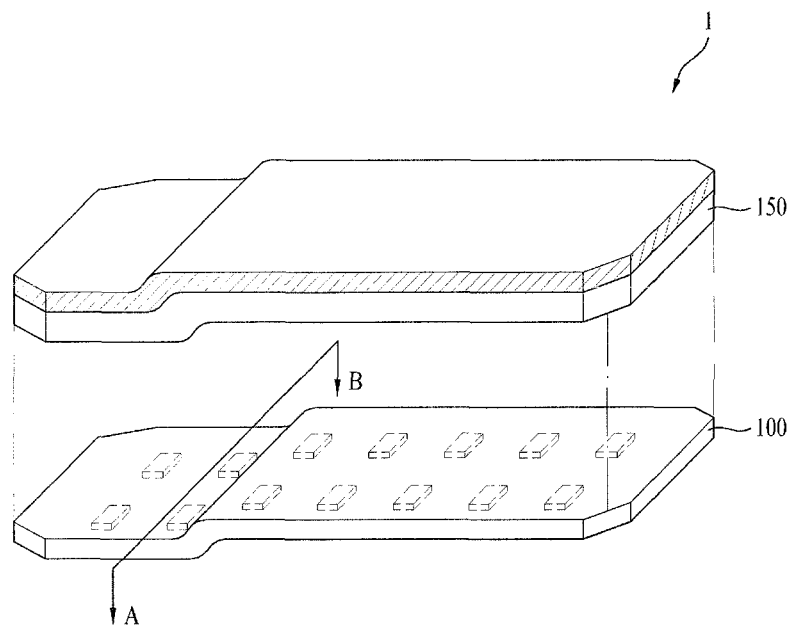
FIG. 1 is a view showing a light emitting lamp according to an embodiment.

Hereinafter, embodiments will be clearly revealed via description thereof with reference to the accompanying drawings. In the following description of the embodiments, it will be understood that, when an element such as a layer (film), region, pattern, or structure is referred to as being "on" or "under" another element, it can be "directly" on or under another element or can be "indirectly" formed such that an intervening element may also be present. In addition, it will also be understood that criteria of on or under is on the basis of the drawing.

In the drawings, dimensions of layers are exaggerated, omitted or schematically illustrated for clarity and description convenience. In addition, dimensions of constituent elements do not entirely reflect actual dimensions. Wherever possible, the same reference numbers will be used throughout the drawings to refer to the same or like parts. Hereinafter, a light emitting lamp and a light emitting diode package according to an embodiment will be described with reference to the accompanying drawings.

FIG. 1 shows a light emitting lamp 1 according to an embodiment.

Referring to FIG. 1, the light emitting lamp 1 includes a light source module 100 in the form of a planar light source, and a housing 150 in which the light source module 100 is received.

The light source module 100 may include at least one light emitting diode 20 that generates light. The light source module may configure a planar light source via diffusion and distribution of light generated from the light emitting diode 20 in the form of a point light source, and may be bendable due to flexibility thereof.

The housing 150 may be formed of a material (e.g., formed of acryl) that is capable of protecting the light source module 100 from shock and transmitting light emitted from the light source module 100. In addition, the housing 150 may include a curved portion in terms of design. The light source module 100 may be easily received in the curved housing 150 owing to flexibility thereof.

Figure 2:
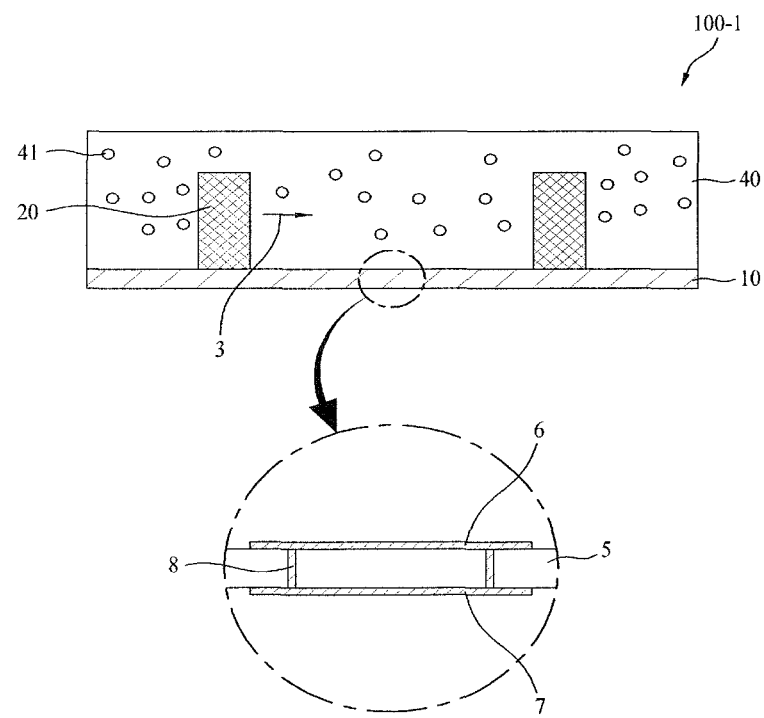
FIGS. 2 to 20 are views showing first to nineteenth embodiments of a light source module shown in FIG. 1.

FIG. 2 shows a first embodiment 100-1 of the light source module shown in FIG. 1.

FIG. 2 is a sectional view taken along line AB shown in FIG. 1. Referring to FIG. 2, the light source module 100-1 includes a flexible board 10, light emitting diodes 20, and a light guide layer 40.

The flexible board 10 may be a printed circuit board having flexibility and electric insulation. For example, the flexible board 10 may include a base member 5 and a circuit pattern 6 or 7 disposed on at least one surface of the base member 5. The base member 5 may be formed of a flexible and insulative film, for example, polyimide or epoxy (such as FR-4) film.

The flexible board 10 may include an insulative film (such as a polyimide or FR-4 film), a first copper foil pattern 6, a second copper foil pattern 7, and via-contacts 8. The first copper foil pattern 6 may be formed on one surface (e.g., an upper surface) of the insulative film 5, and the second copper foil pattern 7 may be formed on the other surface (e.g., a lower surface) of the insulative film 5. The via-contacts 8 may penetrate the insulative film 5 to connect the first copper foil pattern 6 and the second copper foil pattern 7 to each other.

The one or more light emitting diodes 20 are disposed on the flexible board 10 to emit light. For example, the light emitting diodes 20 may construct a side view type light emitting diode package in which light emitted from the light emitting diodes is directed in a lateral direction 3 of the light guide layer 40. In this case, while light emitting chips mounted on the light emitting diode package may be vertical light emitting chips, for example, red light emitting chips shown in FIG. 7, the embodiment is not limited thereto.

The light guide layer 40 may be disposed over the flexible board 10 and the light emitting diodes 20 such that the light emitting diodes 20 are embedded in the light guide layer 40. The light guide layer 40 may diffuse and guide light, emitted from the light emitting diodes 20 in the lateral direction 3 of the light guide layer 40, toward one surface (e.g., an upper surface) of the light guide layer 40.

The light guide layer 40 may be formed of a resin that is a material capable of diffusing light. For example, the light guide layer 40 may be formed of a high heat-resistant ultraviolet-curing resin containing oligomer. In this case, a content of the oligomer may be 40 to 50 parts by weight. In addition, the ultraviolet-curing resin may be urethane acrylate without being limited thereto, and may be at least one of epoxy acrylate, polyester acrylate, polyether acrylate, poly-butadiene acrylate, and silicon acrylate.

Particularly, when urethane acrylate is used as the oligomer, a mixture of two types of urethane acrylate may be used to simultaneously achieve different physical properties.

For example, isocyanate is used in synthesis of urethane acrylate, and physical properties (e.g., yellowing, weather resistance, and chemical resistance) of urethane acrylate are determined by isocyanate. In this case, the oligomer according to the embodiment may include, as one type of urethane acrylate, urethane acrylate isocyanate in which NCO % of phenylene diisocyanate (PDI) or isophorone diisocyanate (IPDI) becomes 37% (hereinafter referred to as "first oligomer") and, as the other type of urethane acrylate, urethane acrylate isocyanate in which NCO % of phenylene diisocyanate (PDI) or isophorone diisocyanate (IPDI) becomes 30~50% or 25~35% (hereinafter referred to as "second oligomer"). In this way, the first oligomer and the second oligomer having different physical properties depending on NCO % regulation may be attained, and the oligomer constituting the light guide layer 40 may be prepared by mixing the first oligomer and the second oligomer with each other. In this case, a weight ratio of the first oligomer may be within a range of 15 to 20, and a weight ratio of the second oligomer may be within a range of 25 to 35.

Meanwhile, the light guide layer 40 may further comprise at least one of a monomer and a photoinitiator. In this case, a content of the monomer may be 65 to 90 parts by weight. More specifically, the light guide layer 40 may comprise a mixture of 35~45 parts by weight of isobornyl acrylate (IBOA), 10~15 parts by weight of 2-Hydroxyethyl Methacrylate (2-HEMA), and 15~20 parts by weight of 2-Hydroxybutyl acrylate (2-HBA). In addition, the photoinitiator (e.g., 1-hydroxycyclohexyl phenyl-ketone, diphenyl, or diphenyl (2,4,6-trimethylbenzoyl phosphine oxide) may be present in a content of 0.5 to 1 parts by weight.

In addition, the light guide layer 40 may be formed of a high heat-resistant thermosetting resin. More specifically, the light guide layer 40 may be formed of a thermosetting resin that includes at least one of a polyester polyol resin, an acryl polyol resin, and a hydrocarbon-based and/or ester-based solvent. This thermosetting resin may further comprise a thermosetting agent for coating strength enhancement.

In the case of the polyester polyol resin, a content thereof may be 9~30% of the total weight of the thermosetting resin. In addition, in the case of the acryl polyol resin, a content thereof may be 20~40% of the total weight of the thermosetting resin.

In the case of the hydrocarbon-based and/or ester-based solvent, a content thereof may be 30~70% of the total weight of the thermosetting resin. In the case of the thermosetting agent, a content thereof may be 1~10% of the total weight of the thermosetting resin.

When the light guide layer 40 is formed of the above-described material, the light guide layer 40 may exhibit reinforced heat resistance and minimize luminance deterioration due to heat even when used in a light emitting lamp that radiates high-temperature heat, which enables provision of a high reliability light emitting lamp.

In addition, in the embodiment, as the above-described material is used to construct a planar light source, innovative reduction in the thickness of the light guide layer 40 may be accomplished, which enables much thinner products. In addition, in the embodiment, the light guide layer comprises a flexible material and is easily configured into a curved form, which may improve freedom in design and allow the light guide layer to be applied to other flexible displays.

The light guide layer 40 may comprise a diffusion material 41 containing hollows (or pores). The diffusion material 41 may be mixed with or diffused into the resin constituting the light guide layer 40 and serve to enhance reflectance and diffusion of light.

For example, as light emitted from the light emitting diodes 20 into the light guide layer 40 is reflected by and passes through the hollows of the diffusion material 41, diffusion and concentration of light occur in the light guide layer 40. The diffused and concentrated light then may be emitted from one surface (e.g., the upper surface) of the light guide layer 40. In this case, the diffusion material 41 may increase reflectance and diffusion of light, thereby achieving an enhanced luminous intensity and uniformity of light emitted from the upper surface of the light guide layer 40 and, consequently, enhanced luminance of the light source module 100-1.

A content of the diffusion material 41 may be appropriately regulated in order to achieve desired light diffusion effects. More specifically, a content of the diffusion material may be regulated within a range of 0.01~0.3% relative to a weight of the entire light guide layer 40, without being limited thereto. The diffusion material 41 may be any one selected from among silicon, silica, glass bubble, polymethyl methacrylate (PMMA), urethane, Zn, Zr, $Al_2O_3$, and acryl and have a particle size of 1 µm~20 µm, without being limited thereto.

The light source module of the first embodiment may have a reduced thickness and be easily mounted to a curved housing or the like owing to flexibility of the flexible board 10 and the light guide layer 40, which may enhance freedom in product design.

Figure 3:
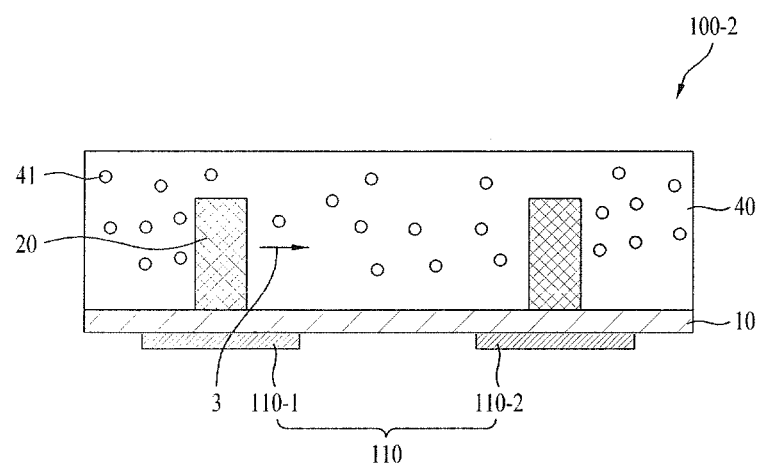

FIG. 3 shows a second embodiment 100-2 of the light source module shown in FIG. 1. The same reference numerals as those of FIG. 2 indicate the identical components, and these identical components, which have been described above, will not be repeatedly described or will be described in brief.

Referring to FIG. 3, to enhance radiation efficiency, the second embodiment may further include a radiation member 110 as compared to the first embodiment 100-1.

The radiation member 110 is disposed on a lower surface of the flexible board 10 and serves to outwardly radiate heat generated in the light emitting diodes 20. In other words, the radiation member 110 may enhance outward radiation efficiency of heat generated in the light emitting diodes 20.

For example, the radiation member 110 may be disposed on part of the lower surface of the flexible printed circuit board 10. The radiation member 110 may include a plurality of radiation layers (e.g., 110-1 and 110-2) spaced apart from each other. The radiation layers 110-1 and 110-2 may at least partially overlap the light emitting diodes 20 in the vertical direction in order to improve radiation effects. Here, the vertical direction may be a direction from the flexible printed circuit board 10 to the light guide layer 40.

The radiation member 110 may be formed of a high thermal-conductivity material, such as, for example, aluminum, aluminum alloy, copper, or copper alloy. Alternatively, the radiation member 110 may be a Metal Core Printed Circuit Board (MCPCB). The radiation member 110 may be attached to the lower surface of the flexible board 10 by an acryl-based adhesive (not shown).

Generally, light emitting diodes may exhibit a reduced luminous intensity and undergo wavelength shift of light when a temperature of the light emitting diodes increases by heat generated therein. Such wavelength shift and reduction in luminous intensity are particularly serious in the case of red light emitting diodes.

However, the light source module 100-2 may efficiently radiate heat generated in the light emitting diodes 20 using the radiation member 110 attached to the lower surface of the flexible board 10, thereby restricting increase in the temperature of the light emitting diodes, which may restrict reduction in the luminous intensity of the light source module 100-2 or occurrence of wavelength shift of the light source module 100-2.

Figure 4:
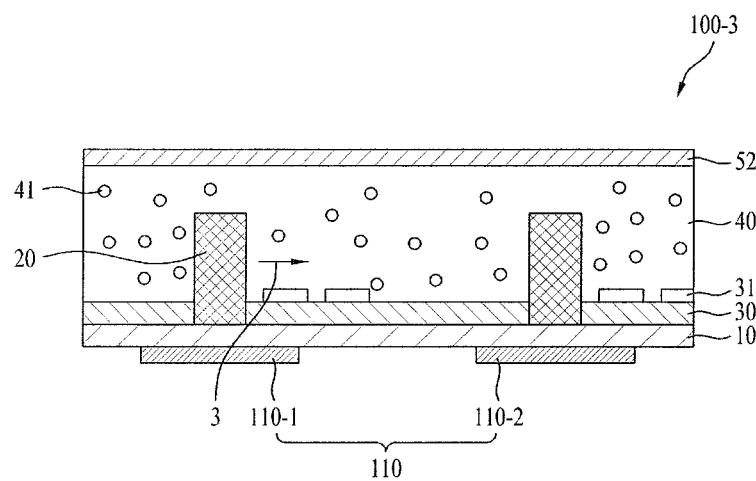

FIG. 4 shows a third embodiment 100-3 of the light source module shown in FIG. 1. The same reference numerals as those of FIG. 3 indicate the identical components, and these identical components, which have been described above, will not be repeatedly described or will be described in brief.

Referring to FIG. 4, the light source module 100-3 may further include a reflective sheet 30, a reflective pattern 31, and a first optical sheet 52 as compared to the second embodiment.

The reflective sheet 30 may be interposed between the flexible board 10 and the light guide layer 40 and the light emitting diodes 20 may penetrate the reflective sheet 30. For example, the reflective sheet 30 may be located at the remaining region of the flexible board 10 except for a region where the light emitting diodes 20 are disposed.

The reflective sheet 30 may be formed of a high reflectance material. The reflective sheet 30 may reflect light emitted from the light emitting diodes 20 to one surface (e.g., the upper surface) of the light guide layer 40 to prevent leakage of light from the other surface (e.g., the lower surface) of the light guide layer 40, thereby reducing light loss. The reflective sheet 30 may take the form of a film, and may comprise a synthetic resin containing a white pigment distributed therein in order to facilitate reflection and distribution of light.

For example, the white pigment may be titan oxide, aluminum oxide, zinc oxide, lead carbonate, barium sulfate, calcium carbonate and the like, and the synthetic resin may be polyethylene terephthalate, polyethylene naphthalate, acryl resin, polycarbonate, polystyrene, polyolefin, cellulose acetate, weather-proof vinyl chloride and the like, without being limited thereto.

The reflective pattern 31 may be disposed on a surface of the reflective sheet 30 and serve to scatter and distribute incident light. The reflective pattern 31 may be formed by printing reflective ink on the surface of the reflective sheet 30 without being limited thereto, the reflective ink including any one of $TiO_2$, $CaCO_3$, $BaSO_4$, $Al_2O_3$, silicon and polystyrene (PS).

In addition, the reflective pattern 31 may configure a plurality of regular or irregular protrusions. To enhance light scattering, the reflective pattern 31 may have a prism shape, lenticular shape, lens shape or combinations thereof, without being limited thereto. In FIG. 4, a cross section of the reflective pattern 31 may have any of various shapes including, for example, a polygonal shape, such as triangular and rectangular shapes, semicircular shape, and sinusoidal shape. When viewed from the top, the reflective pattern 31 may have a polygonal shape (e.g., a hexahedral shape), circular shape, oval shape, or semicircular shape.

Figure 21:
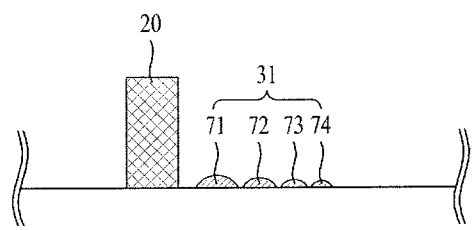
FIG. 21 is a view showing one embodiment of a reflective pattern shown in FIG. 4.

FIG. 21 is a view showing one embodiment of the reflective pattern shown in FIG. 4. Referring to FIG. 21, the reflective pattern 31 may have a varying diameter depending on a distance from the light emitting diode 20.

For example, the reflective pattern 31 may increase in diameter with decreasing distance from the light emitting diode 20. More specifically, the diameter may be greater in the order of a first reflective pattern 71, a second reflective pattern 72, a third reflective pattern 73, and a fourth reflective pattern 74. However, the embodiment is not limited thereto.

The first optical sheet 52 is disposed on the light guide layer 40 and transmits light emitted from one surface (e.g., the upper surface) of the light guide layer 40. The first optical sheet 52 may be formed using a good transmittance material, for example, polyethylene terephthalate (PET).

Figure 5:
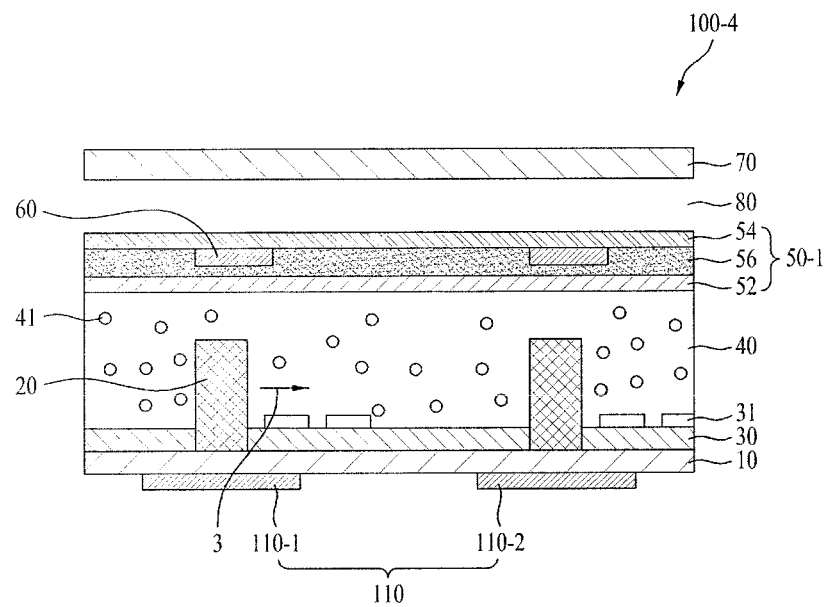

FIG. 5 shows a fourth embodiment 100-4 of the light source module shown in FIG. 1.

Referring to FIG. 5, the light source module 100-4 may further include a second optical sheet 52, an adhesive member 56, a light shielding pattern 60, and a second optical sheet 54 as compared to the third embodiment 100-3.

The second optical sheet 54 is disposed over the first optical sheet 52. The second optical sheet 54 may be formed using a good transmittance material, for example, PET.

The adhesive member 56 is interposed between the first optical sheet 52 and the second optical sheet 54 to attach the first optical sheet 52 and the second optical sheet 54 to each other.

The optical pattern 60 may be disposed on at least one of an upper surface of the first optical sheet 52 or a lower surface of the second optical sheet 54. The optical pattern 60 may be attached to at least one of the upper surface of the first optical sheet 52 or the lower surface of the second optical sheet 54 by the adhesive member 56. In some embodiments, one or more optical sheets (not shown) may be additionally provided on the second optical sheet 56. In this case, a structure including the first optical sheet 52, the second optical sheet 54, the adhesive member 56, and the optical pattern 60 may be defined as an optical pattern layer 50-1.

The optical pattern 60 may be a light shielding pattern to prevent concentration of light emitted from the light emitting diodes 20. The optical pattern 60 may be aligned with the light emitting diodes 20 and attached to the first optical sheet 52 and the second optical sheet 54 via the adhesive member 56.

The first optical sheet 52 and the second optical sheet 54 may be formed using a good transmittance material, for example, PET.

The optical pattern 60 basically functions to prevent concentration of light emitted from the light emitting diodes 20. In other words, the optical pattern 60 may achieve uniform planar light emission in conjunction with the above-described reflective pattern 31.

The optical pattern 60 may be a light shielding pattern that shields part of light emitted from the light emitting diodes 20 and may prevent deterioration of optical properties or derivation of yellow light due to an excessive intensity of light. For example, the optical pattern 60 may serve to prevent light from concentrating on a region proximate to the light emitting diodes and to achieve distribution of light.

The optical pattern 60 may be formed by performing a printing process on the upper surface of the first optical sheet 52 or the lower surface of the second optical sheet 54 using light shielding ink. To allow the optical pattern 60 to serve not to completely shield light, but to shield part of light and to diffuse light, a density and/or size of the optical pattern may be regulated to enable regulation in the light shielding or diffusion of light. For example, a density of the optical pattern may be reduced with increasing distance from the light emitting diode 20 in order to achieve enhanced luminous efficacy, without being limited thereto.

More specifically, the optical pattern 60 may have an overlapping printing structure of complex patterns. The overlapping printing structure refers to a structure acquired by forming one pattern and then printing another pattern on the previous pattern.

For example, the optical pattern 60 may include a diffusion pattern and a light shielding pattern, the diffusion pattern and the light shielding pattern overlapping each other. For example, the diffusion pattern may be formed on a lower surface of a polymer film (e.g., the second optical sheet 54) in a light emission direction using light shielding ink that includes any one or more materials selected from among $TiO_2$, $CaCO_3$, $BaSO_4$, $Al_2O_3$, and silicon. Then, the light shielding pattern may be formed on the surface of the polymer film using light shielding ink that includes Al or a mixture of Al and $TiO_2$.

More specifically, such a dual structure may be acquired by forming the diffusion pattern on the surface of the polymer film via white printing and, subsequently, forming the light shielding pattern on the diffusion pattern, or vice versa. Of course, those skilled in the part will clearly understand that this pattern forming design may be altered in various ways in consideration of luminous efficacy and intensity and light shielding efficiency.

Alternatively, in some embodiments, the optical pattern 60 may have a triple structure including a first diffusion pattern, a second diffusion pattern, and a light shielding pattern interposed between the first and second diffusion patterns. The triple structure may be acquired by selectively using the aforementioned materials. For example, the first diffusion pattern may comprise $TiO_2$ having a high index of refraction, the second diffusion pattern may comprise $CaCO_3$ and $TiO_2$ which have excellent light stability and exhibit vivid color, and the light shielding pattern may comprise Al providing excellent concealment. The embodiment may ensure effectiveness and uniformity of light via the optical pattern having a triple structure. In particular, $CaCO_3$ functions to emit white light by reducing exposure of yellow light, resulting in stable luminous efficacy. Other diffusion materials for use in the diffusion pattern except for $CaCO_3$ may include inorganic materials that have a large particle size and a similar structure, such as $BaSO_4$, $Al_2O_3$, and silicon.

The adhesive member 56 may surround the periphery of the optical pattern 60 and secure the optical pattern 60 to the first optical sheet 52 and/or the second optical sheet 54. In this case, the adhesive member 56 may be a thermosetting pressure sensitive adhesive (PSA), thermosetting adhesive, or UV-curing PSA type material, without being limited thereto.

A diffusion plate 70 is disposed on the light guide layer 40. The diffusion plate 70 may be disposed on the optical pattern layer 50-1 and serve to uniformly diffuse light having passed through and emitted from the light guide layer 40 throughout a surface thereof. The diffusion plate may be generally formed of acryl resin without being limited thereto, and any of various materials having a light diffusion function, i.e. high transmittance plastic, such as polystyrene (PS), polymethylmethacrylate (PMMA), circular olefin copolymer (COC), polyethylene terephthalate (PET), and resin, may be used to form the diffusion plate 70.

A first air gap 80 may be present between the diffusion plate 70 and the light guide layer 40. The presence of the first air gap 80 may increase uniformity of light to be directed to the diffusion plate 70 and, consequently, enhance uniformity of light diffused and emitted through the diffusion plate 70. In this case, to minimize deviation of light transmitted through the light guide layer 40, a thickness of the first air gap 80 may be above zero and below 20 mm without being limited thereto, and design change of the first air gap is possible as required. Although not shown in the drawing, in some embodiments, one or more optical sheets may be additionally disposed on the optical pattern layer 50-1.

Figure 6:
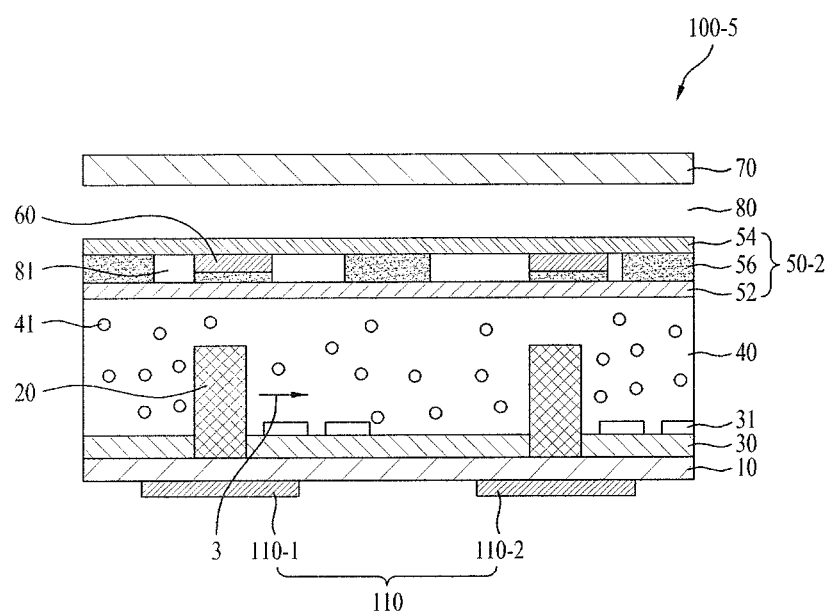

FIG. 6 shows a fifth embodiment 100-5 of the light source module shown in FIG. 1.

Referring to FIG. 6, the light source module 100-5 may further include a second air gap 81 as compared to the fourth embodiment 100-4. That is, the fifth embodiment 100-5 may include the second air gap 81 between the first optical sheet 52 and the second optical sheet 54.

For example, the second air gap 81 may be formed in the adhesive member 56. The adhesive member 56 may be formed by applying an adhesive material to the remaining region except for a space (i.e. the second air gap 81) defined around the optical pattern 60 to attach the first optical sheet 52 and the second optical sheet 54 to each other.

The adhesive member 56 may be configured in such a manner that the second air gap 81 is located at the periphery of the optical pattern 60. Alternatively, the adhesive member 56 may be configured to surround the periphery of the optical pattern 60 and the second air gap 81 may be located at the remaining region except for the periphery of the optical pattern 60. Attachment of the first optical sheet 52 and the second optical sheet 54 may also function to secure the printed optical pattern 60. A structure including the first optical sheet 52, the second optical sheet 54, the second air gap 81, the adhesive member 56, and the optical pattern 60 may be defined as an optical pattern layer 50-2.

The second air layer 81 may enhance diffusion and distribution of light proceeding from the first optical sheet 52 to the second optical sheet 56 because the second air gap 81 and the adhesive member 56 have different indices of refraction. In this way, the embodiment may provide a uniform planar light source.

Figure 7:
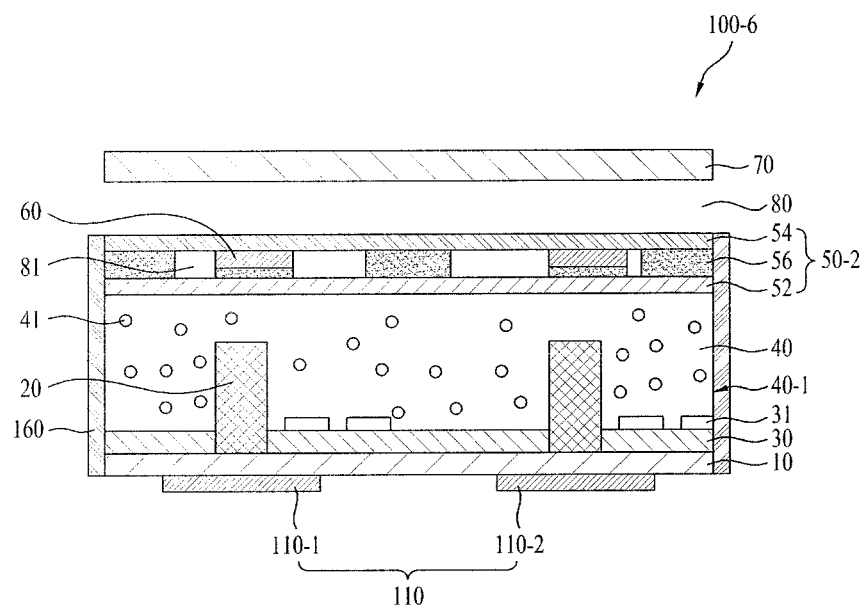

FIG. 7 shows a sixth embodiment 100-6 of the light source module shown in FIG. 1.

Referring to FIG. 7, the light source module 100-6 may further include a light reflective member 160 as compared to the fifth embodiment 100-5. The light reflective member 160 may be disposed at part of or the whole of a side surface 40-1 of the light guide layer 40 and serve as a guide to prevent light emitted from the light emitting diodes 20 from being discharged outward through the side surface 40-1 of the light guide layer 40.

The light reflective member 160 may be formed of a high reflectance material, for example, a white resist. Additionally, the light reflective member 160 may be formed of a synthetic resin containing a white pigment distributed therein, or a synthetic resin containing highly reflective metal particles distributed therein. In this case, the white pigment may be titanium oxide, aluminum oxide, zinc oxide, lead carbonate, barium sulfate, calcium carbonate and the like. When the light reflective member 160 comprises metal powder, the metal powder may be Ag powder. In addition, the light reflective member 160 may further include a separate fluorescent brightener.

The light reflective member 160 may be directly molding-coupled to or indirectly attached, via a separate adhesive material (or adhesive tape), to the side surface of the light guide layer 40.

The sixth embodiment may reduce light loss and increase luminous efficacy as a result of preventing leakage of light from the side surface 40-1 of the light guide layer 40 and, concomitantly, enhance luminance and illuminance of the light source module 100-5 on the basis of the same power. Although not shown, in a configuration of another embodiment, the light reflective member 160 may be added to the side surface 40 of the light guide layer 40 according to any one of the first embodiment 100-1 to the fourth embodiment 100-4.

Figure 8:
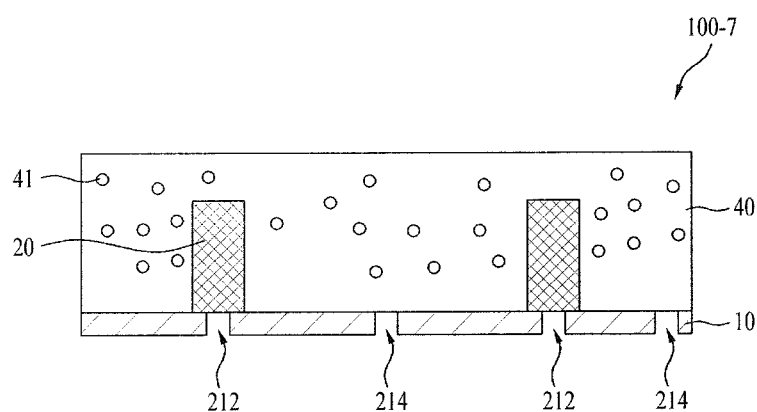

FIG. 8 shows a seventh embodiment 100-7 of the light source module shown in FIG. 1. Referring to FIG. 7, the light source module 100-6 may be configured in such a manner that the flexible board 10 according to the first embodiment has via-holes 212 and 214 for enhancement of radiation.

The via-holes 212 and 214 may be perforated in the flexible board 110 to expose part of the respective light emitting diodes 20 or part of the light guide layer 40. For example, the via-holes 212 and 214 may include a first via-hole 212 to expose part of each light emitting diode 20 and a second via-hole 214 to expose part of the lower surface of the light guide layer 40.

Heat generated in the light emitting diode 20 may be directly radiated outward through the first via-hole 212, and heat conducted from the light emitting diode 20 to the light guide layer 40 may be directly radiated outward through the second via-hole 214. The sixth embodiment may enhance radiation efficiency because heat generated in the light emitting diodes 20 may be radiated outward through the via-holes 212 and 214. The first via-holes 212 and the second via-holes 214 may have any of various shapes, such as a polygonal shape, circular shape, or oval shape.

Figure 9:
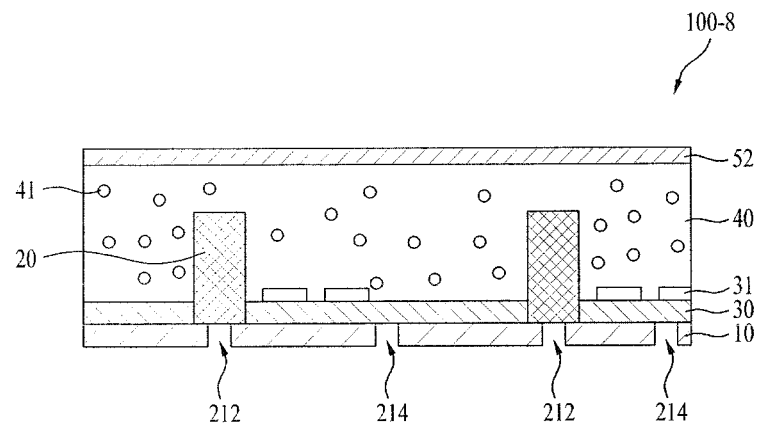

FIG. 9 shows an eighth embodiment 100-8 of the light source module shown in FIG. 1. Referring to FIG. 9, the light source module 100-8 may further include the reflective sheet 30, the reflective pattern 31, and the first optical sheet 52 as compared to the seventh embodiment. The eighth embodiment 100-8 may achieve enhanced radiation efficiency owing to the first and second via-holes 212 and 214. These added components 30, 31 and 52 may be identical to the above description of FIG. 4.

Figure 10:
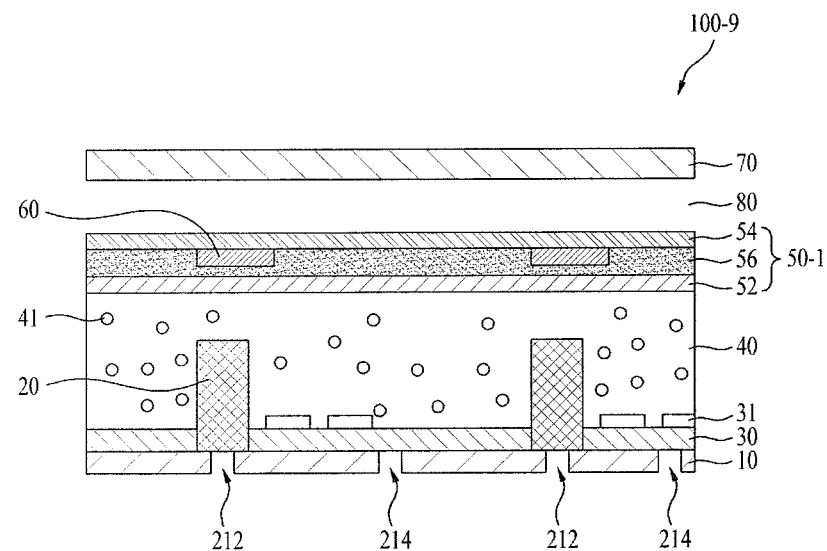

FIG. 10 shows a ninth embodiment 100-9 of the light source module shown in FIG. 1. Referring to FIG. 10, the light source module 100-9 may further include the second optical sheet 52, the adhesive member 56, the light shielding pattern 60, and the second optical sheet 54 as compared to the eighth embodiment. These added components 52, 54, 56 and 60 may be identical to the above description of FIG. 5.

Figure 11:
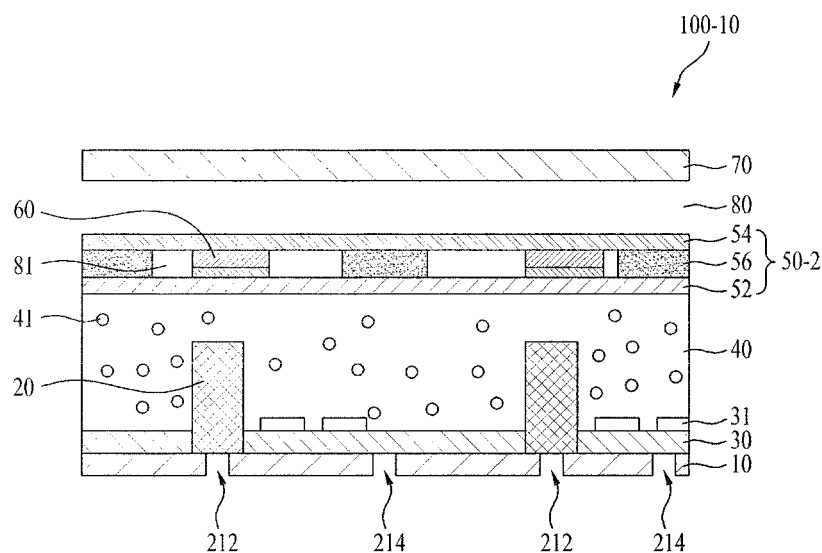

FIG. 11 shows a tenth embodiment 100-10 of the light source module shown in FIG. 1. Referring to FIG. 11, the light source module 100-10 may further include the second optical sheet 52, the adhesive member 56, the light shielding pattern 60, the second optical sheet 54, and the second air gap 81 as compared to the eighth embodiment. The second air gap 81 may be present between the first optical sheet 52 and the second optical sheet 54 of the tenth embodiment 100-10, and the second air gap 81 may be identical to the above description of FIG. 6.

Figure 12:
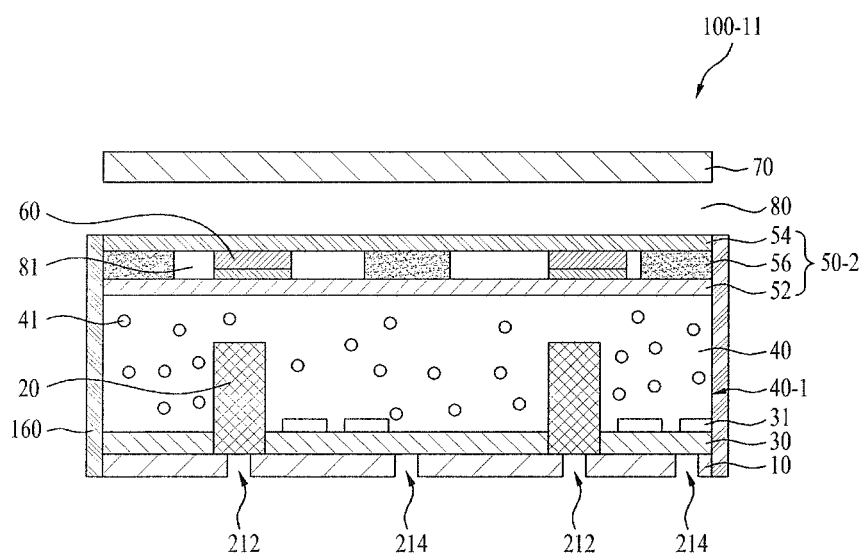

FIG. 12 shows an eleventh embodiment 100-11 of the light source module shown in FIG. 1. Referring to FIG. 12, the light source module 100-11 may further include the light reflective member 160 as compared to the tenth embodiment 100-10. The light reflective member 160 may be disposed at part of or the whole of the side surface 40-1 of the light guide layer 40. Although not shown, in a configuration of another embodiment, the light reflective member 160 may be added to the side surface of the light guide layer 40 according to any one of the seventh embodiment 100-7 to the ninth embodiment 100-7.

Figure 13:
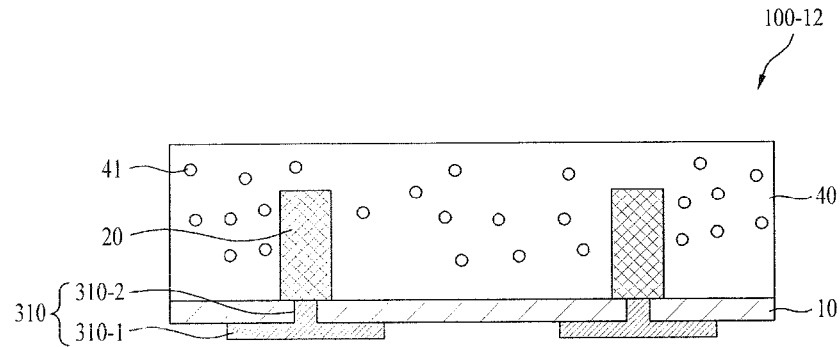

FIG. 13 shows a twelfth embodiment 100-12 of the light source module shown in FIG. 1. The same reference numerals as those of FIG. 1 indicate the identical components, and these identical components, which have been described above, will not be repeatedly described or will be described in brief.

Referring to FIG. 13, differently from the radiation member 110 of the first embodiment 100-1, a radiation member 310 of the light source module 100-12 may include a lower radiation layer 310-1 disposed at the lower surface of the flexible board 10, and a perforation 310-1 to allow part of the lower radiation layer 310-1 to come into contact with each light emitting diode 20 through the flexible board 10.

For example, the perforation 310-1 may come into contact with a first side surface portion 714 of a first lead frame 620 or 620' of a light emitting diode package 200-1 or 200-2 that will be described below.

The twelfth embodiment may achieve enhanced radiation efficiency because heat generated in the light emitting diodes 20 is directly transferred to the radiation member 310 through the perforation 310-1 to thereby be radiated outward.

Figure 14:
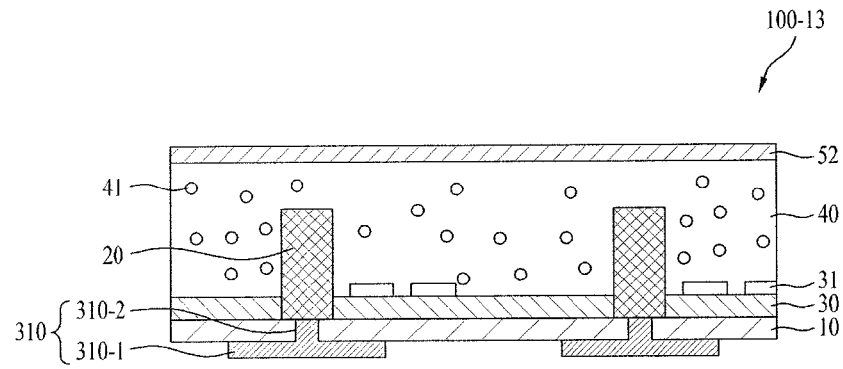

FIG. 14 shows a thirteenth embodiment 100-13 of the light source module shown in FIG. 1. Referring to FIG. 14, the light source module 100-13 may further include the reflective sheet 30, the reflective pattern 31, and the first optical sheet 52 as compared to the twelfth embodiment. These added components 30, 31 and 52 may be identical to the above description of FIG. 4.

Figure 15:
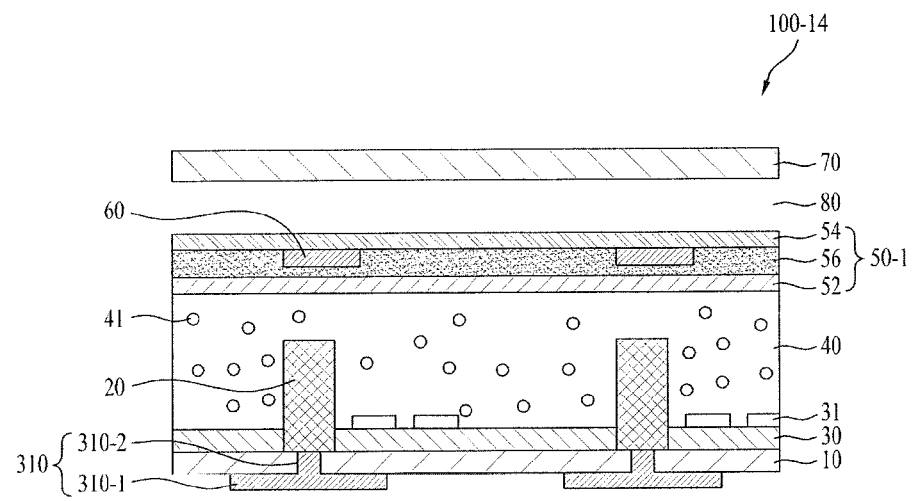

FIG. 15 shows a fourteenth embodiment 100-14 of the light source module shown in FIG. 1. Referring to FIG. 15, the light source module 100-14 may further include the second optical sheet 52, the adhesive member 56, the light shielding pattern 60, and the second optical sheet 54 as compared to the thirteenth embodiment 100-12. These added components 52, 54, 56 and 60 may be identical to the above description of FIG. 5.

Figure 16:
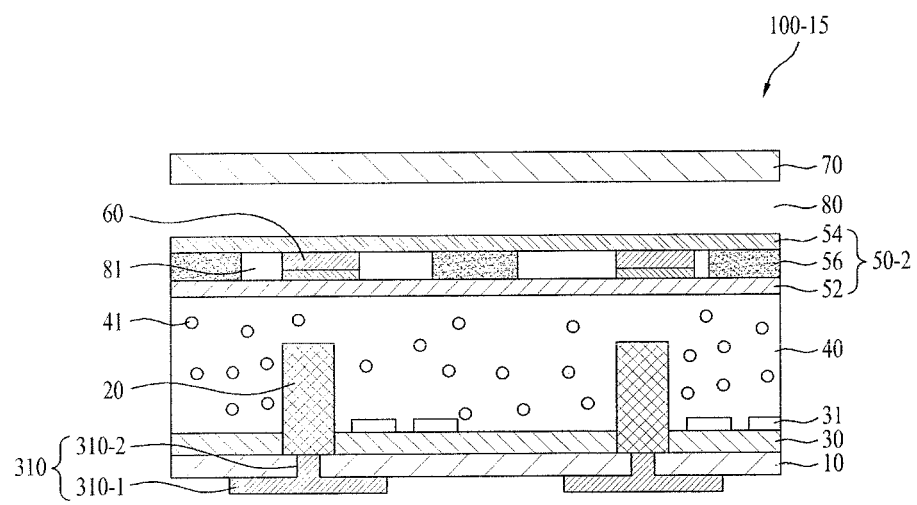

FIG. 16 shows a fifteenth embodiment 100-15 of the light source module shown in FIG. 1. Referring to FIG. 15, the light source module 100-15 may further include the second air gap 81 as compared to the fourteenth embodiment 100-14. That is, the second air gap 81 may be present between the first optical sheet 52 and the second optical sheet 54 of the fifteenth embodiment 100-15. The second air gap 81 may be identical to the above description of FIG. 6.

Figure 17:
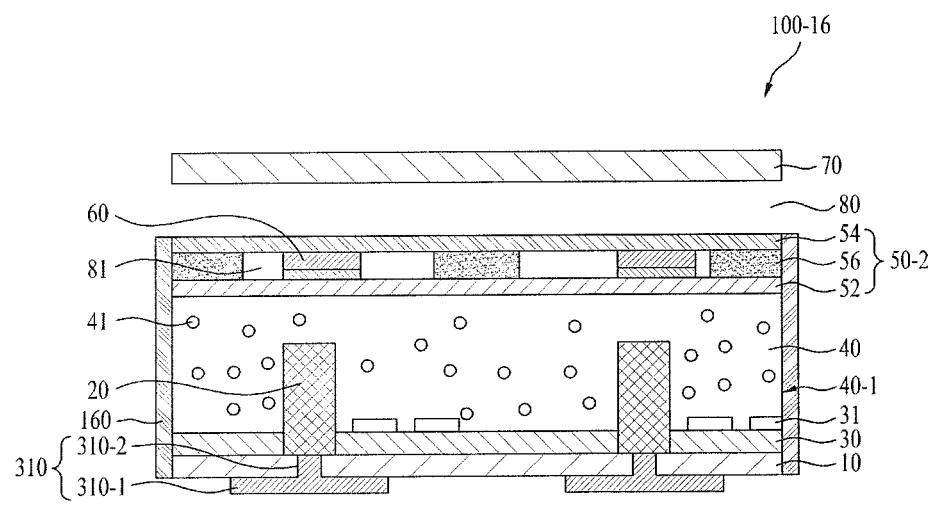

FIG. 17 shows a sixteenth embodiment 100-16 of the light source module shown in FIG. 1. Referring to FIG. 17, the light source module 100-16 may further include the light reflective member 160 as compared to the fifteenth embodiment 100-15. The light reflective member 160 may be disposed at part of or the whole of the side surface 40-1 of the light guide layer 40. Although not shown, in a configuration of another embodiment, the light reflective member 160 may be added to the side surface of the light guide layer 40 according to any one of the twelfth embodiment 100-12 to the fourteenth embodiment 100-14.

Figure 18:
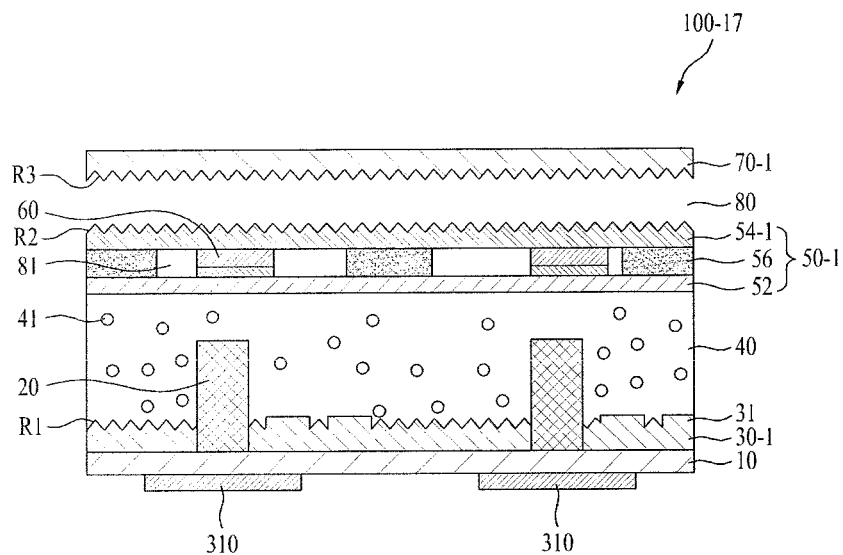
Figure 19:
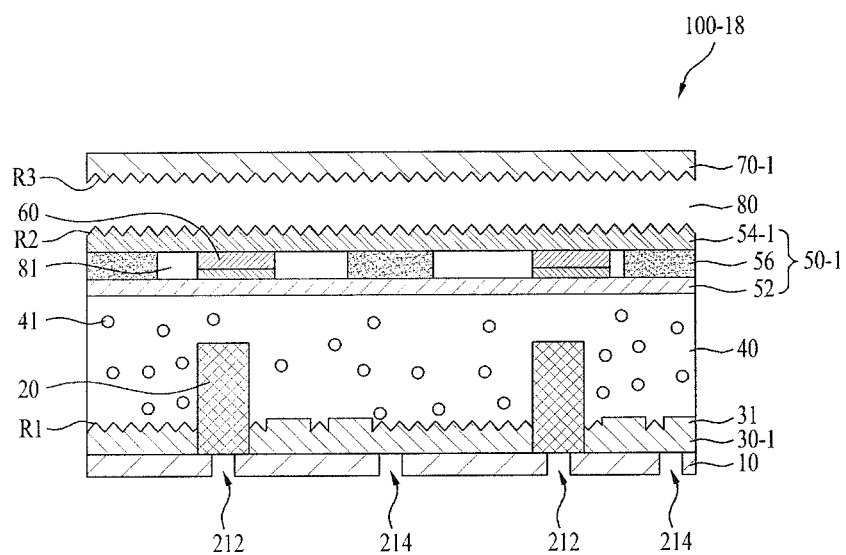
Figure 20:
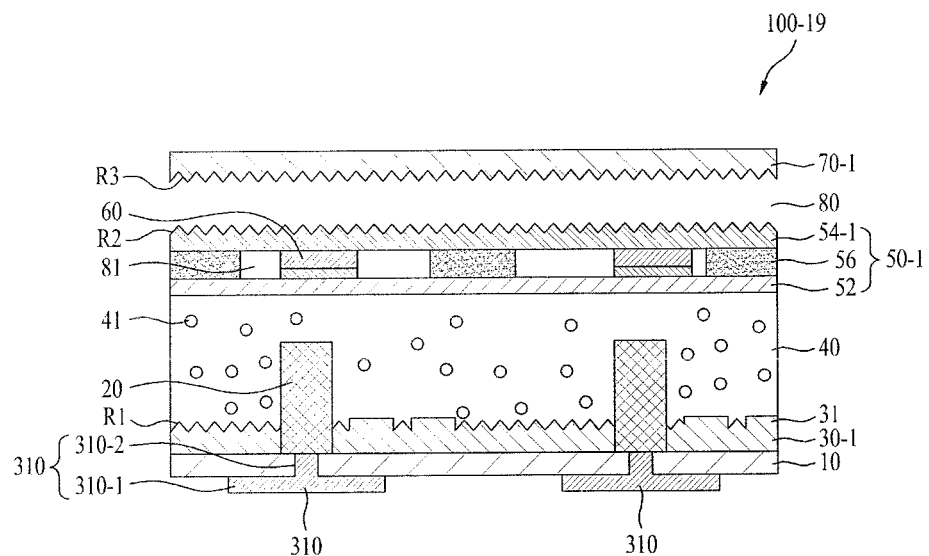

FIG. 18 shows a seventeenth embodiment of the light source module shown in FIG. 1, FIG. 19 shows an eighteenth embodiment of the light source module shown in FIG. 1, and FIG. 20 shows a nineteenth embodiment of the light source module shown in FIG. 1.

A reflective sheet 30-1, a second optical sheet 54-1, and a diffusion plate 70-1 shown in FIGS. 18 to 20 are alternative embodiments of the reflective sheet 30, the second optical sheet 54, and the diffusion plate 70 shown in FIGS. 6, 11 and 16.

At least one of the reflective sheet 30-1, the second optical sheet 54-1, and the diffusion plate 70-1 may be provided at one surface or both surfaces thereof with ridges R1, R2 and R3. The ridges R1, R2 and R3 serve to reflect and diffuse incident light, causing outward emission of light having a geometrical pattern.

For example, first ridges R1 may be formed at one surface (e.g., an upper surface) of the reflective sheet 30-1, second ridges R2 may be formed at one surface (e.g., an upper surface) of the second optical sheet 54-1, and third ridges R3 may be formed at one surface (e.g., a lower surface) of the diffusion plate 70-1. These ridges R1, R2 and R3 may define a plurality of regular or irregular patterns, and have a prism shape, lenticular shape, concave lens shape, convex lens shape or combinations thereof to enhance reflection and diffusion of light, without being limited thereto.

In addition, a cross section of the ridges R1, R2 and R3 may have any of various shapes, such as a triangular shape, rectangular shape, or sinusoidal shape. A size or density of each pattern may vary according to a distance from the light emitting diode 20.

The ridges R1, R2 and R3 may be formed by directly processing a reflective sheet 54-1, a second optical sheet 54-1, and a diffusion plate 70-1 without being limited thereto, and may be formed by any of currently developed and commercialized methods, such as, for example, attachment of a film provided with a given pattern, or other methods that may be implemented according to future technical developments.

The embodiment may easily implement a geometrical light pattern via combinations of the patterns of the first to third ridges R1, R2 and R3. In some embodiments, the ridges may be formed at one surface or both surfaces of the second optical sheet 52.

However, the embodiments adopting the ridges R1, R2 or R3 are not limited to FIGS. 18 to 20, and at least one of the reflective sheet 54, the first optical sheet 52, the second optical sheet 54, and the diffusion plate 70 included in other embodiments may be provided at one surface or both surfaces thereof with the ridges to enhance reflection and diffusion of light.

Figure 22:
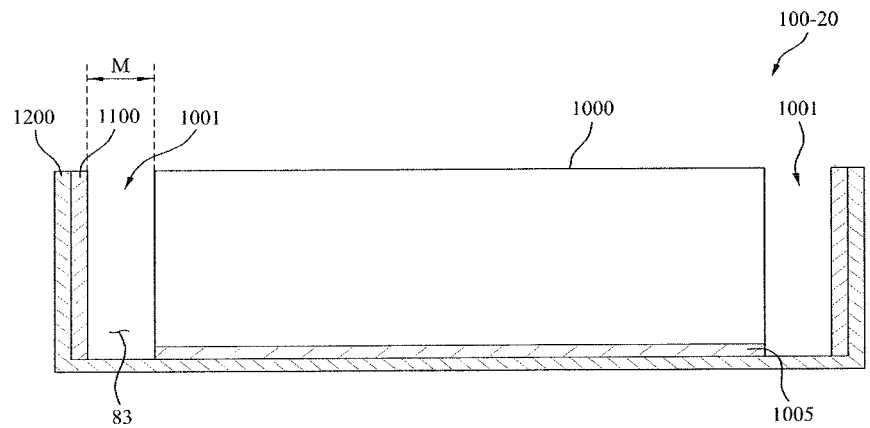
FIG. 22 is a view showing a twentieth embodiment of the light source module shown in FIG. 1.

FIG. 22 is a view showing a twentieth embodiment of the light source module shown in FIG. 1. Referring to FIG. 22, the light source module 100-20 includes a planar light emitting unit 1000 and an indirect light emitting unit 1001.

The planar light emitting unit 1000 performs conversion into planar light and outward emission of the same. In addition, the indirect light emitting unit 1001 reflects light emitted from the planar light emitting unit 1000 to generate reflected light, thereby causing light leakage (or a flare phenomenon). While FIG. 22 shows the indirect light emitting unit 1001 as being formed at the entire side surface of the planar light emitting portion 1000, this is simply given by way of example, and the indirect light emitting unit may be formed at at least part of the side surface of the planar light emitting unit 1000.

The planar light emitting unit 1000 may be any one of the above-described embodiments 100-1 to 100-5, 100-7 to 100-10, 100-12 to 100-15, and 100-17 to 100-19.

The indirect light emitting unit 1001 may include a reflective member 1100 located at the side surface of the planar light emitting unit 1000. The reflective member 1100 may be spaced apart from the planar light emitting unit 1000, for example, the light guide layer 40 of the planar light emitting unit 1000 by a given distance M.

A third air gap 83 may be present in a space between the planar light emitting unit 1000 and the reflective member 1100. The reflective member 1100 reflects light emitted from the side surface of the light guide layer 40 of the planar light emitting unit 1000 to generate reflected light (or indirect light). In this way, light dissipated through the side surface of the light guide layer 40 is re-reflected by the reflective member 1100, causing a flare phenomenon to tone light down. This may be used to achieve various lighting effects that may be applied to indoor/outdoor interior and automobile luminaires.

Meanwhile, to maximize the above-described flare phenomenon, the third air gap 83 may be formed between the reflective member 1100 and the planar light emitting unit 1000. In this way, the flare phenomenon may be maximized as light emitted from the side surface of the light guide layer 40 is scattered in the indirect light emitting air gap 83 and the scattered light is re-reflected by the reflective member 1100. The reflective member 1100 may be formed of the same material as that of the reflective member 160 as described above with reference to FIG. 7.

Meanwhile, a height of the reflective member 1100 may be identical to a height of any one of the light guide layer 40, the first optical sheet 52, the second optical sheet 54, and the diffusion plate 70, without being limited thereto.

While FIG. 22 shows the reflective member 1100 as being perpendicular to a horizontal surface of the planar light emitting unit 1000, e.g., an upper surface of the light guide layer 40, this is simply given by way of example, and the reflective member may be tilted relative to the horizontal surface of the planar light emitting unit by a given angle as needed.

The embodiment shown in FIG. 22 may further include a support member 1200 configured to surround an outer surface of the reflective member 1100 and the bottom of the planar light emitting unit 1000.

The support member 1200 serves to support and protect the planar light emitting unit 1000 and the reflective member 1200, which may cause enhanced durability and reliability. The support member 1200 is not limited as to material. For example, the support member 1200 may be formed of a metal material or may be formed of a plastic material. In addition, it will be appreciated that the support member 1200 may be formed of a material having given flexibility.

Figure 23:
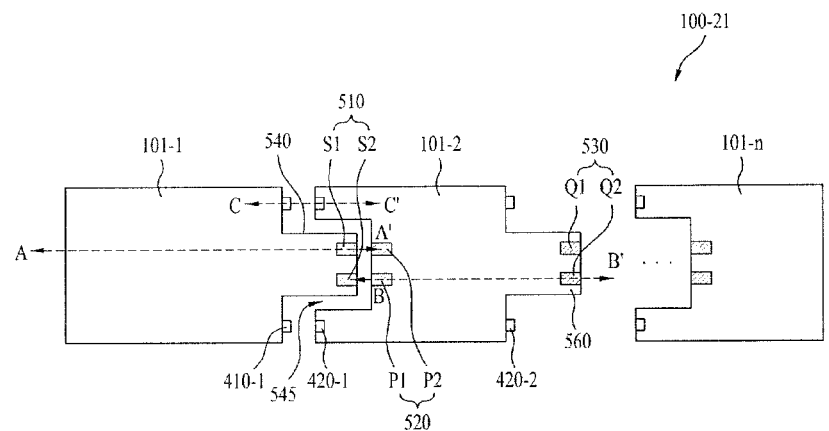
FIG. 23 is a plan view showing a twenty-first embodiment of the light source module shown in FIG. 1.
Figure 24:
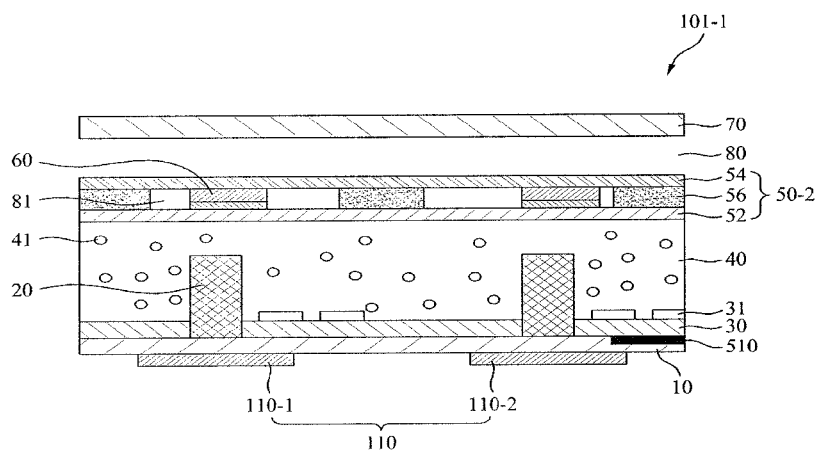
FIG. 24 is a sectional view taken along line AA' of the light source module shown in FIG. 23.
Figure 25:
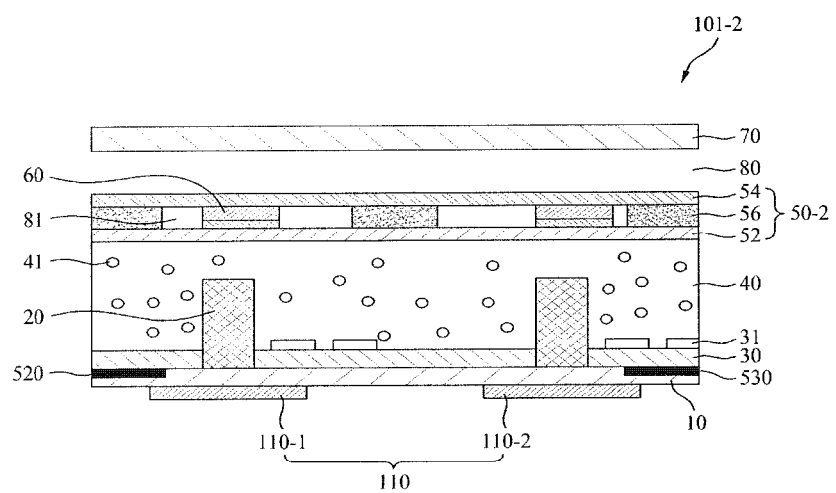
FIG. 25 is a sectional view taken along line BB' of the light source module shown in FIG. 23.
Figure 26:
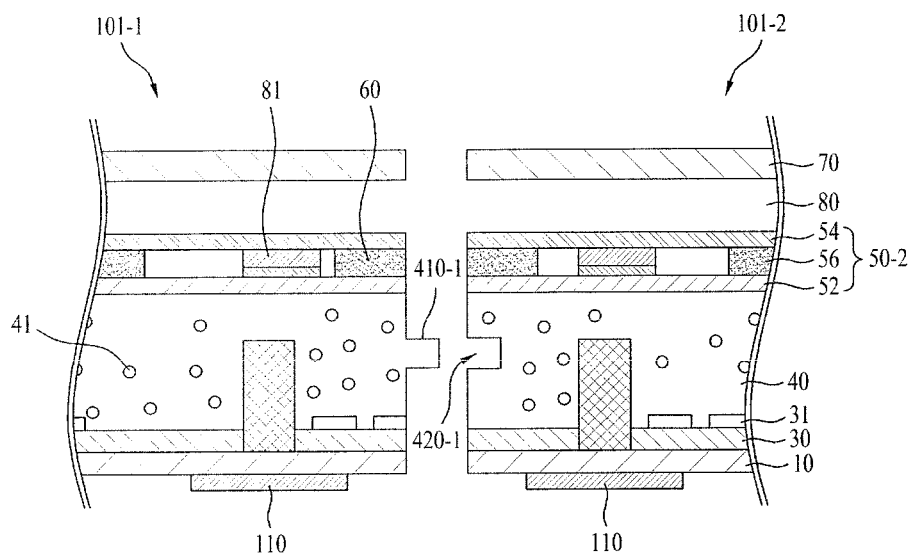
FIG. 26 is a sectional view taken along line CC' of the light source module shown in FIG. 23.

FIG. 23 is a plan view showing a twenty-first embodiment 100-21 of the light source module shown in FIG. 1, FIG. 24 is a sectional view taken along line AA' of the light source module 100-21 shown in FIG. 23, FIG. 25 is a sectional view taken along line BB' of the light source module 100-21 shown in FIG. 23, and FIG. 26 is a sectional view taken along line CC' of the light source module 100-21 shown in FIG. 23.

Referring to FIGS. 23 to 26, the light source module 100-21 may include a plurality of sub-light source modules 101-1 to 101-$n$ (n being a natural number greater than 1), and the sub-light source modules 101-1 to 101-$n$ may be separated from or coupled to one another. In addition, the coupled sub-light source modules 101-1 to 101-$n$ may be electrically connected to one another.

Each of the sub-light source modules 101-1 to 101-$n$ includes at least one connector (e.g., 510, 520, or 530) that may be connected to an external component. For example, a first sub-light source module 101-1 may include a first connector 510 having one or more terminals (e.g., S1 and S2). A second sub-light source module 101-2 may include a first connector 520 and a second connector 530 which are adapted to be connected respectively to external components. The first connector 520 may have one or more terminals (e.g., P1 and P2), and the second connector 530 may have one or more terminals (e.g., Q1 and Q2). In this case, first terminals S1, P1 and Q1 may be positive terminals, and second terminals S2, P2 and Q2 may be negative terminals. While FIG. 21 shows each connector (e.g., 510, 520 or 530) as having two terminals, the number of the terminals is not limited thereto.

While FIGS. 24 to 26 show a configuration acquired by adding the connector 510, 520 or 530 to the fifth embodiment 100-5, the embodiment is not limited thereto, and each of the sub-light source modules 101-1 to 101-$n$ may be configured by adding the connector (e.g., 510, 520 or 530) and connection fixing portions (e.g., 410-1, 420-1 and 410-2) to any one of the light source modules 100-1 to 100-20 according to the above-described embodiments.

Referring to FIGS. 24 and 25, each of the sub-light source modules 101-1 to 101-$n$ includes the flexible board 10, the light emitting diodes 20, the reflective sheet 30, the reflective pattern 31, the light guide layer 40, the first optical sheet 52, the second optical sheet 54, the adhesive member 56, the optical pattern 60, the diffusion plate 70, the radiation member 110, the at least one connector 510, 520 or 530, and the at least one connection fixing portions 410 and 420. The same reference numerals as those of FIG. 1 indicate the identical components, and these identical components, which have been described above, will not be repeatedly described or will be described in brief. As compared with other embodiments, while the respective sub-light source modules 101-1 to 101-$n$ according to the twenty-first embodiment may differ in terms of the size or number of light emitting diodes, they may have the same configuration except for the connectors and the connection fixing portions.

The first sub-light source module 101-1 may include the first connector 510 disposed on the flexible board 10 for electrical connection with the light emitting diodes 20 and electrical connection with an external component. For example, the first connector 510 may be patterned on the flexible board 10.

In addition, for example, the second sub-light source module 101-2 may include the first connector 520 and the second connector 530 for electrical connection with the light emitting diodes 20. The first connector 520 may be located at one side of the flexible board 10 for electrical connection with the first connector 510 of an external component (e.g., the first sub-light source module 101-1), and the second connector 530 may be located at the other side of the flexible board 10 for electrical connection with a connector (not shown) of another external component (e.g., the third sub-light source module 101-3).

The connection fixing portions (e.g., 410-1, 420-1 and 410-2) are coupled to other external sub-light source modules and serve to secure the two coupled sub-light source modules to each other. The connection fixing portions (e.g., 410-1, 420-1 and 410-2) may be protrusions formed at part of the side surface of the light guide layer 40, or may be recesses indented in part of the side surface of the light guide layer 40.

Referring to FIG. 26, the first sub-light source module 101-1 may include a first connection fixing portion 410-1 protruding from part of the side surface of the light guide layer 40. In addition, the second sub-light source module 101-2 may include a first connection fixing portion 420-1 indented in part of the side surface of the light guide layer 40 and a second connection fixing portion 410-2 protruding from another part of the side surface of the light guide layer 40.

The first connection fixing portion 410-1 of the first sub-light source module 101-1 and the first connection fixing portion 420-1 of the second sub-light source module 101-2 may be secured to each other via female-male coupling therebetween.

The embodiment shows the connection fixing portions (e.g., 410-1, 420-1 and 410-2) as being part of the light guide layer 40, without being limited thereto. Separate connection fixing portions may be provided and the connection fixing portions may be altered to other connectable forms.

The sub-light source modules 101-1 to 101-$n$ (n being a natural number greater than 1) may be shaped to have a given protruding portion without being limited thereto, and may have any of various shapes. For example, when viewed from the top, the sub-light source modules 101-1 to 101-$n$ (n being a natural number greater than 1) may have a circular shape, oval shape or polygonal shape, and part of the sub-light source modules 101-1 to 101-$n$ may protrude in a lateral direction.

For example, one end of the first sub-light source module 101-1 may have a center protrusion 540, and the first connector 510 may be formed at the flexible board 10 corresponding to the protrusion 540. The first connection fixing portion 410-1 may be formed at the light guide layer 40 corresponding to the remaining part of the end of the first sub-light source module 101-1 except for the protrusion 540.

The second sub-light source module 101-2 may be provided at one end thereof with a center recess 545, and the first connector 520 may be formed at the flexible board 10 corresponding to the recess 545. The first connection fixing portion 420-1 may be formed at the light guide layer 40 corresponding to the remaining part of the end of the second sub-light source module 101-2 except for the recess 545. In addition, the other end of the second sub-light source module 101-2 may have a center protrusion 560, and the second connector 530 may be formed at the flexible board corresponding to the protrusion 560. The second connection fixing portion 410-2 may be formed at the light guide layer 40 corresponding to the remaining part of the other end of the second sub-light source module 101-2 except for the protrusion 560.

The embodiment may enhance freedom in product design because each of the sub-light source modules 101-1 to 101-$n$ may serve as an independent light source and be altered to various shapes and two or more sub-light source modules may be assembled with each other via the connection fixing portions to construct an independent light source. In addition, in the embodiment, when some of the assembled sub-light source modules are damaged or broken, only the broken sub-light source modules may be replaced.

The above-described light source modules may be used in display devices, indicator devices, and lighting systems which require planar light sources. In particular, the light source modules according to the embodiment may be easily mounted even at places that require installation of luminaires, but have difficulty in installation of the luminaires because of a curvature of areas where the luminaires must be mounted (e.g., the ceiling or the floor having a curvature). For example, the lighting systems may include lamps, streetlamps, and the like, and the lamp may be automobile headlamps, without being limited thereto.

Figure 27:
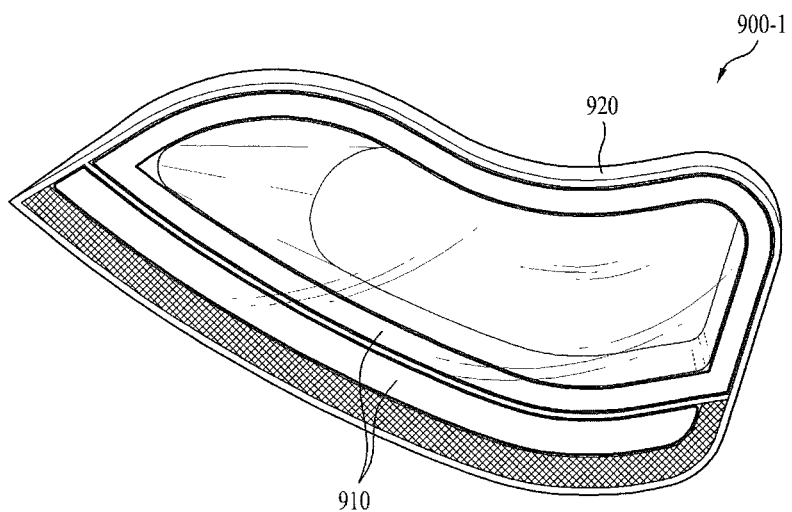
FIG. 27 is a view showing an automobile headlamp according to an embodiment.
Figure 49:
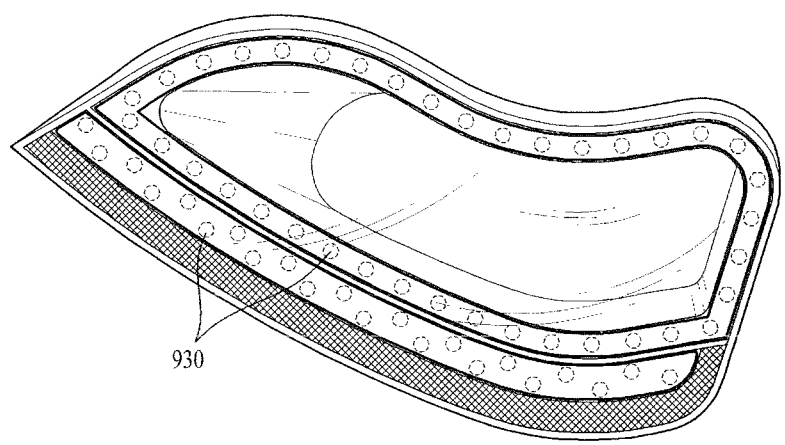
FIG. 49 is a view showing a general automobile headlamp in the form of a point light source.

FIG. 27 shows an automobile headlamp 900-1 according to an embodiment, and FIG. 49 is a view showing a general automobile headlamp in the form of a point light source. Referring to FIG. 27, the automobile headlamp 900-1 includes a light source module 910 and a light housing 920.

The light source module 910 may be any one of the above-described embodiments 100-1 to 100-21. The light housing 920 may be configured to receive the light source module 910 and formed of a light transmitting material. The automobile light housing 920 may have a curvature according to an area of an automobile for installation of the automobile light housing 920 and design. The light source module 910 may be easily mounted to the automobile housing 920 having a curvature because the light source module includes the flexible board 10 and the light guide layer 40 and has flexibility. In addition, since the light source modules 100-1 to 100-21 are configured to achieve enhanced radiation efficiency, the automobile headlamp 900-1 according to the embodiment may restrict occurrence of wavelength shift and reduction in luminous intensity.

The general automobile headlamp shown in FIG. 49 is a point light source and may cause spots 930 at part of a light emitting plane during light emission. On the other hand, the automobile headlamp 900-1 according to the embodiment is a planar light source and may achieve uniform luminance and illuminance throughout a light emitting plane.

Figure 28:
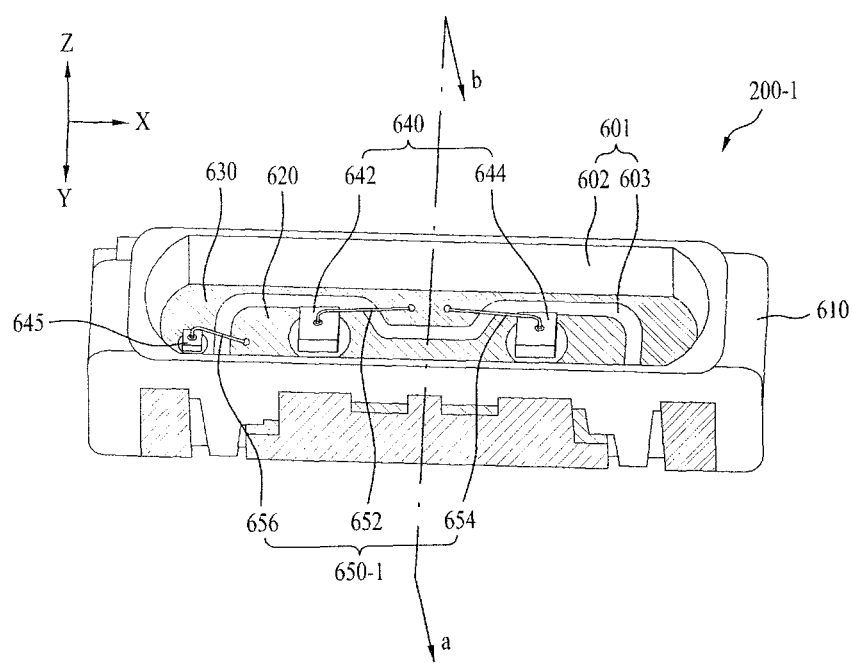
FIG. 28 is a perspective view showing a light emitting diode package according to an embodiment.
Figure 29:
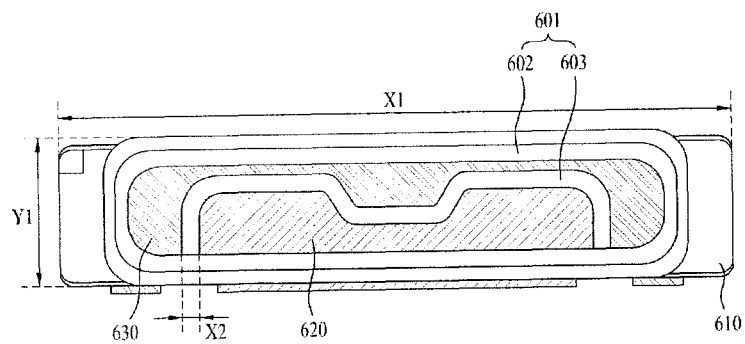
FIG. 29 is a top view showing the light emitting diode package according to the embodiment.
Figure 30:
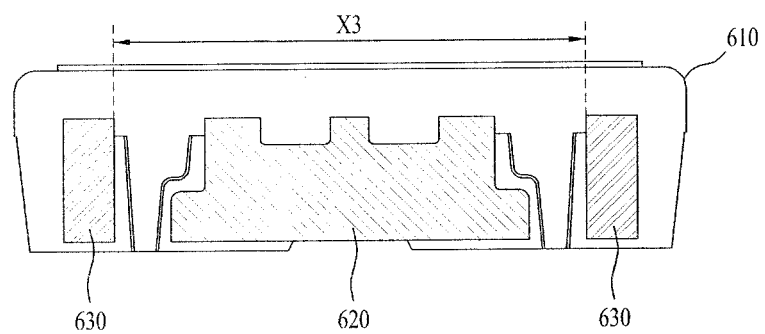
FIG. 30 is a front view showing the light emitting diode package according to the embodiment.
Figure 31:
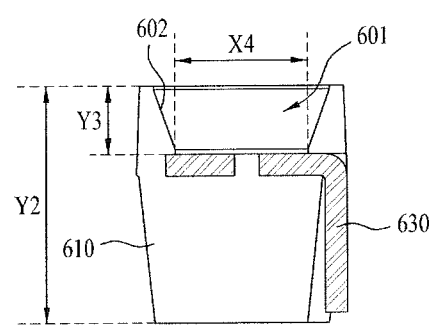
FIG. 31 is a side view showing the light emitting diode package according to the embodiment.

FIG. 28 is a perspective view showing a light emitting diode package 200-1 according to a first embodiment, FIG. 29 is a top view showing the light emitting diode package 200-1 according to the first embodiment, FIG. 30 is a front view showing the light emitting diode package 200-1 according to the first embodiment, and FIG. 31 is a side view showing the light emitting diode package 200-1 according to the first embodiment.

The light emitting diode package 200-1 shown in FIG. 28 may be a light emitting diode package included in the light source modules 100-1 to 100-21 according to the above-described embodiments, without being limited thereto.

Referring to FIGS. 28 to 31, the light emitting diode package 200-1 includes a package body 610, a first lead frame 620, a second lead frame 630, a light emitting chip 640, a Zener diode 645, and a wire 650-1.

The package body 610 may be formed as a board having good electric insulation or thermal conductivity, such as a silicon based wafer level package, silicon board, silicon carbide (SiC) board, aluminum nitride (AlN) board, or the like, and may be a stack of multiple boards. However, the embodiment is not limited to the material, structure, and shape of the above-described body.

For example, the package body 610 may have a length X1 of 5.95 mm~6.05 mm in the first direction (e.g., along the X-axis) and a length Y1 of 1.35 mm~1.45 mm in the second direction (e.g., along the Y-axis). The package body 610 may have a length Y2 of 1.6 mm~1.7 mm in the third direction (e.g., along the Z-axis). For example, the first direction may be a direction parallel to a longer side of the package body 610.

The package body 610 may have a cavity 601 that has an open top and is defined by a sidewall 602 and a bottom 603. The cavity 601 may have a cup shape, a recessed container shape, or the like, and the sidewall 602 of the cavity 601 may be perpendicular to or inclined relative to the bottom 603. When viewed from the top, the cavity 601 may have a circular shape, oval shape, or polygonal shape (e.g., rectangular shape). The cavity 601 in the form of a polygon may have rounded corners. For example, the cavity 601 may have a length X3 of 4.15 mm~4.25 mm in the first direction (e.g., along the X-axis), a length X4 of 0.64 mm~0.9 mm in the second direction (e.g., along the Y-axis), and a depth Y3 of 0.33 mm~0.53 mm (e.g., along the Z-axis).

The first lead frame 620 and the second lead frame 630 may be disposed on a surface of the package body 610 so as to be electrically separated from each other in consideration of radiation thereof or installation of the light emitting chip 640 thereto. The light emitting chip 640 is electrically connected to the first lead frame 620 and the second lead frame 630. The number of the light emitting chips 640 may be 1 or more.

A reflective member (not shown) may be provided at the sidewall of the package body 610 defining the cavity to reflect light emitted from the light emitting chip 640 so as to be directed in a prescribed direction.

The first lead frame 620 and the second lead frame 630 may be placed on an upper surface of the package body 610 so as to be spaced apart from each other. Part of the package body 610 (e.g., the bottom 603 of the cavity 601) may be located between the first lead frame 620 and the second lead frame 630 to electrically separate both lead frames from each other.

The first lead frame 620 may have one end (e.g., 712) exposed to the cavity 601 and the other end (e.g., 714) penetrating the package body 610 to thereby be exposed from one surface of the package body 610. In addition, the second lead frame 630 may have one end (e.g., 744-1) exposed from one side of a surface of the package body 610, the other end (e.g., 744-2) exposed from the other side of the surface of the package body 610, and a middle portion (e.g., 742-2) exposed to the cavity 601.

A distance X2 between the first lead frame 620 and the second lead frame 630 may be 0.1 mm~0.2 mm. An upper surface of the first lead frame 620 and an upper surface of the second lead frame 630 may be located on the same plane as the bottom 603 of the cavity 601.

Figure 32:
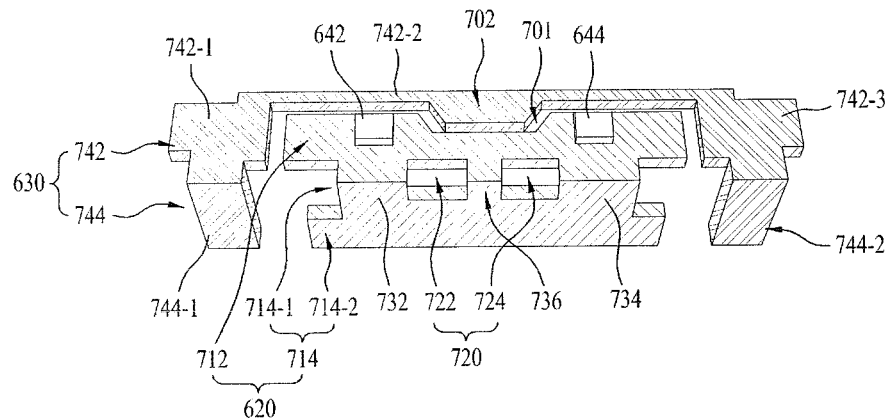
FIG. 32 is a perspective view showing a first lead frame and a second lead frame shown in FIG. 28.
Figure 33:
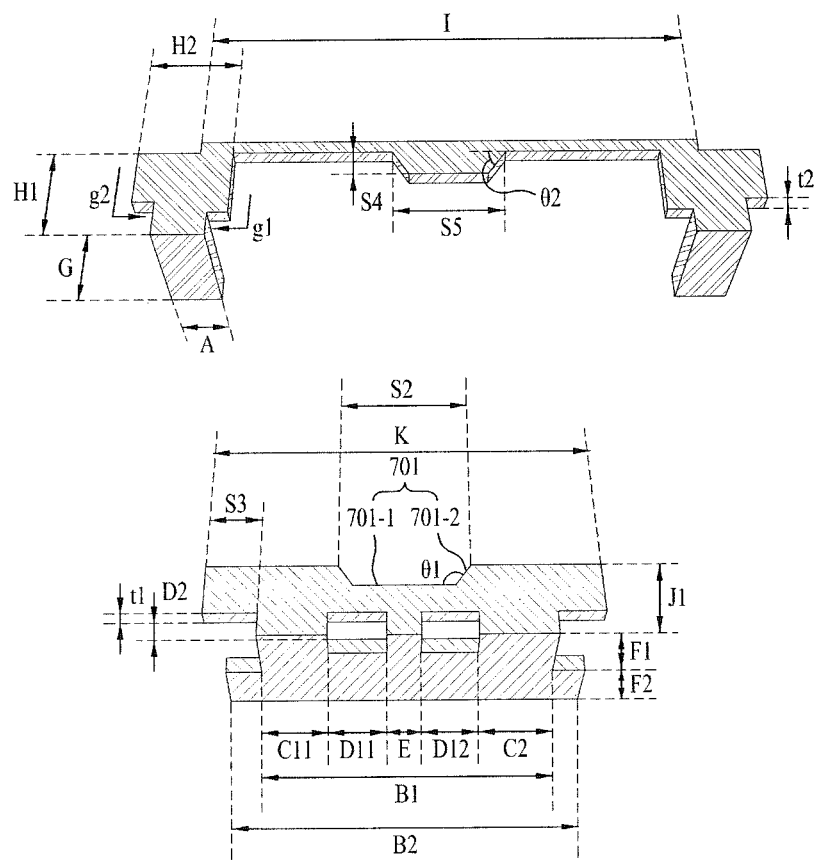
FIG. 33 is a view showing dimensions of respective portions of the first lead frame and the second lead frame shown in FIG. 32.
Figure 34:
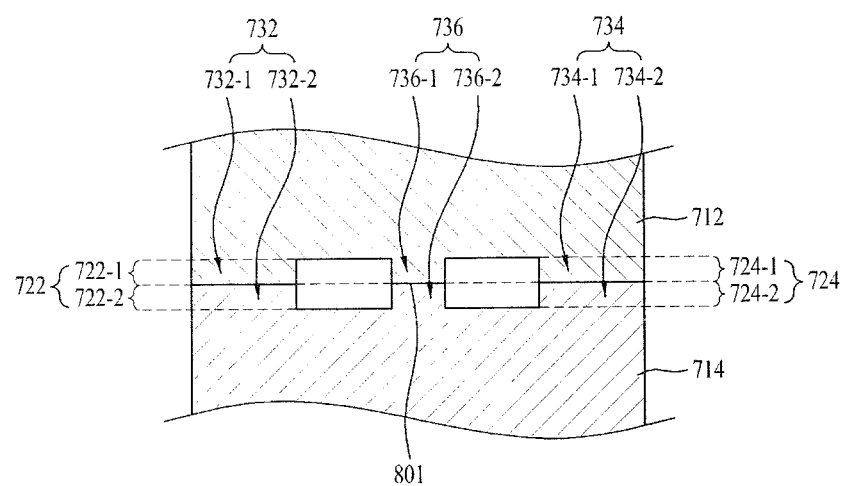
FIG. 34 is an enlarged view showing connection portions shown in FIG. 33.

FIG. 32 is a perspective view showing the first lead frame 620 and the second lead frame 630 shown in FIG. 28, FIG. 33 is a view showing dimensions of respective portions of the first lead frame 620 and the second lead frame 630 shown in FIG. 32, and FIG. 34 is an enlarged view showing connection portions 732, 734 and 736 of the first lead frame 620 proximate to a boundary 801 between a first upper surface portion 712 and a first side surface portion 714 shown in FIG. 33.

Referring to FIGS. 32 to 34, the first lead frame 620 includes the first upper surface portion 712 and the first side surface portion 714 bent from a first side of the first upper surface portion 712.

The first upper surface portion 712 may be located on the same plane as the bottom of the cavity 601 and exposed by the cavity 601 to allow light emitting chips 642 and 644 to be placed thereon.

As exemplarily shown in FIG. 33, both distal ends of the first upper surface portion 712 may be provided with portions S3 protruding in the first direction (along the X-axis) on the basis of the first side surface portion 714. The protruding portions S3 of the first upper surface portion 712 may be portions of a lead frame array to support the first lead frame. The protruding portions S3 of the first upper surface portion 712 may have a first directional length of 0.4 mm~0.5 mm. The first upper surface portion 712 may have a first directional length K of 3.45 mm~3.55 mm and a second directional length J1 of 0.6 mm~0.7 mm. The first direction may be the X-axis in the XYZ coordinate system and the second direction may be the Y-axis.

The first upper surface portion 712 may be provided at a second side thereof with at least one recess 701. In this case, the second side of the first upper surface portion 712 may be disposed to face the first side of the first upper surface portion 712. For example, the second side of the first upper surface portion 712 may be provided at the center thereof with the recess 701 without being limited thereto, and two or more recesses may be formed at the second side. The recess 701 may have a shape corresponding to that of a protrusion 702 formed at the second lead frame 630 that will be described below.

The recess 701 shown in FIG. 33 has a trapezoidal shape without being limited thereto, and may have any of various shapes, such as a circular shape, polygonal shape, or oval shape. The recess 701 may have a first directional length S2 of 1.15 mm~1.25 mm and a second directional length S2 of 0.4 mm~0.5 mm.

An angle Θ1 between a bottom 701-1 and a side surface 701-2 of the recess 701 may be 90° or more and below 180°. The light emitting chips 642 and 644 may be placed on the first upper surface portion 712 at both sides of the recess 701.

The first side surface portion 714 may be bent downward from the first side of the first upper surface portion 712 by a given angle. The first side surface portion 714 may be exposed from one side surface of the package body 610. For example, an angle between the first upper surface portion 712 and the first side surface portion 714 may be 90° or more and below 180°.

The first lead frame 620 may have one or more through-holes 720 perforated in at least one of the first upper surface portion 712 and the first side surface portion 714. For example, the first lead frame 620 may have one or more through-holes 720 proximate to a boundary between the first upper surface portion 712 and the first side surface portion 714. While FIG. 30 shows two through-holes 722 and 724 spaced apart from each other at positions proximate to the boundary between the first upper surface portion 712 and the first side surface portion 714, the embodiment is not limited thereto.

The through-holes 720 may be perforated in respective regions of the first upper surface portion 712 and the first side surface portion 714 proximate to the boundary between the first upper surface portion 712 and the first side surface portion 714. In this case, a through-hole (e.g., 722-1) perforated in a region of the first upper surface portion 712 and a through-hole (e.g., 722-2) perforated in a region of the first side surface portion 714 may be connected to each other.

The through-holes 720 may be filled with part of the package body 610, thus serving to enhance coupling strength between the first lead frame 620 and the package body. In addition, the through-holes 720 may serve to enable easy bending at the boundary between the first upper surface portion 712 and the first side surface portion 714. However, when the through-holes 720 have an excessively large size or are provided in an excessively great number, the first upper surface portion 712 and the first side surface portion 714 may be disconnected from each other upon bending of the first lead frame 620. For this reason, it is necessary to appropriately regulate the size and number of the through-holes 720. In addition, the size of the through-holes 720 is related to the size of the connection portions 732, 734 and 736, as will be described below and, consequently, is related to radiation of the light emitting diode package.

The embodiment may achieve optimum radiation efficiency in consideration of coupling strength and easy bending according to sizes of the first lead frame 620 and the second lead frame 630 having through-holes that will be described below.

In order to enhance coupling strength with the package body 610, to facilitate easy bending of the first lead frame 620 and to prevent damage upon bending, the embodiment may include the first through-hole 722 and the second through-hole 724, and the first through-hole 722 and the second through-hole 724 may have a first directional length D11 and a first directional length D12 of 0.58 mm~0.68 mm respectively and a second directional length D2 of 0.19 mm~0.29 mm. An area of the first through-hole 722 may be equal to an area of the second through-hole 724 without being limited thereto, and the first and second through-holes may have different areas.

Referring to FIG. 34, the first lead frame 620 may have the connection portions 732, 734 and 736 to connect the first upper surface portion 712 and the first side surface portion 714 to each other, the connection portions being located in proximity to the boundary 801 between the first upper surface portion 712 and the first side surface portion 714 and spaced apart from one another by the through-holes 720. For example, each of the connection portions 732, 734 and 736 may include a first portion 732-1, 734-1 or 736-1 corresponding to part of the first upper surface portion 712 and a second portion 732-2, 734-2 or 736-2 corresponding to part of the first side surface portion 714. The through-holes 720 may be located between the respective neighboring connection portions 732, 734 and 736.

The first lead frame 620 may include at least one connection portion located to correspond to or be aligned with the light emitting chip 642 or 644.

More specifically, the first lead frame 620 may include first to third connection portions 732, 734 and 736. The first connection portion 732 may be located to correspond to or be aligned with the first light emitting chip 642, and the second connection portion 734 may be located to correspond to or be aligned with the second light emitting chip 644. In addition, the third connection portion 736 may be located between the first connection portion 732 and the second connection portion 734 and not aligned with the first light emitting chip 642 or the second light emitting chip 644. For example, the third connection portion 736 may be located to correspond to or be aligned with the recess 701 of the first lead frame 620, without being limited thereto.

A first directional length C11 of the first connection portion 732 and a first directional length C2 of the second connection portion 734 may be greater than a first directional length E of the third connection portion 736. For example, the first directional length C11 of the first connection portion 732 and the first directional length C2 of the second connection portion 734 may be 0.45 mm~0.55 mm, and the first directional length E of the third connection portion 736 may be 0.3 mm~0.4 mm. The reason why the third connection portion 736 is located between the first through-hole 722 and the second through-hole 724 is to prevent disconnection between the first upper surface portion 712 and the first side surface portion 714 upon bending.

A ratio of the first directional length E of the third connection portion 736 to the first directional length C11 of the first connection portion 732 may be 1:1.2~1.8. A ratio of the first directional length D11 or D12 of the through-hole 722 to a first directional length B1 of an upper end portion 714-1 of the first side surface portion 714 may be 1:3.8~6.3.

Since the first connection portion 732 is aligned with the first light emitting chip 642 and the second connection portion 734 is aligned with the second light emitting chip 644, heat generated in the first light emitting chip 642 may be mainly radiated outward from the first connection portion 732 and heat generated in the second light emitting chip 644 may be mainly radiated outward from the second connection portion 734.

In the embodiment, the first connection portion 732 and the second connection portion 734 have greater areas than an area of the third connection portion 736 because the first directional lengths C11 and C12 of the first connection portion 732 and the second connection portion 734 are greater than the first directional length E of the third connection portion 736. Thus, heat generated in the first light emitting chip 642 and the second light emitting chip 644 may be radiated outward at enhanced efficiency as the areas of the connection portions 732 and 734 proximate to the light emitting diodes 20 increase.

The first side surface portion 714 may be divided into the upper end portion 714-1 connected to the first upper surface portion 712 and a lower end portion 714-2 connected to the upper end portion 714-1. That is, the upper end portion 714-1 may include parts of the first to third connection portions 732, 734 and 736, and the lower end portion 714-2 may be located below the upper end portion 714-1.

A third directional length F1 of the upper end portion 714-1 may be 0.6 mm~0.7 mm, and a third directional length F2 of the lower end portion 714-2 may be 0.4 mm~0.5 mm. The third direction may be the Z-axis of the XYZ coordinate system.

The upper end portion 714-1 and the lower end portion 714-2 may have stepped side surfaces in order to enhance coupling strength with the package body 620 and air-tightness for prevention of moisture invasion. For example, both side ends of the lower end portion 714-2 may protrude farther from the side surface of the upper end portion 714-1 in a lateral direction. The first directional length B1 of the upper end portion 714-1 may be 2.56 mm~2.66 mm, and a first directional length B2 of the lower end portion 714-2 may be 2.7 mm~3.7 mm. A thickness t1 of the first lead frame 620 may be 0.1 mm~0.2 mm.

The second lead frame 630 may be disposed to surround at least one side of the first lead frame 620. For example, the second lead frame 630 may be disposed around the other sides of the first lead frame 630 except for the first side surface portion 714.

The second lead frame 630 may include a second upper surface portion 742 and a second side surface portion 744. The second upper surface portion 742 may be disposed to surround the other sides of the first upper surface portion 712 except for the first side. As exemplarily shown in FIGS. 28 and 32, the second upper surface portion 742 may be located on the same plane as the bottom of the cavity 601 and the first upper surface portion 712, and may be exposed by the cavity 601. A thickness t2 of the second lead frame 630 may be 0.1 mm~0.2 mm.

The second upper surface portion 742 may be divided into a first portion 742-1, a second portion 742-2 and a third portion 742-3 according to positions thereof around the first upper surface portion 712. The second portion 742-2 of the second upper surface portion 742 may correspond to or face a second side of the first upper surface portion 712. The first portion 742-1 of the second upper surface portion 742 may be connected to one end of the second portion 742-2 and may correspond to or face any one of the other sides of the first upper surface portion 712. The third portion 742-3 of the second upper surface portion 742 may be connected to the other end of the second portion 742-2 and may correspond to or face another one of the other sides of the first upper surface portion 712.

The first portion 742-1 and the third portion 742-3 may have a second directional length H1 of 0.65 mm~0.75 mm and a first directional length H2 of 0.78 mm~0.88 mm. The second portion 742-2 may have a first directional length I of 4.8 mm~4.9 mm.

The second portion 742-2 of the second upper surface portion 742 may be provided with the protrusion 702 corresponding to the recess 701 of the first upper surface portion 712. For example, the protrusion 702 may have a shape corresponding to a shape of the recess 701 and may be located to be aligned with the recess 701. The protrusion 702 may be located inside the recess 701. The protrusion 702 and the recess 701 may be equal in number. The protrusion 702 and the recess 701 may be spaced apart from each other to allow part of the package body 610 to be located therebetween. The protrusion 702 is a region for wire bonding between the first light emitting chip 642 and the second light emitting chip 644. As the protrusion 702 is located between the first light emitting chip 642 and the second light emitting chip 644 to be aligned with the same, easy wire bonding is possible.

The protrusion 702 may have a first directional length S5 of 0.85 mm~0.95 mm and a second directional length S4 of 0.3 mm~0.4 mm. An angle $\Theta 2$ between the protrusion 702 and the second portion 742-2 may be 90° or more and below 180°.

The second side surface portion 744 may be bent from at least one side of the second upper surface portion 742. The second side surface portion 744 may be bent downward from the second upper surface portion 742 by a given angle (e.g., 90°).

For example, the second side surface portion 744 may include a first portion 744-1 bent from one side of the first portion 742-1 of the second upper surface portion 742 and a second portion 744-2 bent from one side of the third portion 742-3 of the second upper surface portion 742.

The first portion 744-1 and the second portion 744-2 of the second side surface portion 744 may be bent to be located at the same side of the second lead frame 630. The first portion 744-1 of the second side surface portion 744 may be spaced apart from the first side surface portion 714 and located at one side of the first side surface portion 714 (e.g., at the left side). The second portion 744-2 of the second side surface portion 744 may be spaced apart from the first side surface portion 714 and located at the other side of the first side surface portion 714 (e.g., at the right side). The first side surface portion 714 and the second side surface portion 744 may be located on the same plane. In conclusion, as exemplarily shown in FIG. 28, the first side surface portion 714 and the second side surface portion 744 may be exposed from the same side surface of the package body 610. The second side surface portion 744 may have a first directional length A of 0.4 mm~0.5 mm and a third directional length G of 1.05 mm~1.15 mm.

Each of the first portion 742-1 and the third portion 742-3 of the second upper surface portion 742 may be provided at one side surface thereof with a stepped portion g1. For example, the stepped portion g1 may be located in proximity to a location where one side surface of the first portion 742-1 of the second upper surface portion 742 and one side surface of the first portion 744-1 of the second side surface portion 744 meet each other. The embodiment may achieve an increased radiation area and radiation efficiency because the first upper surface portion 712 and the first side surface portion 714 located to correspond to the stepped portion g1 may increase in area by the stepped portion g1. This is because an area of the first lead frame 620 is related to radiation of the light emitting chips 642 and 644.

Each of the first portion 742-1 and the third portion 742-3 of the second upper surface portion 742 may be provided at the other side surface with a stepped portion g2. The reason why the stepped portion g2 is provided is to allow a bonding material (e.g., solder) for bonding of the light emitting diode package 200-1 to the flexible board 10 to be easily viewable.

The first side surface portion 714 of the first lead frame 620 and the second side surface portion 744 of the second lead frame 630 may be mounted to come into contact with the flexible board 10 of the light source modules 100-1 to 100-21 according to the embodiments. In this way, the light emitting chip 640 may emit light in the lateral direction 3 of the light guide layer 40. That is, the light emitting diode package 200-1 may have a side view type structure.

The Zener diode 645 may be placed on the second lead frame 630 in order to enhance withstand voltage of the light emitting diode package 200-1. For example, the Zener diode 645 may be placed on the second upper surface portion 742 of the second lead frame 630.

The first light emitting chip 642 may be electrically connected to the second lead frame 630 via a first wire 652, the second light emitting chip 644 may be electrically connected to the second lead frame 630 via a second wire 654, and the Zener diode 645 may be electrically connected to the first lead frame 620 via a third wire 656.

For example, the first wire 652 may be connected at one end thereof to the first light emitting chip 642 and at the other end thereof to the protrusion 702. In addition, the second wire 654 may be connected at one end thereof to the second light emitting chip 644 and at the other end thereof to the protrusion 702.

The light emitting diode package 200-1 may further include a resin layer (not shown) that fills the cavity 601 to enclose the light emitting chip. The resin layer may be formed of a colorless and transparent polymer resin material, such as epoxy or silicon.

The light emitting diode package 200-1 may emit red light using only red light emitting chips without using a fluorescent substance, without being limited thereto. The resin layer may contain a fluorescent substance to vary a wavelength of light emitted from the light emitting chip 640. For example, even if other colors of light emitting chips rather than red light emitting chips are used, a light emitting diode package capable of emitting a desired color of light may be achieved by varying a wavelength of light using a fluorescent substance.

Figure 35:
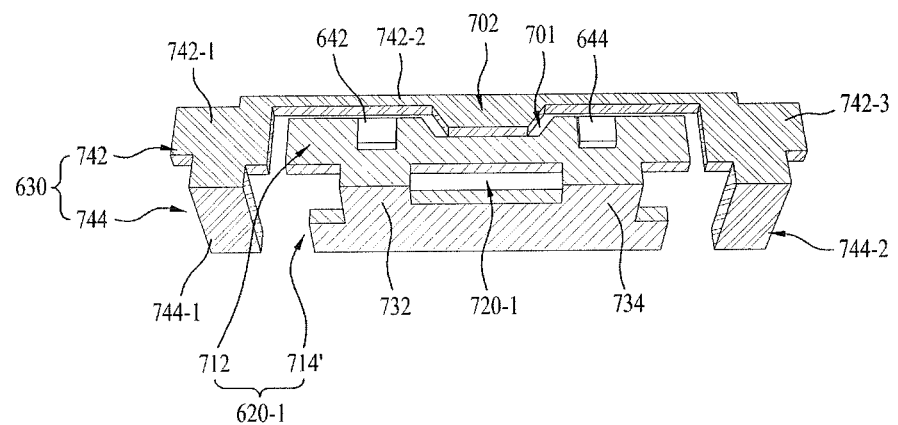
FIGS. 35 to 40 are views showing first lead frames and second lead frames according to different embodiments.

FIG. 35 shows a first lead frame 620-1 and a second lead frame 630 according to another embodiment. The same reference numerals as those of FIG. 32 indicate the identical components, and these identical components, which have been described above, will not be repeatedly described or will be described in brief.

Referring to FIG. 35, as compared to the first lead frame 620 shown in FIG. 32, the third connection portion 736 is omitted from the first lead frame 620-1. In this case, the first lead frame 620-1 may have a single through-hole 720-1 in proximity to a boundary between the first upper surface portion 712 and a first side surface portion 714'. The first connection portion 732 may be located at one side of the through-hole 720-1 and the second connection portion 734 may be located at the other side of the through-hole 720-1.

Figure 36:
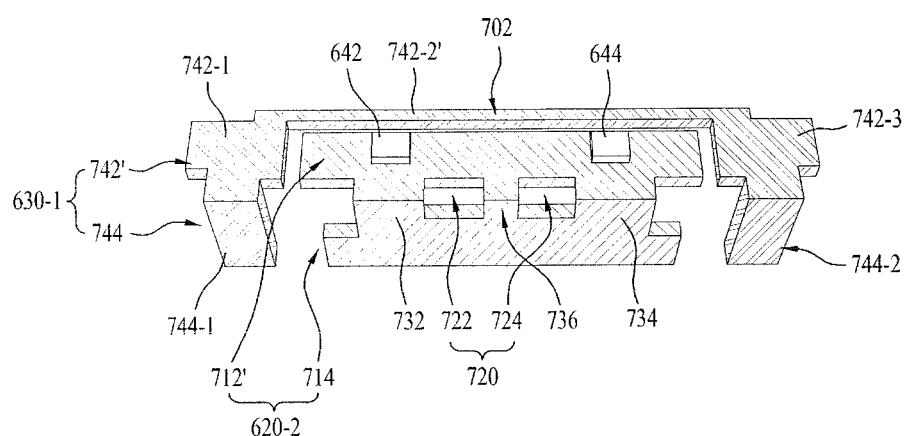

FIG. 36 shows a first lead frame 620-2 and a second lead frame 630-1 according to another embodiment. The same reference numerals as those of FIG. 32 indicate the identical components, and these identical components, which have been described above, will not be repeatedly described or will be described in brief.

Referring to FIG. 36, as compared to the first upper surface portion 712 of the first lead frame 620 shown in FIG. 32, the recess 701 may be omitted from a first upper surface portion 712' of the first lead frame 620-2. In addition, as compared to the second portion 742-2 of the second upper surface portion 742 of the second lead frame 630 shown in FIG. 32, the protrusion 702 may be omitted from a second portion 742-2' of a second upper surface portion 742' of the second lead frame 630-1. The other components may be identical to the above description of FIG. 32.

Figure 37:
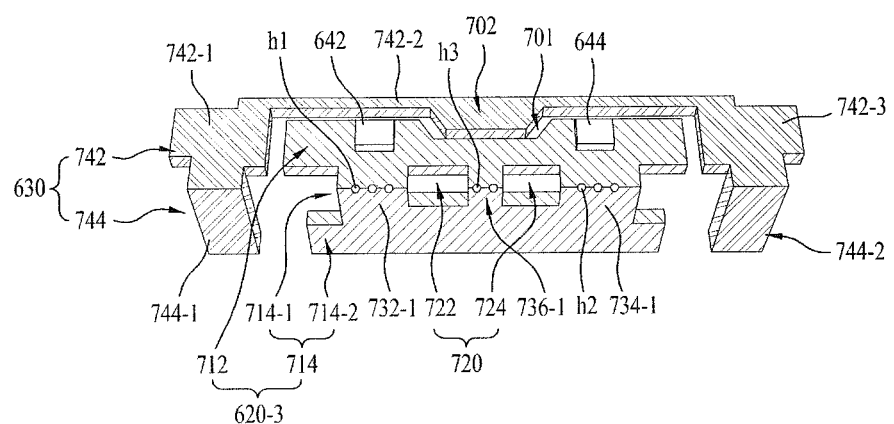

FIG. 37 shows a first lead frame 620-3 and the second lead frame 630 according to another embodiment. The same reference numerals as those of FIG. 32 indicate the identical components, and these identical components, which have been described above, will not be repeatedly described or will be described in brief.

Referring to FIG. 37, the first lead frame 620-3 may be acquired by forming fine through-holes h1, h2 and h3 in at least one of the connection portions 732, 734 and 736 of the first lead frame 620 shown in FIG. 32.

At least one of connection portions 732-1, 734-1 and 736-1 of the first lead frame 620-3 may have fine through-holes h1, h2 and h3 formed at a boundary between the first upper surface portion 712 and the first side surface portion 714. In this case, the fine through-holes h1, h2 and h3 may have a smaller diameter than the first directional lengths D11 and D12 or the second directional length D2 of the through-holes 722 and 724. In addition, the number of the fine through-holes h1 and h2 formed in the first connection portion 732-1 and the second connection portion 734-1 may be greater than the number of the fine through-holes h3 formed in the third connection portion 736-1, without being limited thereto. In addition, the fine through-holes h1, h2 and h3 may have a circular shape, oval shape, or polygonal shape. The fine through-holes h1, h2 and h3 enable easy bending of the first lead frame 620-3 and enhance coupling strength between the first lead frame 620-3 and the package body 610.

Figure 38:
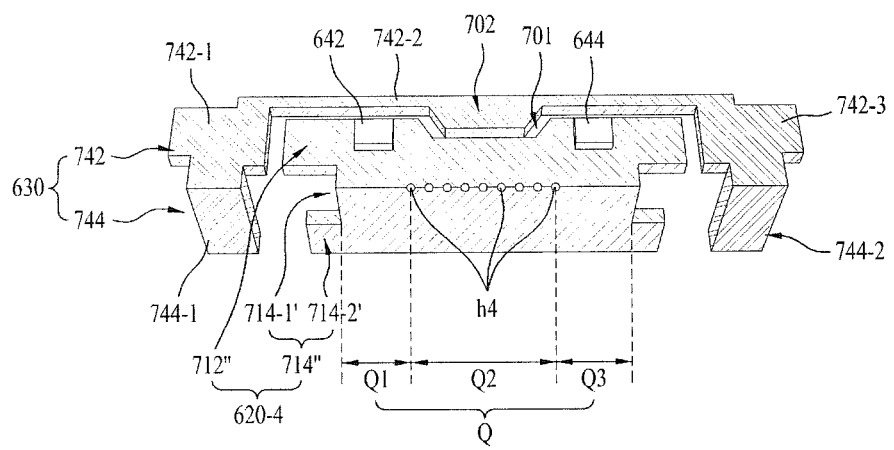

FIG. 38 shows a first lead frame 620-4 and the second lead frame 630 according to another embodiment. The same reference numerals as those of FIG. 32 indicate the identical components, and these identical components, which have been described above, will not be repeatedly described or will be described in brief.

Referring to FIG. 38, the first lead frame 620-4 includes a first upper surface portion 712" and a first side surface portion 714". The first upper surface portion 712" and the first side surface portion 714" are alternative embodiments of the first upper surface portion 712 and the first side surface portion 714 shown in FIG. 32. More specifically, as compared to the first upper surface portion 712 and the first side surface portion 714 of the first lead frame 620 shown in FIG. 30, the through-holes 722 and 724 are omitted from the first lead frame 620-4, and a plurality of fine through-holes h4 is formed so as to be spaced apart from one another in a region Q2 of a boundary Q between the first upper surface portion 712" and the first side surface portion 714" which have no through-holes 722 and 724.

The boundary Q between the first upper surface portion 712" and the first side surface portion 714" may be divided into a first boundary region Q1, a second boundary region Q2 and a third boundary region Q3. The first boundary region Q1 may correspond to or be aligned with the first light emitting chip 642, the second boundary region Q2 may correspond to or be aligned with the first light emitting chip 642, and the third boundary region Q3 may be located between the first boundary region Q1 and the second boundary region Q2. For example, the first boundary region Q1 may correspond to the first connection portion 732 shown in FIG. 32, and the second boundary region Q2 may correspond to the second connection portion 734 shown in FIG. 32.

The first boundary region Q1 and the second boundary region Q2 may serve as passages for transfer of heat generated in the first light emitting chip 642 and the second light emitting chip 644, and the fine through-holes h4 may serve to facilitate easy bending at the boundary between the first upper surface portion 712" and the first side surface portion 714". While FIG. 36 shows the fine through-holes h4 as having the same diameter and being spaced apart from one another by the same distance, the embodiment is not limited thereto. In some embodiments, at least one of the fine through-holes h4 may have a different diameter, or may be spaced apart from the neighboring fine through-holes by a different distance.

Figure 39:
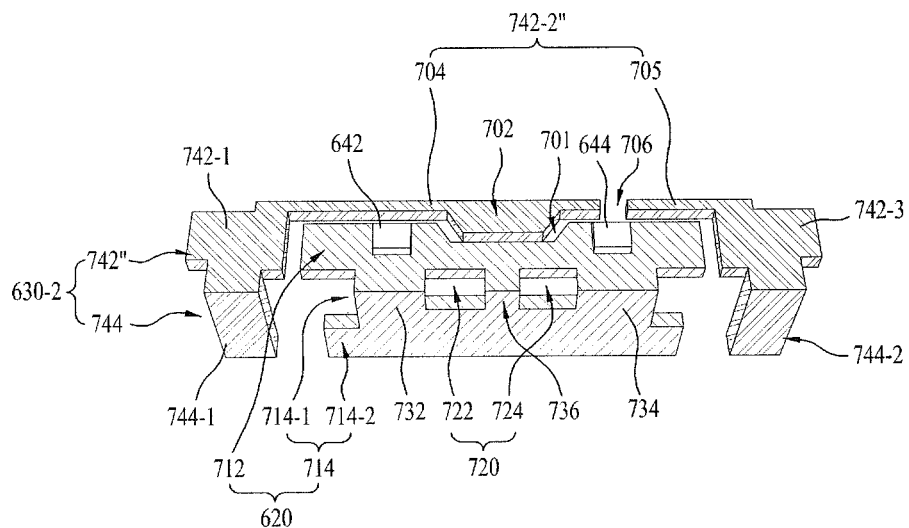

FIG. 39 shows the first lead frame 620 and a second lead frame 630-2 according to another embodiment. The second lead frame 630-2 of FIG. 39 may be an alternative embodiment of the second lead frame 630 shown in FIG. 30. The same reference numerals as those of FIG. 32 indicate the identical components, and these identical components, which have been described above, will not be repeatedly described or will be described in brief.

Referring to FIG. 39, differently from the second portion 742-2 of the second upper surface portion 742 shown in FIG. 32, a second portion 742-2" of a second upper surface portion 742" shown in FIG. 39 is broken so as not to connect the first portion 742-1 and the third portion 742-3 to each other.

The second upper surface portion 742" of the second lead frame 630-2 may include the first portion 742-1, the second portion 742-2" and the third portion 742-3. The first to third portions 742-1, 742-2" and 742-3 may be disposed respectively around a corresponding one of the sides of the first upper surface portion 712 of the first lead frame 620.

The second portion 742-2" of the second upper surface portion 742" may be divided into a first region 704 connected to the first portion 742-1 and a second region 705 connected to the third portion 742-3, the first region and the second region being spaced apart from each other. A space 706 between the first region 704 and the second region 705 is filled with the package body 610, which may enhance coupling strength between the package body 610 and the second lead frame 630-2. The second lead frame 630-2 shown in FIG. 38 may be divided into a first sub-frame 744-1, 742-1 and 704 and a second sub-frame 744-2, 742-3 and 705 which may be electrically separated from each other.

Figure 40:
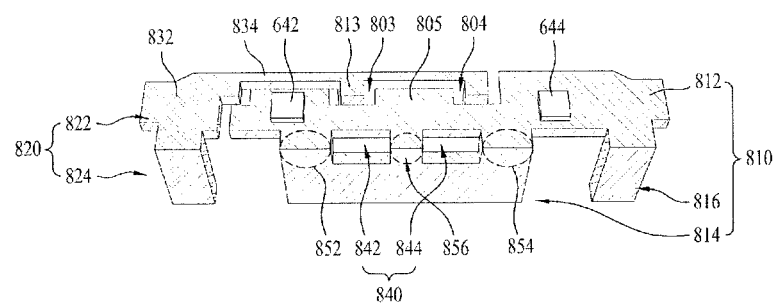

FIG. 40 shows a first lead frame 810 and a second lead frame 820 according to another embodiment.

Referring to FIG. 40, the first lead frame 810 may include a first upper surface portion 812, and a first side surface portion 814 and a second side surface portion 816 which are bent from a first side of the first upper surface portion 812. The light emitting chips 642 and 644 may be placed on the first upper surface portion 812.

The first upper surface portion 812 may be provided at a second side thereof with one or more first recesses 803 and 804 and a first protrusion 805. In this case, the second side of the first upper surface portion 812 may be disposed to face the first side of the first upper surface portion 812. For example, the second side of the first upper surface portion 812 may be provided with two first recesses 803 and 804 and a single first protrusion 805 located between the first recesses 803 and 804, without being limited thereto. The first recesses 803 and 804 may have a shape corresponding to a shape of second protrusions 813 and 814 of the second lead frame 820 that will be described below, and the first protrusion 805 may have a shape corresponding to a shape of a second recess 815 formed in the second lead frame 820. The first recesses 803 and 804 and the first protrusion 805 shown in FIG. 38 have a rectangular shape without being limited thereto, and may have any of various shapes, such as a circular shape, polygonal shape or oval shape. The light emitting chips 642 and 644 may be placed on the first upper surface portion 812 at both sides of the first recesses 803 and 804.

The first side surface portion 814 may be connected to a region of the first side of the first upper surface portion 712, the second side surface portion 816 may be connected to another region of the first side of the first upper surface portion 712, and the first side surface portion 814 and the second side surface portion 816 may be spaced apart from each other. The first side surface portion 814 and the second side surface portion 816 may be exposed from the same side surface of the package body 610.

The first lead frame 610 may have one or more through-holes 820 formed in at least one of the first upper surface portion 812 and the first side surface portion 814. For example, the first lead frame 810 may have one or more through-holes 840 in proximity to a boundary between the first upper surface portion 812 and the first side surface portion 814. The through-holes 820 may have the same configuration as the above description of FIGS. 32 and 34 and may have the same function.

The first lead frame 810 may have connection portions 852, 854 and 856 to connect the first upper surface portion 712 and the first side surface portion 714 to each other, the connection portions being located in proximity to a boundary 801 between the first upper surface portion 812 and the first side surface portion 814 and spaced apart from one another by the through-holes 720. The connection portions 852, 854 and 856 may have the same configuration and function as the above description of FIGS. 32 and 34. The first lead frame 810 may have at least one connection portion corresponding to or located in proximity to the light emitting chip 642 or 644.

The connection portions (e.g., 852 and 854) corresponding to or located in proximity to the light emitting chips 642 and 644 may have a greater first directional length than a first directional length of the connection portion (e.g., 856) not corresponding to or not located in proximity to the light emitting chips 642 and 644.

To enhance coupling strength with the package body 620 and air-tightness for prevention of moisture invasion, a lower end of a side surface of the second side surface portion 814 may protrude in a lateral direction.

The second lead frame 820 may be located around at least one side of the first lead frame 810. The second lead frame 820 may include a second upper surface portion 822 and a third side surface portion 824. The second upper surface portion 822 may be divided into a first portion 832 and a second portion 834 according to positions thereof around the first upper surface portion 812.

The second portion 834 of the second upper surface portion 822 may correspond to or face the second side of the first upper surface portion 812. The first portion 832 of the second upper surface portion 822 may be connected to one end of the second portion 834, and may correspond to or face a third side of the first upper surface portion 712. The third side may be perpendicular to the first side or the second side.

The second portion 834 of the second upper surface portion 822 may have the second protrusions 813 and 814 corresponding to the first recesses 803 and 804 of the first upper surface portion 812. The second protrusions 813 and 814 are regions for wire bonding with the first light emitting chip 642 and the second light emitting chip 644, and may be located between the first light emitting chip 642 and the second light emitting chip 644 to facilitate easy wire bonding.

The third side surface portion 824 may be bent downward from the second upper surface portion 822 by a given angle (e.g., 90°). For example, the third side surface portion 824 may be bent from one side of the first portion 832 of the second upper surface portion 822. The second side surface portion 816 and the third side surface portion 824 may be horizontally symmetrical to each other on the basis of the first side surface portion 814. To enhance coupling strength with the package body 620 and air-tightness for prevention of moisture invasion, a lower end of a side surface of the third side surface portion 824 may protrude in a lateral direction. The first side surface portion 814, the second side surface portion 816, and the third side surface portion 824 may be exposed from the same side surface of the package body 610.

Figure 41:
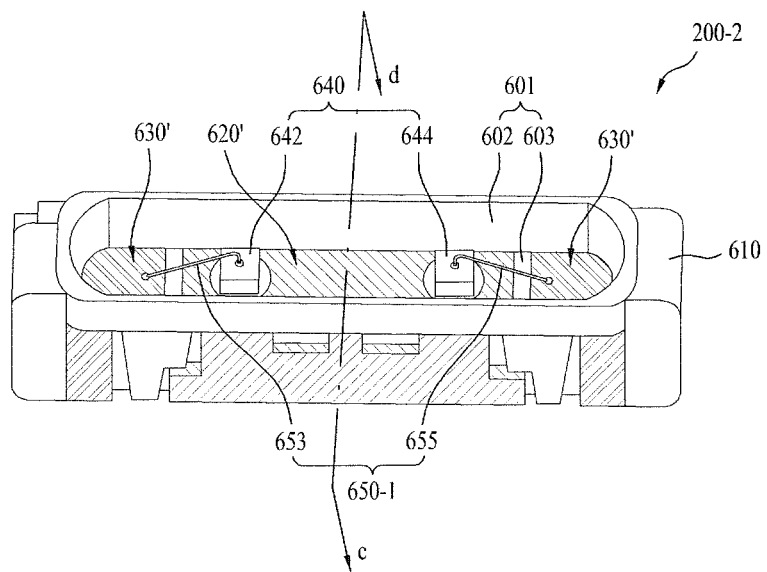
FIG. 41 is a perspective view showing a light emitting diode package according to another embodiment.
Figure 42:
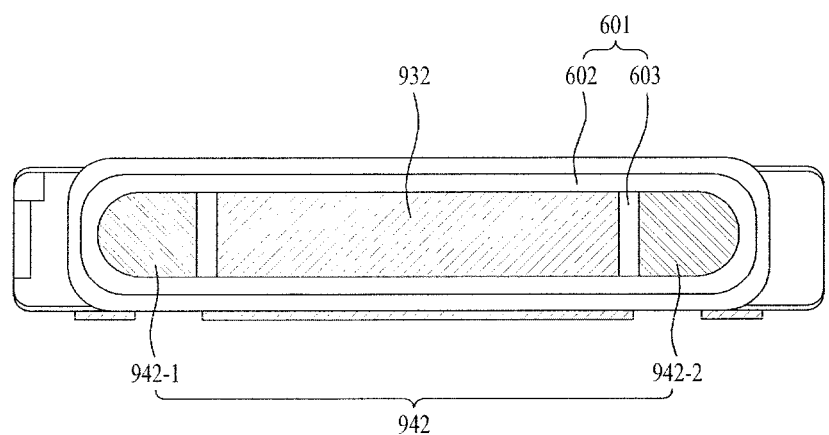
FIG. 42 is a top view showing the light emitting diode package shown in FIG. 41.
Figure 43:
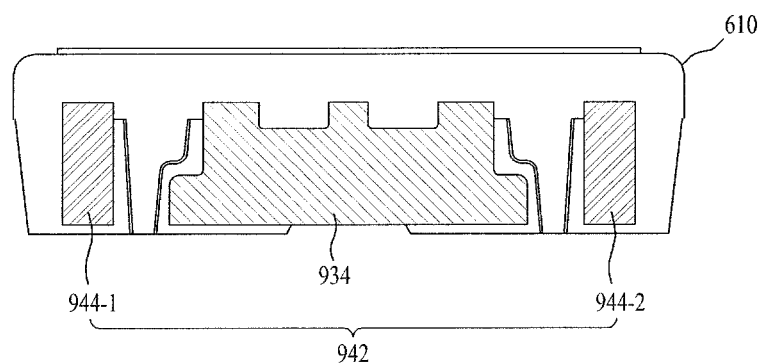
FIG. 43 is a front view showing the light emitting diode package shown in FIG. 41.
Figure 44:
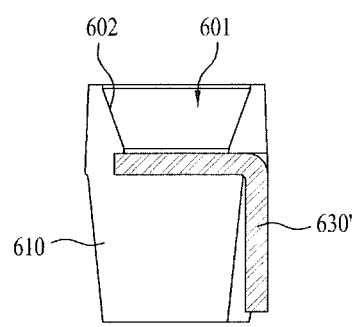
FIG. 44 is a sectional view taken along line CD of the light emitting diode package shown in FIG. 41.
Figure 45:
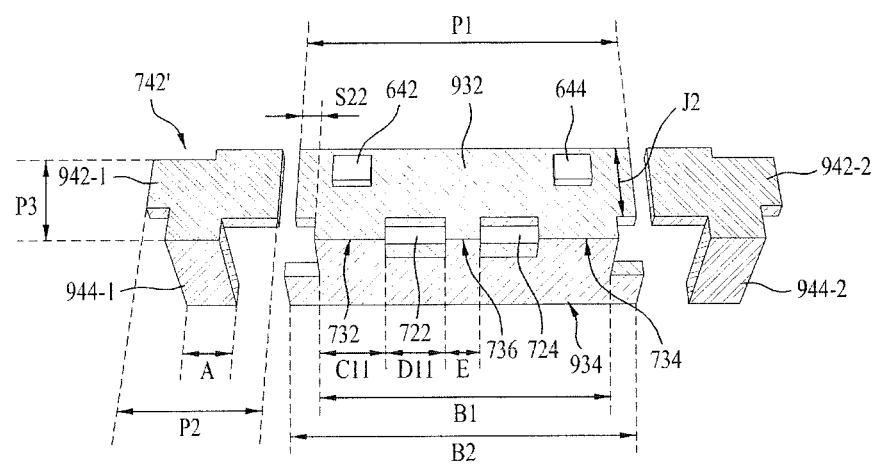
FIG. 45 is a view showing a first lead frame and a second lead frame shown in FIG. 41.

FIG. 41 is a perspective view showing a light emitting diode package 200-2 according to another embodiment, FIG. 42 is a top view showing the light emitting diode package 200-2 shown in FIG. 41, FIG. 43 is a front view showing the light emitting diode package 200-2 shown in FIG. 41, FIG. 44 is a sectional view taken along line CD of the light emitting diode package 200-2 shown in FIG. 41, and FIG. 45 is a view showing a first lead frame 620' and a second lead frame 630' shown in FIG. 41. The same reference numerals as those of FIGS. 28 to 32 indicate the identical components, and these identical components, which have been described above, will not be repeatedly described or will be described in brief.

Referring to FIGS. 41 to 45, the first lead frame 620' of the light emitting diode package 200-2 may include a first upper surface portion 932 and a first side surface portion 934. Differently from the first upper surface portion 712 shown in FIG. 32, the first upper surface portion 932 shown in FIG. 45 has no recess. In addition, as compared to the second upper surface portion 742 shown in FIG. 32, the second portion 742-2 may be omitted from a second upper surface portion 742 of the second lead frame 630'.

The first side surface portion 934 may have the same configuration as the first side surface portion 714 shown in FIG. 32. A first directional length P1 of the first upper surface portion 932 may be less than a length of the first upper surface portion 712 shown in FIG. 32, and a second directional length J2 of the first upper surface portion 932 may be greater than a second directional length J1 of the first upper surface portion 712. For example, the first upper surface portion 932 may have a first directional length P1 of 4.8 mm~4.9 mm and a second directional length J2 of 0.67 mm~0.77 mm. In this way, the embodiment of FIG. 41 enables a greater size of light emitting chips to be mounted because the first upper surface portion 932 has a greater area than an area of the first upper surface portion 712 shown in FIG. 32. The first side surface portion 944, the through-holes 722 and 724, and the connection portions may respectively have the same size as the above description of FIG. 33.

The second lead frame 630' may include the second upper surface portion 942 and a second side surface portion 944. The second upper surface portion 942 may include a first portion 942-1 located around a third side of the first upper surface portion 932 and a second portion 942-2 located around a fourth side of the first upper surface portion 932. The third side of the first upper surface portion 932 may be perpendicular to a first side of the first upper surface portion 932 and the fourth side of the first upper surface portion 932 may be disposed to face the third side of the first upper surface portion 932.

The first portion 942-1 and the second portion 942-2 of the second upper surface portion 942 may be spaced apart from each other and electrically separated from each other.

The second side surface portion 944 may include a first portion 944-1 connected to the first portion 942-1 of the second upper surface portion 942 and a second portion 944-2 connected to the second portion 942-2 of the second upper surface portion 942. A first directional length P2 of the first portion 942-1 and the second portion 942-2 of the second upper surface portion 942 may be greater than a first directional length H2 of the first portion 742-1 and the third portion 742-3 of the second upper surface portion 742 shown in FIG. 32.

For example, the first portion 942-1 and the second portion 942-2 of the second upper surface portion 942 may have the first directional length P2 of 1.04 mm~1.14 mm and a second directional length P3 of 0.45 mm~0.55 mm.

In a lead frame array, the first upper surface portion 932 may have a protruding portion S22 to support the first lead frame 620', the protruding portion having a first directional length of 0.14 mm~0.24 mm.

The first light emitting chip 642 may be electrically connected to the first portion 942-1 of the second upper surface portion 942 via the first wire 653, and the second light emitting chip 644 may be electrically connected to the first portion 942-2 of the second upper surface portion 942 via the second wire 655.

Both the first light emitting chip 642 and the second light emitting chip 644 may emit the same wavelength range of light. For example, the first light emitting chip 642 and the second light emitting chip 644 may be red light emitting chips to generate red light.

In addition, the first light emitting chip 642 may emit light having a different wavelength range. For example, the first light emitting chip 642 may be a red light emitting chip and the second light emitting chip 644 may be a yellow light emitting chip. The first light emitting chip 642 and the second light emitting chip 644 mounted in the light emitting diode package 200-2 according to the second embodiment may individually operate.

First power (e.g., negative power) may be supplied to the first lead frame 620' and second power (e.g., positive power) may be supplied to the second lead frame 630'. Since the second lead frame 630' is divided into two electrically separated parts 942-1 and 944-1 and 942-2 and 944-2, the first lead frame 620' serves as a common electrode and the second power is supplied to the first portion 942-1 and the second portion 942-2 of the second upper surface portion 942 of the second lead frame 630', which enable the first light emitting chip 642 and the second light emitting chip 644 to individually operate.

Accordingly, when the light emitting diode package 200-2 shown in FIG. 41 is mounted in the light source modules 100-1 to 100-21 according to the embodiments, the light source modules 100-1 to 100-21 may produce planar light sources of various colors. For example, in the embodiment in which only the first light emitting chip 642 is operated, a red planar light source may be produced, and in the embodiment in which only the second light emitting chip 644 is operated, a yellow planar light source may be produced.

Figure 46:
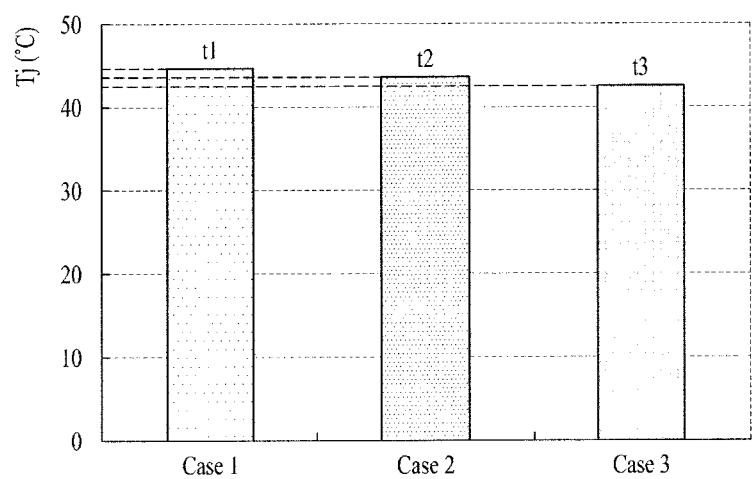
FIG. 46 is a view showing measured temperatures of the light emitting diode packages according to the embodiments.

FIG. 46 is a view showing measured temperatures of the light emitting diode packages 200-1 and 200-2 according to the embodiments. The measured temperatures shown in FIG. 46 indicate temperatures of light emitting chips while the light emitting diode packages emit light.

Case 1 shows a measured temperature of a light emitting chip in the case in which a side surface portion of a first lead frame includes a first portion, a second portion and a third portions, and a first directional length of the first portion and the second portion is equal to a length of the third portion, Case 2 shows a measured temperature of the light emitting chip shown in FIG. 26, and Case 3 shows a measured temperature of the light emitting chip shown in FIG. 39.

Referring to FIG. 46, the measured temperature t1 of Case 1 is 44.54° C., the measured temperature t2 of Case 2 is 43.66° C., and the measured temperature t3 of Case 3 is 43.58° C.

Accordingly, by changing design of the connection portions 732, 734 and 736 of the first side surface portion 714 of the first lead frame 620, the embodiment may achieve improved radiation effects and restrict increase in the temperature of the light emitting chips 640 mounted in the light emitting diode packages 200-1 and 200-2 during emission of light, which may prevent reduction in luminous intensity and occurrence of wavelength shift.

Figure 47:
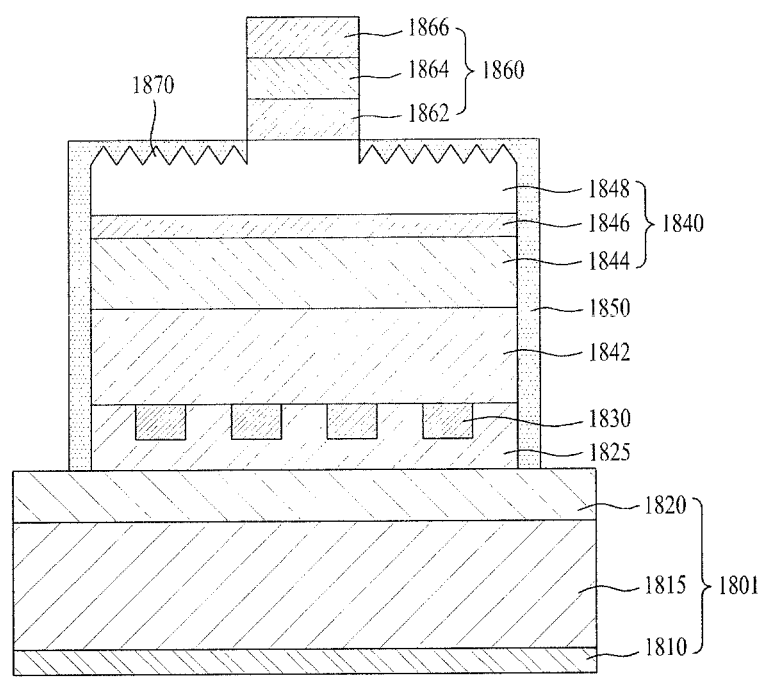
FIG. 47 is a view showing one embodiment of light emitting chip shown in FIG. 28.

FIG. 47 is a view showing one embodiment of the light emitting chip 640 shown in FIG. 28. The light emitting chip 640 shown in FIG. 47 may be a vertical chip to emit red light having a wavelength range of 600 nm~690 nm.

Referring to FIG. 47, the light emitting chip 640 includes a second electrode layer 1801, a reflective layer 1825, a light emitting structure 1840, a passivation layer 1850, and a first electrode layer 1860.

The second electrode layer 1801 supplies power to the light emitting structure 1840 in conjunction with the first electrode layer 1860. The second electrode layer 1801 may include an electrode material layer 1810 for introduction of current, a support layer 1815 disposed on the electrode material layer 1810, and a bonding layer 1820 disposed on the support layer 1815. The second electrode layer 1801 may be bonded to the first lead frame 620 of the light emitting diode package 200-1 shown in FIG. 32, for example, the first upper surface portion 712.

The electrode material layer 1810 may be formed of Ti/Au, and the support layer 1815 may be formed of a metal or semiconductor material. In addition, the support layer 1815 may be formed of a high electrical-conductivity and thermal-conductivity material. For example, the support layer 1815 may be formed of a metal including at least one of copper (Cu), copper alloy (Cu alloy), gold (Au), nickel (Ni), molybdenum (Mo), and copper-tungsten (Cu—W), or may be formed of a semiconductor including at least one of Si, Ge, GaAs, ZnO, and SiC.

The bonding layer 1820 may be located between the support layer 1815 and the reflective layer 1825 and serve to bond the support layer 1815 to the reflective layer 1825. The bonding layer 1820 may comprise a bonding metal material, for example, at least one of In, Sn, Ag, Nb, Pd, Ni, Au, and Cu. The bonding layer 1820 is formed for bonding of the support layer 815 and may be omitted when the support layer 1815 is formed via plating or deposition.

The reflective layer 1825 is disposed on the bonding layer 820. The reflective layer 1825 may reflect light directed from the light emitting structure 1840, thereby enhancing light extraction efficiency. The reflective layer 825 may be formed of a reflective metal material, for example, a metal or alloy including at least one of Ag, Ni, Al, Rh, Pd, Ir, Ru, Mg, Zn, Pt, Au and Hf.

In addition, the reflective layer 1825 may be formed in a single layer or in multiple layers using a conductive oxide, for example, indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), or the like. In addition, the reflective layer 825 may be formed in multiple layers using a metal and conductive oxide, such as IZO/Ni, AZO/Ag, IZO/Ag/Ni, AZO/Ag/Ni, or the like.

An ohmic region 1830 may be located between the reflective layer 1825 and the light emitting structure 1840. The ohmic region 1830 is a region for ohmic contact with the light emitting structure 1840 and serves to ensure smooth supply of power to the light emitting structure 1840.

The ohmic region 1830 may be formed by causing an ohmic contact material to come into contact with the light emitting structure 1840, the ohmic contact material including at least one of Be, Au, Ag, Ni, Cr, Ti, Pd, Ir, Sn, Ru, Pt, and Hf. For example, the ohmic region 1830 may comprise AuBe and may have a dot shape.

The light emitting structure 1840 may include a window layer 1842, a second semiconductor layer 1844, an active layer 1846, and a first semiconductor layer 1848. The window layer 1842 is a semiconductor layer disposed on the reflective layer 1825 and may comprise a composition of GaP. In some embodiments, the window layer 1842 may be omitted.

The second semiconductor layer 1844 is disposed on the window layer 1842. The second semiconductor layer 1844 may be formed of a group III-V or II-VI compound semiconductor, and may be doped with a second conductive dopant. For example, the first semiconductor layer 1844 may comprise any one of AlGaInP, GaInP, AlInP, GaN, AlN, AlGaN, InGaN, InN, InAlGaN, AlInN, AlGaAs, GaP, GaAs, and GaAsP, and may be doped with a p-type dopant (e.g., Mg, Zn, Ca, Sr, and Ba). More specifically, a composition of the first semiconductor layer 1844 may be AlGaInP doped with a p-type dopant.

The active layer 1846 may be interposed between the second semiconductor layer 1844 and the first semiconductor layer 848, and may generate light using energy produced via recombination of electrons and holes provided by the second semiconductor layer 1844 and the first semiconductor layer 1848.

The active layer 1846 may be formed of a group III-V or II-VI compound semiconductor and may have a single-quantum well structure, a multi-quantum well structure, a quantum wire structure, or a quantum dot structure.

For example, the active layer 1846 may have a single or multi quantum well structure having a well layer and a barrier layer. The well layer may be formed of a material having smaller energy band gap than an energy band gap of the barrier layer. For example, the active layer 1846 may be formed of AlGaInP or GaInP.

The first semiconductor layer 1848 may be formed of a compound semiconductor. The first semiconductor layer 1848 may be formed of a group III-V or II-VI compound semiconductor and may be doped with a first conductive dopant. For example, the first semiconductor layer 1848 may comprise any one of AlGaInP, GaInP, AlInP, GaN, AlN, AlGaN, InGaN, InN, InAlGaN, AlInN, AlGaAs, GaP, GaAs, and GaAsP, and may be doped with an n-type dopant (e.g., Si, Ge and Sn).

The light emitting structure 1840 may generate red light having a wavelength range of 600 nm~690 nm, and the first semiconductor layer 1848, the active layer 1846 and the second semiconductor layer 1844 may have compositions for generation of red light. To increase light extraction efficiency, the semiconductor layer 848 may have a roughened upper surface 1870.

The passivation layer 1850 is formed at a side surface of the light emitting structure 1840. The passivation layer 1850 serves to electrically protect the light emitting structure 1840. The passivation layer 1850 may be formed of an insulation material, for example, $SiO_2$, $SiO_x$, $SiO_xN_y$, $Si_3N_4$ or $Al_2O_3$. The passivation layer 1850 may be disposed on at least a part of the upper surface of the first semiconductor layer 1848.

The first electrode layer 1860 may be disposed on the first semiconductor layer 1848 and have a prescribed pattern. The first electrode layer 1860 may be formed in a single layer or in multiple layers. For example, the first electrode layer 1860 may include a first layer 1862, a second layer 1864 and a third layer 1866 which are sequentially stacked one above another. The first layer 1862 may be in ohmic contact with the first semiconductor layer 1848 and formed of GaAs. The second layer 1864 may be formed of an AuGe/Ni/Au alloy. The third layer 1866 may be formed of a Ti/Au alloy.

As exemplarily shown in FIGS. 28 and 41, the first electrode layer 860 may be electrically bonded to the second lead frame 630 or 630' via a wire 652, 654, 653 or 655.

Generally, increase in the temperature of light emitting chips causes occurrence of wavelength shift and reduction in luminous intensity. As compared to blue light emitting chips that generate blue light and yellow light emitting chips that generate yellow light, such wavelength shift and reduction in luminous intensity due to increase in temperature are more serious in red light emitting chips that generate red light. Therefore, in the case of light emitting diode packages and light source modules using red light emitting chips, it is very important to provide means for restricting increase in the temperature of light emitting chips.

The light source modules 100-1 to 100-21 and the light emitting diode packages 200-2 and 200-2 included in the light emitting lamp 1 according to the embodiments may achieve enhanced radiation efficiency as described above, thereby restricting increase in the temperature of light emitting chips even if red light emitting chips are used, which may prevent occurrence of wavelength shift and reduction in luminous intensity.

Figure 48:
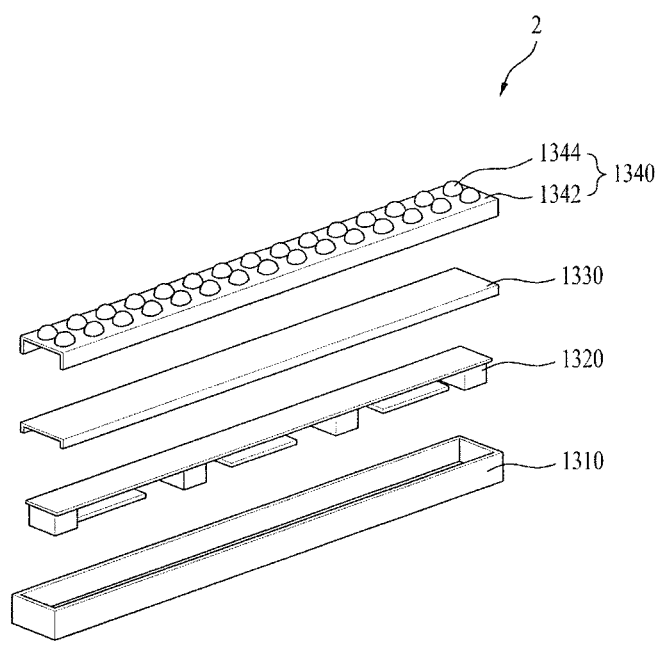
FIG. 48 is a view showing a light emitting lamp according to another embodiment.

FIG. 48 is a view showing a light emitting lamp 2 according to another embodiment. Referring to FIG. 48, the light emitting lamp 2 includes a housing 1310, a light source module 1320, a diffusion plate 1330, and a micro-lens array 1340.

The housing 1310 may be configured to receive the light source module 1320, the diffusion plate 1330, and the micro-lens array 1340 and formed of a light transmitting material.

The light source module 1320 may be any one of the above-described embodiments 100-1 to 100-21. Alternatively, the light source module 1320 may be any one of the embodiments 100-1 to 100-3, 100-7, 100-8, 100-12, 100-13 and 100-20 in which the diffusion plate 70 is not included. Alternatively, the light source module 1320 may be any one of the embodiments 100-4 to 100-6, 100-9 to 100-11, and 100-14 to 100-21 from which the diffusion plate 70 is omitted.

The diffusion plate 1330 may serve to uniformly diffuse light having passed through the light source module 1320 throughout a surface thereof. The diffusion plate 1330 may be formed of the same material as the above-described diffusion plate 70, without being limited thereto. In some embodiments, the diffusion plate 1330 may be omitted.

The micro-lens array 1340 may include a plurality of micro-lenses 1344 disposed on a base film 1342. The respective micro-lenses 1344 may be spaced apart from one another by a predetermined distance. The respective micro-lenses 1344 may be spaced apart from one another by a pitch of 50~500 micrometers and a flat plane may be present between the respective micro-lenses 1344.

While FIG. 48 shows the diffusion plate 1330 and the micro-lens array 1340 as being separate components, in some embodiments, the diffusion plate 1330 and the micro-lens array 1340 may be integrated with each other.

Figure 50:
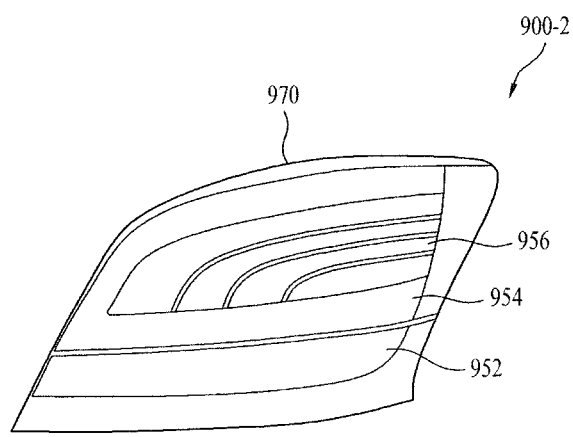
FIG. 50 is a view showing an automobile taillight according to an embodiment.
Figure 51:
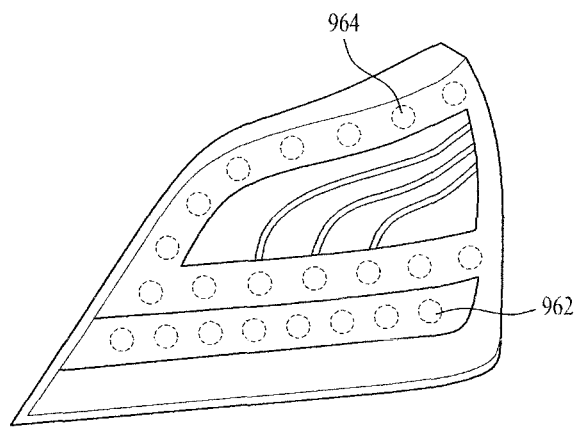
FIG. 51 is a view showing a general automobile taillight.

FIG. 50 is a view showing an automobile taillight 900-2 according to an embodiment, and FIG. 51 is a view showing a general automobile taillight.

Referring to FIG. 50, the automobile taillight 900-2 may include a first light source module 952, a second light source module 954, a third light source module 956, and a housing 970.

The first light source module 952 may be a light source that serves as a turn signal light, the second light source module 954 may be a light source that serves as a side marker light, and the third light source module 956 may be a light source that serves as a brake light, without being limited thereto, and roles of these light source modules may be interchanged.

The housing 970 may be configured to receive the first to third light source modules 952, 954, and 956 and formed of a light transmitting material. The housing 970 may have a curvature according to design of a car body. At least one of the first to third light source modules 952, 954 and 956 may be any one of the above-described embodiments 100-1 to 100-21.

A taillight has to emit light having an intensity of 110 candela (cd) or more during stop of an automobile to achieve visibility from a distance, and normally requires an intensity of light greater than the above level by 30% or more. In addition, in order to output such 30% or greater intensity of light, the number of light emitting diode packages included in the light source module (e.g., 952, 954 or 956) must be increased by 25%-35% or more, or the output of individual light emitting diode packages must be increased by 25%~35% or more.

Increasing the number of light emitting diode packages, however, may cause fabrication difficulties due to a limited arrangement space. Therefore, it is desirable to achieve a desired intensity of light (e.g., 110 candela or more) using a low number of light emitting diode packages by increasing output of individual light emitting diode packages mounted in a light source module. The entire output of a light source module is normally calculated by multiplying output W of each light emitting diode package by the number of light emitting diode packages. Thus, the appropriate output and number of light emitting diode packages to achieve a desired intensity of light may be determined depending on an area of a light source module.

For example, in the case of light emitting diode packages each having power consumption of 0.2 watts and output of 13 lumen (lm), 37 to 42 light emitting diode packages may be disposed within a given area to achieve intensity of light up to about 100 candela. On the other hand, in the case of light emitting diode packages each having power consumption of 0.5 watts and output of 30 lumen (lm), it is necessary to arrange only 13 to 15 light emitting diode packages within the same area to achieve intensity of light similar to the aforementioned value. The number of light emitting diode packages that must be mounted in a light source module having a given area to achieve a given output may be determined according to a pitch, the content of a light diffusion material in a light guide layer, and a pattern shape of a reflective layer. Here, the pitch may be referred to as a distance from the center of any one of two neighboring light emitting diode packages to the center of the other one.

Light emitting diode packages are generally disposed within a light source module to maintain a constant distance therebetween. When using high-output light emitting diode packages, it is possible to reduce the number of light emitting diode packages and to arrange the light emitting diode packages at a wide pitch, which enables efficient space utilization. In addition, when the high-output light emitting diode packages are disposed at a narrow pitch, greater intensity of light may be achieved as compared to the case in which the light emitting diode packages are disposed at a wide pitch.

Figure 52A:
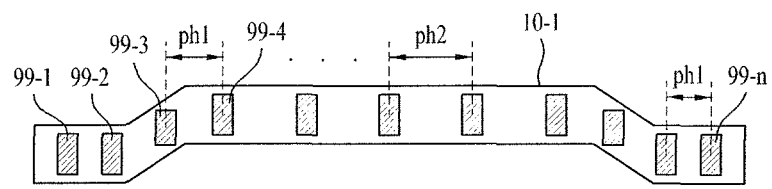
FIGS. 52a and 52b are views showing a distance between light emitting diode packages of a light source module used in an automobile taillight according to an embodiment.
Figure 52B:
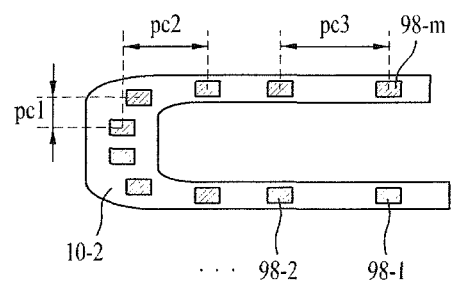

FIGS. 52a and 52b are views showing a distance between light emitting diode packages of a light source module used in an automobile taillight according to an embodiment. More specifically, FIG. 52a shows the first light source module 952 shown in FIG. 50, and FIG. 52b shows the second light source module 954 shown in FIG. 50.

Referring to FIGS. 52a and 52b, light emitting diode packages 99-1 to 99-n or 98-1 to 98-m may be disposed on a board 10-1 or 10-2 so as to be spaced apart from one another. Here, "n" is a natural number greater than 1, and "m" is a natural number greater than 1.

While pitches (e.g., ph1, ph2, and ph3, or pc1, pc2 and pc3) between the two respective neighboring light emitting diode packages may differ, an appropriate pitch range is 8~30 mm.

This is because the neighboring light emitting diode packages (e.g., 99-3 and 99-4) may cause perceivable bright spots due to light interference when the pitches (e.g., ph1, ph2 and ph3 or pc1, pc2 and pc3) are 8 mm or less, although this pitch value may vary according to power consumption of the light emitting diode packages 99-1 to 99-n or 98-1 to 98-m. In addition, when the pitches (e.g., ph1, ph2 and ph3 or pc1, pc2 and pc3) are 30 mm or more, dark spots may occur because light may fail to reach some regions.

As described above, the light source modules 100-1 to 100-21 have flexibility and are easily mountable to the housing 970 having a curvature, which may provide the automobile taillight 900-2 according to the embodiment with enhanced freedom in design.

In addition, the automobile taillight 900-2 according to the present embodiment may prevent occurrence of wavelength shift and reduction in luminous intensity because the light source modules 100-1 to 100-21 have an enhanced radiation configuration.

The general automobile taillight shown in FIG. 51 is a point light source and may cause spots 962 and 964 at some points of a light emitting plane upon emission of light, whereas the automobile taillight 900-2 according to the embodiment is a planar light source, thus achieving uniform luminance and illuminance throughout a light emitting plane.

Figure 53:
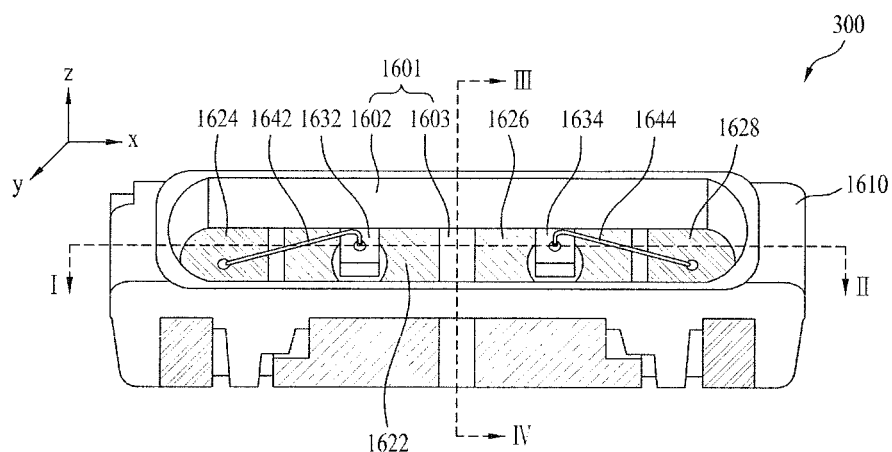
FIG. 53 is a perspective view showing a light emitting diode package according to another embodiment.
Figure 54:
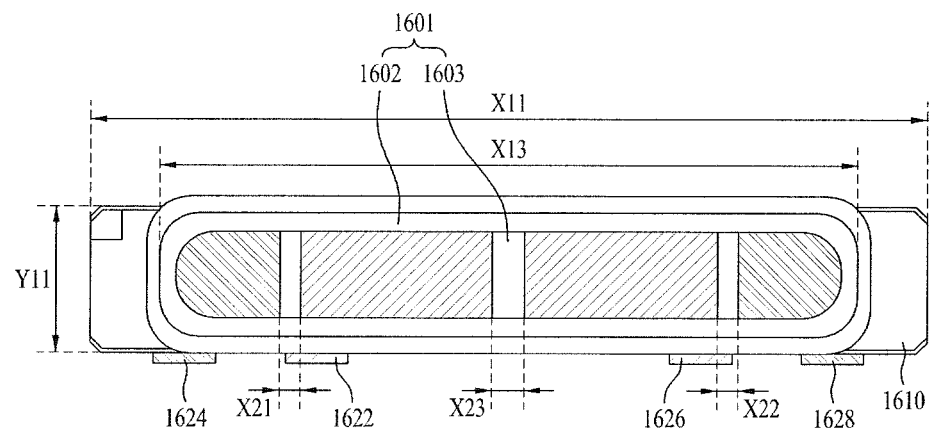
FIG. 54 is a top view of the light emitting diode package shown in FIG. 53.
Figure 55:
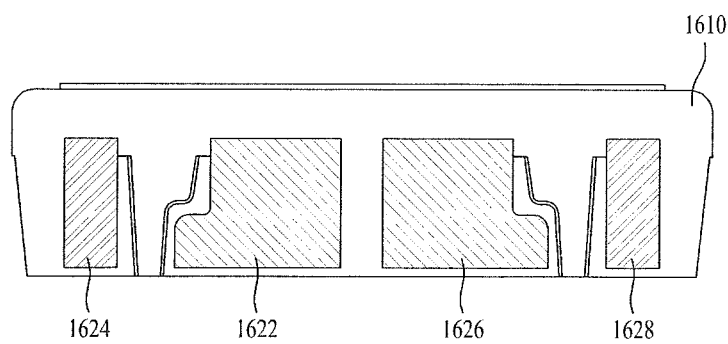
FIG. 55 is a front view showing the light emitting diode package shown in FIG. 53.
Figure 56:
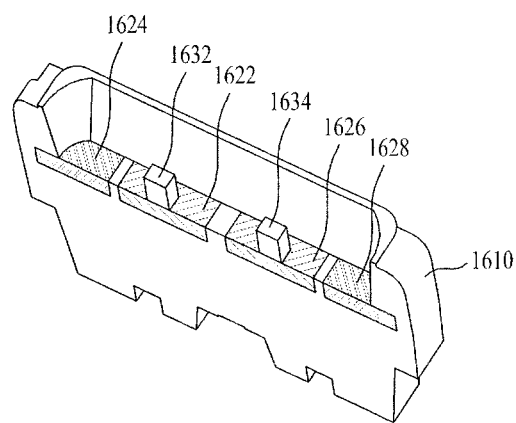
FIG. 56 is a perspective view showing a cross section taken along line I-II of the light emitting diode package shown in FIG. 53.
Figure 57:
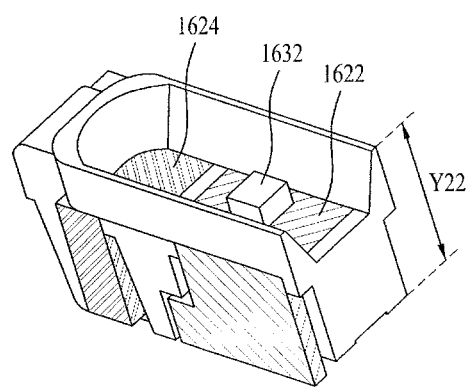
FIG. 57 is a perspective view showing a cross section taken along line III-IV of the light emitting diode package shown in FIG. 53.

FIG. 53 is a perspective view showing a light emitting diode package 300 according to another embodiment, FIG. 54 is a top view of the light emitting diode package 300 shown in FIG. 53, FIG. 55 is a front view showing the light emitting diode package 300 shown in FIG. 53, FIG. 56 is a perspective view showing a cross section taken along line I-II of the light emitting diode package 300 shown in FIG. 53, and FIG. 57 is a perspective view showing a cross section taken along line III-IV of the light emitting diode package 300 shown in FIG. 53.

Referring to FIGS. 53 to 57, the light emitting diode package 300 includes a package body 1610, a first lead frame 1622, a second lead frame 1624, a third lead frame 1626, a fourth lead frame 1628, a first light emitting chip 1632, a second light emitting chip 1634, and wires 1642 and 1644.

The package body 1610 may have the same material or shape as the above description of FIG. 28, without being limited thereto. For example, the package body 1610 may have a length X11 of 5.95 mm~6.05 mm in the first direction (e.g., along the X-axis) and a length Y11 of 1.01 mm~1.11 mm in the second direction (e.g., along the Y-axis). In addition, the package body 1610 may have a length Y22 of 1.6 mm~1.7 mm in the third direction (e.g., along the Z-axis). For example, the first direction may be a direction parallel to a longer side of the package body 1610.

The package body 1610 may have a cavity 1601 that has an open top and is defined by a sidewall 1602 and a bottom 1603. The cavity may have the same shape as the above description of FIG. 28, without being limited thereto. For example, the cavity 1601 may have a length X13 of 4.95 mm~5.05 mm in the first direction (e.g., along the X-axis), a length X4 of 0.64 mm~0.74 mm in the second direction (e.g., along the Y-axis), and a depth Y3 of 0.33 mm~0.53 mm (e.g., along the Z-axis).

The first to fourth lead frames 1622, 1624, 1626 and 1648 (hereinafter described as "1622 to 1628") may be disposed within the package body so as to be partially exposed, and may be spaced apart from one another so as to be electrically separated from one another.

For example, the first lead frame 1622 may be located between the second lead frame 1624 and the fourth lead frame 1628, and the third lead frame 1626 may be located between the first lead frame 1622 and the fourth lead frame 1628.

Part of the package body 1610 may be located between the first lead frame 1622 and the second lead frame 1624, between the first lead frame 1622 and the third lead frame 1626, and between the third lead frame 1626 and the fourth lead frame 1628. As such, the first to fourth lead frames 1622 to 1628 may be electrically separated from one another.

A first distance X21 between the first lead frame 1622 and the second lead frame 1624 and a second distance X22 between the third lead frame 1626 and the fourth lead frame 1628 may be equal to each other. For example, the first distance X21 and the second distance X22 may be 0.15 mm~0.2 mm. In this case, the lower limit of the first distance X1 and the second distance X22 may be the minimum distance required to inject resin for formation of the package body.

In addition, a third distance X23 between the first lead frame 1622 and the third lead frame 1626 may be greater than the first distance X21 and the second distance X22. For example, the third distance X23 may be 0.3 mm~0.4 mm.

An upper surface of each of the first to fourth lead frames 1622 to 1628 may be located on the same plane as the bottom 1603 of the cavity 1601.

Figure 58:
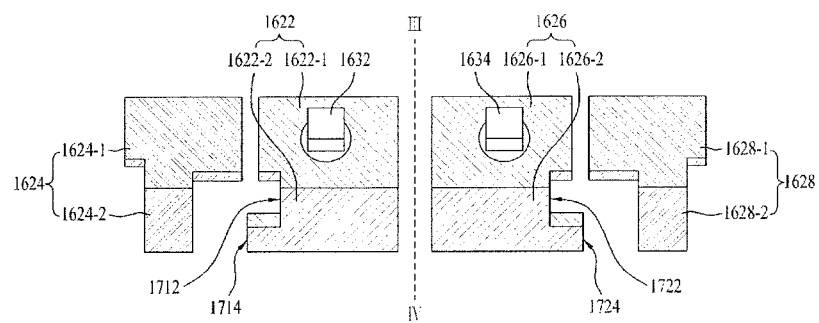
FIG. 58 is a perspective view showing first to fourth lead frames shown in FIG. 53.
Figure 59:
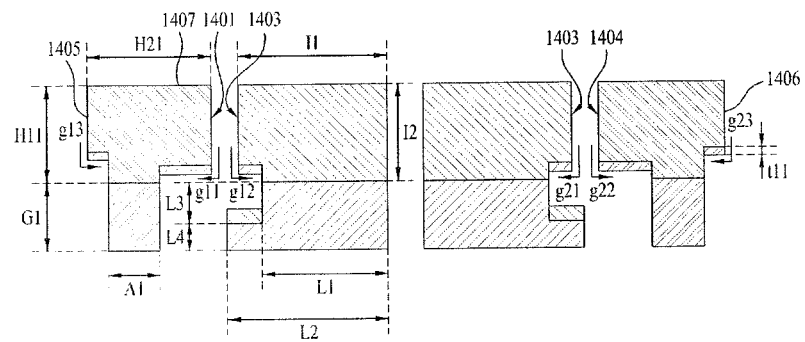
FIG. 59 is an enlarged view showing dimensions of respective portions of the first to fourth lead frames shown in FIG. 58.

FIG. 58 is a perspective view showing the first to fourth lead frames 1622 to 1628 shown in FIG. 53, and FIG. 59 is an enlarged view showing dimensions of respective portions of the first to fourth lead frames 1622 to 1628 shown in FIG. 58.

Referring to FIGS. 58 and 59, the first to fourth lead frames 1622 to 1628 respectively include upper surface portions 1622-1 to 1628-1, and side surface portions 1622-2 to 1628-2 bent from one side of the upper surface portions 1622-1 to 1628-1.

The upper surface portions 1622-1 to 1628-1 may be located on the same plane as the bottom 1603 of the cavity 1601 and exposed by the cavity 1601. The side surface portions 1622-2 to 1628-2 may be bent downward from one side of the upper surface portions by a given angle and exposed from one side surface of the package body 1610. For example, an angle between the upper surface portions 1622-1 to 1628-1 and the side surface portions 1622-2 to 1628-2 may be 90° or more and below 180.

The first lead frame 1622 may include the first upper surface portion 1622-1 and the first side surface portion 1622-2 bent from one side of the first upper surface portion 1622-1. In addition, the second lead frame 1624 may include the second upper surface portion 1624-1 and the second side surface portion 1624-2 bent from one side of the second upper surface portion 1624-1. In addition, the third lead frame 1626 may include the third upper surface portion 1626-1 and the third side surface portion 1626-2 bent from one side of the third upper surface portion 1626-1. In addition, the fourth lead frame 1628 may include the fourth upper surface portion 1628-1 and the fourth side surface portion 1628-2 bent from one side of the fourth upper surface portion 1628-1.

The first to fourth upper surface portions 1622-1 to 1628-1 may be located on the same plane as the bottom 1603 of the cavity 1601 and exposed by the cavity 1601. The first light emitting chip 1632 may be placed on the first upper surface portion 1622-1 of the first lead frame 1622, and the second light emitting chip 1634 may be placed on the third upper surface portion 1626-1 of the third lead frame 1626.

On the basis of a cut line III-IV, the first lead frame 1622 and the third lead frame 1626 may be symmetrical to each other, and the second lead frame 1624 and the fourth lead frame 1628 may be symmetrical to each other. With the symmetrical relationship between the lead frames 1622 and 1626 and between the lead frames 1624 and 1628, the package body 1610 may be efficiently and uniformly formed via injection of resin and the light emitting chips 1632 and 1634 may be mounted on the lead frames 1622 and 1626 so as not to deviate from each other.

The first upper surface portion 1622-1 and the third upper surface portion 1626-1 each may have a length I1 of 1.37 mm~1.47 mm in the first direction (along the X-axis) and a length I2 of 0.6 mm~0.7 mm in the second direction (along the Y-axis).

The first side surface portion 1622-2 may have a first upper end portion 1712 connected to the first upper surface portion 1622-1 and a first lower end portion 1714 connected to and located below the first upper end portion 1712. The third side surface portion 1626-2 may have a second upper end portion 1722 connected to the third upper surface portion 1626-1 and a second lower end portion 1724 connected to and located below the second upper end portion 1722.

The first upper end portion 1712 and the second upper end portion 1722 each may have a length L3 of 0.6 mm~0.7 mm in the third direction (along the Z-axis), and the first lower end portion 1714 and the second lower end portion 1724 each may have a third directional length L4 of 0.4 mm~0.5 mm.

A side surface of the first upper and portion 1712 and a side surface of the first lower end portion 1714 may be stepped, and a side surface of the second upper and portion 1722 and a side surface of the second lower end portion 1724 may be stepped. This stepped side surfaces serve to enhance coupling strength with the package body 1610 and to enhance airtightness for prevention of moisture invasion.

For example, one side end (e.g., a left end) of the first lower end portion 1714 may protrude in a lateral direction from the side surface (e.g., a left surface) of the first upper end portion 1712. In addition, one side end (e.g., a right end) of the second lower end portion 1724 may protrude in a lateral direction from the side surface (e.g., a right surface) of the second upper end portion 1722.

The first upper end portion 1712 and the second upper end portion 1722 each may have a first directional length L1 of 1.08 mm~1.18 mm, and the first lower end portion 1714 and the second lower end portion 1724 each may have a first directional length L2 of 1.38 mm~1.48 mm. That is, each of the first to fourth lead frames may have a thickness t11 of 0.1 mm~0.2 mm.

The third upper surface portion 1624-1 of the second lead frame 1624 may be located at one side (e.g., the left side) of the first upper surface portion 1622-1, and the fourth upper surface portion 1628-1 of the fourth lead frame 1628 may be located at one side (e.g., the right side) of the third upper surface portion 1626-1.

The second upper surface portion 1624-1 and the fourth upper surface portion 1628-1 each may have a length H21 of 0.7 mm~0.8 mm in the first direction (along the X-axis) and a length H11 of 0.65 mm~0.75 mm in the second direction (along the Y-axis).

The second side surface portion 1624-2 and the fourth side surface portion 1628-2 each may have a first directional length A1 of 0.4 mm~0.5 mm and a third directional length G1 of 1.05 mm~1.15 mm.

As exemplarily shown in FIG. 53, each of the first to fourth upper surface portions 1622-1 to 1628-1 may be at least partially exposed from the cavity 1601, and each of the first to fourth side surface portions 1622-2 to 1628-2 may be at least partially exposed from the same surface (e.g., a lower surface) of the package body 1610.

Neighboring facing side surfaces 1401 and 1402 of the first upper surface portion 1622-1 and the second upper surface portion 1624-1 may have the same length. In addition, neighboring facing side surfaces 1403 and 1404 of the third upper surface portion 1626-1 and the fourth upper surface portion 1628-1 may have the same length.

The facing side surfaces 1401 and 1404 of the first upper surface portion 1622-1 and the second upper surface portion 1624-1 may have stepped portions g11 and g12. In addition, the facing side surfaces 1403 and 1404 of the third upper surface portion 1626-1 and the fourth upper surface portion 1628-1 may have stepped portions g21 and g22. For example, the stepped portions g11, g12, g21 and g22 may be right-angled portions.

For example, the stepped portions g11, g12, g21 and g22 may be located in proximity to locations where the upper surface portions 1622-1 to 1628-1 and the side surface portions 1622-2 to 1628-2 meet each other.

The first side surface portion 1622-2 and the third side surface portion 1626-2 may be designed to have greater areas than areas of the second side surface portion 1624-2 and the fourth side surface portion 1628-2 due to the stepped portions g11, g12, g21 and g22. Accordingly, the embodiment may achieve enhanced radiation efficiency by increasing areas of the first lead frame 1622 and the third lead frame 1626 on which the light emitting chips 1632 and 1634 are mounted. This is because areas of the first lead frame 1622 and the third lead frame 1626 are related to radiation of the light emitting chips 1632 and 1634.

Side surfaces 1405 and 1406 of the second upper surface portion 1624-1 and the fourth upper surface portion 1628-1 may have stepped portions g13 and g23. The stepped portions g13 and g23 may be located at the side surfaces 1405 and 1406 which respectively face the side surface 1401 of the second upper surface portion 1624-1 and the side surface 1404 of the fourth upper surface portion 1628-1. In addition, the stepped portions g13 and g23 may be located in proximity to a location where the second upper surface portion 1624-1 and the second side surface portion 1624-2 meet each other and a location where the fourth upper surface portion 1628-1 and the fourth side surface portion 1628-2 meet each other.

The reason why the stepped portions g13 and g23 are present is to allow a bonding material (e.g., solder) for bonding of the light emitting diode package 300-1 to the flexible board 10 to be easily viewable.

The other side surfaces 1407 and 1408 of the second upper surface portion 1624-1 and the fourth upper surface portion 1628-1 may have stepped portions g31 and g32. In this case, the stepped portion g31 may be present at the side surface 1407 facing the side surface where the second upper surface portion 1624-1 and the second side surface portion 1624-2 meet each other, and the stepped portion g32 may be present at the side surface 1408 facing the side surface where the fourth upper surface portion 1628-1 and the fourth side surface portion 1628-2 meet each other.

The first to fourth side surface portions 1622-2 to 1628-2 may be mounted to come into contact with the flexible board 10 of the light source modules 100-1 to 100-21 according to the embodiments, which may allow the light emitting chips 1632 and 1634 to emit light in the lateral direction 3 toward the side surface of the light guide layer 40. That is, the light emitting diode package 300 may have a side view type structure.

The first light emitting chip 1632 may be mounted on the first upper surface portion 1622-1 of the first lead frame 1622 and electrically connected to the second upper surface portion 1624-1 of the second lead frame 1624 by the first wire 1642. The second light emitting chip 1634 may be mounted on the third upper surface portion 1626-1 of the third lead frame 1626 and electrically connected to the fourth upper surface portion 1628-1 of the fourth lead frame 1628 by the second wire 1644.

The light emitting diode package 300 may further include a resin layer (not shown) that fills the cavity 1601 to enclose the light emitting chips 1632 and 1634. The resin layer may be formed of a colorless and transparent polymer resin material such as epoxy or silicon.

The first light emitting chip 1632 and the second light emitting chip 1634 may generate light having different wavelength ranges. For example, the first light emitting chip 1632 may be a vertical chip that emits red light having a wavelength range of 600 nm-690 nm. Preferably, the first light emitting chip 1632 may emit light having a wavelength range of 615 nm-630 nm.

For example, the first light emitting chip 1632 may have a vertical light emitting chip structure described above with reference to FIG. 47. The first light emitting chip 1632 and the second light emitting chip 1634 each may have a size of 355 μm×355 μm.

The second light emitting chip 1634 may be a vertical chip that emits amber light having a wavelength range of 550 nm~600 nm. Preferably, light emitted from the second light emitting chip 1634 may have a wavelength of 589 nm. The second light emitting chip 1634 may have a vertical light emitting chip structure shown in FIG. 47. To generate light having different wavelength ranges, the first light emitting chip 1632 and the second light emitting chip 1634 may include different compositions of semiconductor layers. In addition, the first light emitting chip 1632 and the second light emitting chip 1634 may differ in terms of drive current, luminous intensity, and the like.

For example, the first semiconductor layer 1848 and the second semiconductor layer 1844 of each of the first light emitting chip 1632 and the second light emitting chip 1634 may comprise any one of AlGaInP, AlN, AlGaN, InAlGaN, AlInN, AlGaAs, and AlInP. Each of the first semiconductor layer 1848 and the second semiconductor layer 1844 of the first light emitting chip 1632 may comprise Al in a content of 0.65~0.75, and each of the first semiconductor layer 1848 and the second semiconductor layer 1844 of the second light emitting chip 1634 may comprise Al in a content of 0.85~0.95.

Since the content of Al in the first semiconductor layer 1848 and the second semiconductor layer 1844 of the second light emitting chip 1634 is greater than the content of Al in the first semiconductor layer 1848 and the second semiconductor layer 1844 of the first light emitting chip 1632, the second light emitting chip may exhibit a greater etch rate.

In addition, when the same drive current is applied, the first light emitting chip 1632 may have a greater luminous intensity than that of the second light emitting chip 1634 and may have a lower initial threshold voltage than that of the second light emitting chip 1634. In addition, the first light emitting chip 1632 and the second light emitting chip 1634 may require different drive currents.

The first light emitting chip 1632 and the second light emitting chip 1634 may be individually driven. For example, first power may be supplied to the first side surface portion 1622-2 of the first lead frame 1622, second power may be supplied to the second side surface portion 1624-2 of the second lead frame 1624, third power may be supplied to the third side surface portion 1626-2 of the third lead frame 1626, and fourth power may be supplied to the fourth side surface portion 1628-2 of the fourth lead frame 1628.

At least one of the first light emitting chip 1632 and the second light emitting chip 1634 may operate via control of the first power to the fourth power. For example, when the first power and the second power are supplied and the third power and the fourth power are interrupted, the first light emitting chip 1632 may emit light. In addition, when the first power and the second power are interrupted and the third power and the fourth power are supplied, the second light emitting chip 1634 may emit light. In some embodiments, the first light emitting chip 1632 and the second light emitting chip 1634 may simultaneously operate.

*The drive current to drive the first light emitting chip 1632 using the first power and the second power may have a maximum value of 70 mA, and luminous intensity may be 500 mcd. Here, "mcd" is millicandela.

The drive current to drive the second light emitting chip 1634 using the third power and the fourth power may have a maximum value of 70 mA, and luminous intensity may be 450 mcd.

In addition, different quantities of light may be generated by differentiating strengths of the drive current for the first light emitting chip 1632 and the second light emitting chip 1634. As described above, the light emitting diode package 300 according to the embodiment may emit two or more colors of light.

Figure 60:
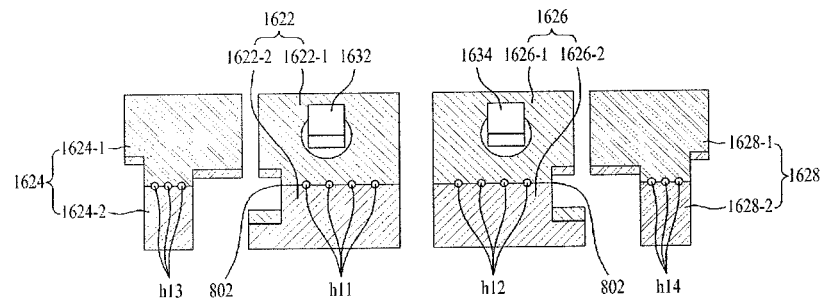
FIGS. 60 to 63 are views showing alternative embodiments of the first to fourth lead frames shown in FIG. 58.

FIG. 60 shows an alternative embodiment of the first to fourth lead frames shown in FIG. 58. Referring to FIG. 60, at least one of the first to fourth lead frames 1622 to 1628 may have at least one through-hole h11 to h14 at a boundary 802 between the upper surface portions 1622-1 to 1628-1 and the side surface portions 1622-2 to 1628-2.

The through-holes h11 and h12 may have a circular shape, oval shape or polygonal shape. The through-holes h11 and h12 may facilitate easy bending of the first lead frame 1622 and the third lead frame 1626, and may enhance coupling strength between the first lead frame 162 and the package body 1610 and the third lead frame 1626 and the package body 1610.

Figure 61:
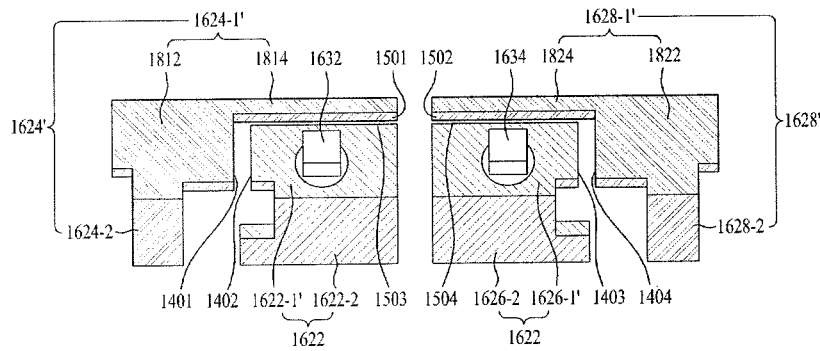

FIG. 61 shows another alternative embodiment of the first to fourth lead frames shown in FIG. 58. The same reference numerals as those of FIG. 58 indicate the identical components, and these identical components, which have been described above, will not be repeatedly described or will be described in brief.

Referring to FIGS. 58 and 61, areas of a first upper surface portion 1622-1' and a third upper surface portion 1626-1' are less than areas of the first upper surface portion 1622-1 and the third upper surface portion 1626-1 shown in FIG. 58.

The second upper surface portion 1624 shown in FIG. 58 is located to face only one side surface 1402 of the first upper surface portion 1622, whereas the second upper surface portion 1624-1' may be located to surround two neighboring side surfaces of the first upper surface portion 1622-1'.

For example, the second upper surface portion 1624-1' may include a first portion 1812 having the side surface 1401 facing one side surface 1402 of the first upper surface portion 1622-1', and a second portion 1814 having a side surface 1501 facing the other side surface 1503 of the first upper surface portion 1622-1'. The second portion 1814 may be expanded from the side surface 1401 of the first portion 1812, and the second side surface portion 1624-2 may be connected to the first portion 1812.

The fourth upper surface portion 1628-1' may be located to surround the two neighboring side surfaces of the third upper surface portion 1626-1'.

For example, the fourth upper surface portion 1628-1' may include a third portion 1822 having a side surface 1404 facing the side surface 1403 of the third upper surface portion 1626-1', and a fourth portion 1824 having the side surface 1502 facing the other side surface 1504 of the third upper surface portion 1626-1'. The fourth portion 1824 may be expanded from the side surface 1404 of the third portion 1822, and the fourth side surface portion 1628-2 may be connected to the third portion 1822.

Figure 62:
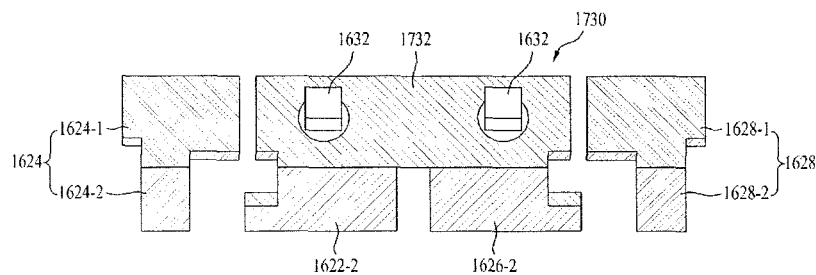

FIG. 62 shows another alternative embodiment of the first to fourth lead frames shown in FIG. 58. The same reference numerals as those of FIG. 58 indicate the identical components, and these identical components, which have been described above, will not be repeatedly described or will be described in brief.

In the embodiment shown in FIG. 62, the first upper surface portion 1622-1 of the first lead frame 1622 and the third upper surface portion 1626-1 of the third lead frame 1626 shown in FIG. 58 are connected to each other to construct a single common upper surface portion 1732. That is, the first lead frame 1622 and the third lead frame 1626 may be connected to each other via the common upper surface portion 1732 to construct a first common lead frame 1730. The first light emitting chip 1632 and the second light emitting chip 1634 may be disposed on the common upper surface portion 1732 of the first common lead frame 1730 so as to be spaced apart from each other.

Figure 63:
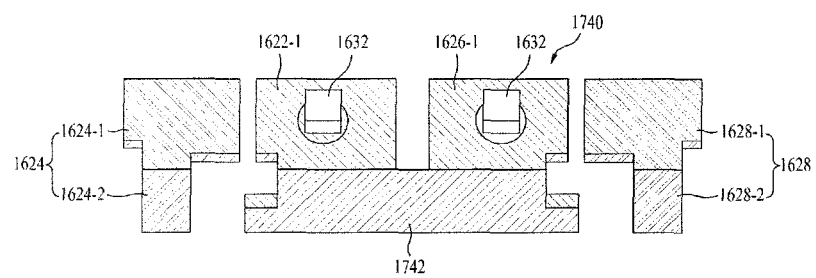

FIG. 63 shows another alternative embodiment of the first to fourth lead frames shown in FIG. 58. The same reference numerals as those of FIG. 58 indicate the identical components, and these identical components, which have been described above, will not be repeatedly described or will be described in brief.

In the embodiment shown in FIG. 63, the first side surface portion 1622-2 of the first lead frame 1622 and the third side surface portion 1626-2 of the third lead frame 1626 shown in FIG. 58 are connected to each other to construct a single common side surface portion 1742. That is, the first lead frame 1622 and the third lead frame 1626 may be connected to each other via the common side surface portion 1742 to construct a second common lead frame 1740.

When the first light emitting chip 1632 and the second light emitting chip 1634 individually operate, the light emitting diode package including the second common lead frame 1740 shown in FIG. 63 may have greater radiation efficiency than the light emitting diode package including the first common lead frame 1730 shown in FIG. 62.

Heat generated in the first light emitting chip 1632 and the second light emitting chip 1634 may be transferred to the first common upper surface portion 1732 of the first common lead frame 1730, whereas the upper surface portions 1622-1 and 1626-1 of the second common lead frame 1740 have different heat sources.

In addition, the first common lead frame 1740 has the separated side surface portions 1622-2 and 1626-2, whereas the second common lead frame 1740 has the integrated common side surface portion 1742. Accordingly, the second common lead frame 1740 may achieve greater radiation efficiency due to a greater radiation area than the first common lead frame 1730.

Figure 64:
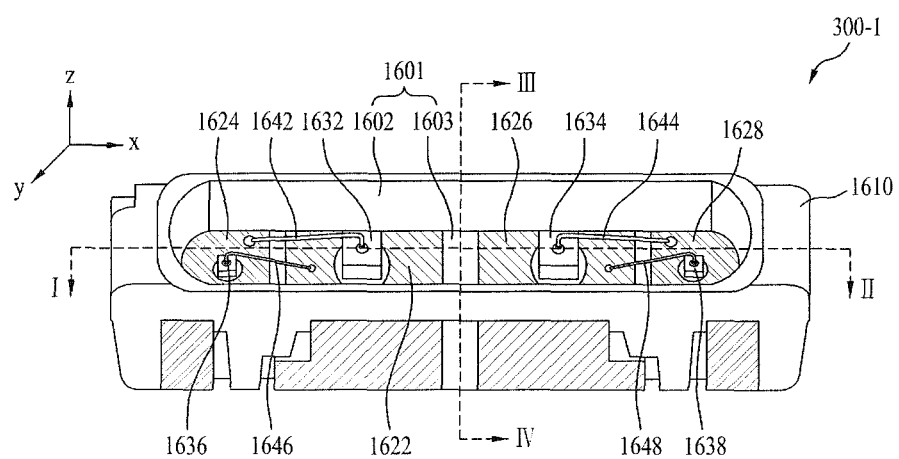
FIG. 64 is a view showing an alternative embodiment of the light emitting diode package shown in FIG. 53.

FIG. 64 is a view showing an alternative embodiment of the light emitting diode package shown in FIG. 53.

The embodiment shown in FIG. 64 further includes a first Zener diode 1636 and a second Zener diode 1638 as compared to the light emitting diode package 300 shown in FIG. 53.

The first Zener diode 1636 may be placed on the second upper surface portion 1624-1 of the second lead frame 1624 in order to enhance withstand voltage of the light emitting diode package 300. In addition, the second Zener diode 1638 may be disposed on the fourth upper surface portion 1628-1 of the fourth lead frame 1628. The first Zener diode 1636 may be electrically connected to the first upper surface portion 1622-1 of the first lead frame 1622 via a wire 1646. In addition, the second Zener diode 1638 may be electrically connected to the third upper surface portion 1626-1 of the third lead frame 1626 via a wire 1648.

Figure 65:
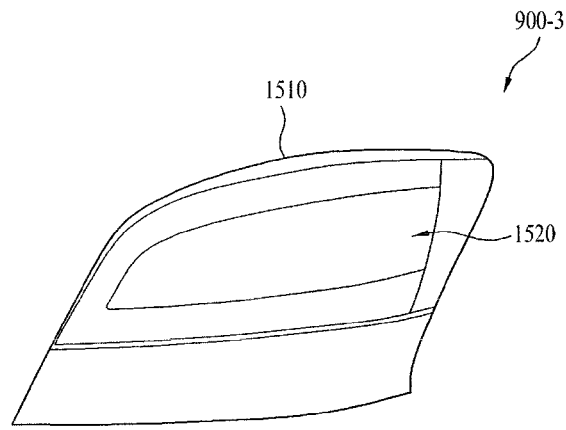
FIG. 65 is a view showing an automobile taillight including a light source module having the light emitting diode package shown in FIG. 53 or 64.
Figure 66:
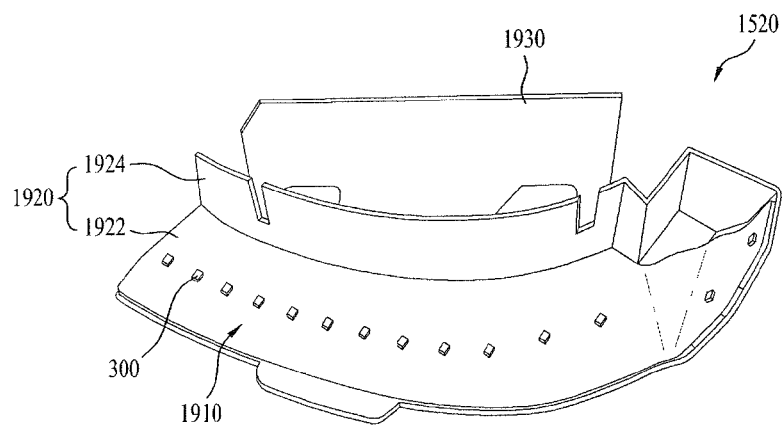
FIG. 66 is a view showing a light source module included in FIG. 65.

FIG. 65 shows an automobile taillight 900-3 including a light source module 1520 having the light emitting diode package shown in FIG. 53 or 64, and FIG. 66 shows the light source module 1520 included in FIG. 65.

Referring to FIGS. 65 and 66, the automobile taillight 900-3 may include a housing 1510 and a light source module 1520. The housing 1510 may be configured to receive the light source module 1520 and formed of a light transmitting material. The housing 1510 may have a curvature according to design of a car body.

The light source module 1520 may include a light source unit 1910, a support unit 1920 and a controller 1930. The light source unit 1910 may have the same configuration as any one of the above-described embodiments 100-1 to 100-21. In this case, the light emitting diode package 20 may be the light emitting diode package (e.g., 300 or 300-1) shown in FIG. 53 or 64 or a light emitting diode package including any one of the lead frame structures shown in FIG. 53 or 63.

The support unit 1920 may be configured to support the light source unit 1910 and the controller 1930 and to radiate heat generated in the light source unit 1910. For example, the support unit 1920 may include a first support portion 1922 and a second support portion 1924 bent from the first support portion 1922.

The light source unit 1910 may be secured to an upper surface of the first support portion 1922, and the controller 1930 may be secured to a back surface of the second support portion 1924.

The controller 1930 may be electrically connected to the light source unit 1910 and control emission of light from the first light emitting chip 1632 and the second light emitting chip 1634 of the light emitting diode package 300 or 300-1.

The controller 1930 may generate control signals and transmit the generated control signals to the light emitting diode package (e.g., 300 or 300-1). For example, the controller 1930 may generate four control signals and transmit any one of the generated four signals to a corresponding one of the first to fourth lead frames 1622 to 1628 of any one light emitting diode package (e.g., 300 or 300-1).

Only the first light emitting chip 1632 may be turned on, or only the second light emitting chip 1634 may be turned on and off at a given interval based on the control signals transmitted to the first to fourth lead frames 1622 to 1628.

In some embodiments, the controller 1930 may be located at the outside of the light source module 1520, and emission of light from the first light emitting chip 1632 and the second light emitting chip 1634 of the light emitting diode package (e.g., 300 or 300-1) mounted in the light source module 1520 may be controlled by the control signals from the external controller.

The light source module 1520 including the light emitting diode package (e.g., 300 or 300-1) shown in FIG. 53 or 64 may serve as not only an automobile turn signal light, but also a brake light.

Figure 67:
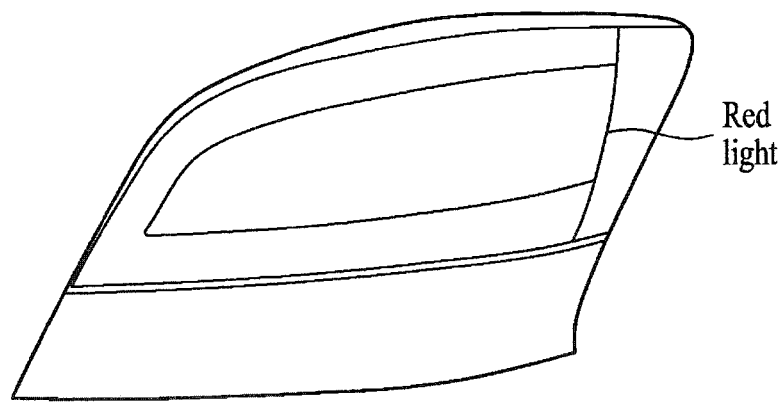
FIG. 67 is a view showing a light emission type upon operation of a first light emitting chip of the light emitting diode package that is mounted in the automobile taillight shown in FIG. 65.
Figure 68:
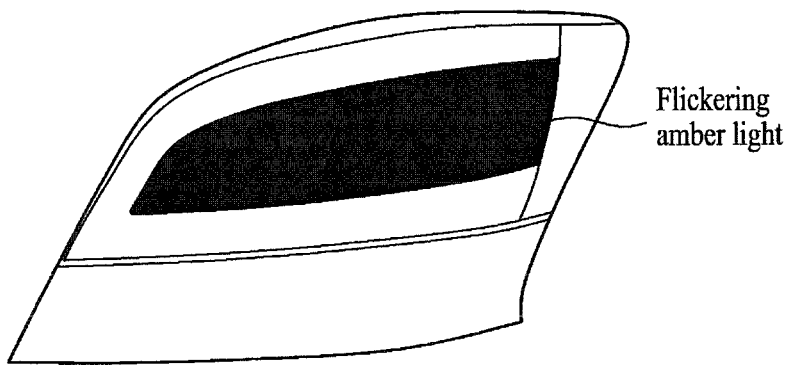
FIG. 68 is a view showing a light emission type upon operation of a second light emitting chip of the light emitting diode package that is mounted in the automobile taillight shown in FIG. 65.

FIG. 67 shows light emission upon operation of the first light emitting chip 1632 of the light emitting diode package (e.g., 300 or 300-1) that is mounted in the automobile taillight 900-3 shown in FIG. 65, and FIG. 68 is a view showing light emission upon operation of the second light emitting chip 1634 of the light emitting diode package (e.g., 300 or 300-1) that is mounted in the automobile taillight 900-3 shown in FIG. 65.

Referring to FIG. 67, when only the first light emitting chip 1632 of the light emitting diode package (e.g., 300 or 300-1) is operated to emit light in response to control signals from the controller 1930, the automobile taillight 900-3 may serve as a brake light having a red planar light source.

Referring to FIG. 68, when only the second light emitting chip 1634 of the light emitting diode package (e.g., 300 or 300-1) is turned on and off at a given interval in response to control signals from the controller 1930, a flickering (flashing) turn signal light having an amber planar light source may be acquired.

The automobile taillight 900-2 shown in FIG. 50 provides a brake light and a turn signal light using the two separate light source modules 952 and 956, whereas the automobile taillight 900-3 shown in FIG. 65 may provide a brake light and a turn signal light using the single light source module 1520. Accordingly, the embodiment 900-3 may reduce the number of chips required to construct the brake light and the turn signal light, which may enhance economic efficiency and reduce an occupation area of the automobile taillight within a car body.

Characteristics, configurations, effects, and the like described in the above embodiments are included in at least one embodiment of the present invention, but are not essentially limited to only one embodiment. It will be apparent to those skilled in the art that various modifications or combinations of the characteristics, configurations, effects, and the like exemplified in the respective embodiments can be made. Thus, it should be analyzed that all contents related to these modifications or combinations belong to the range of the present invention.

INDUSTRIAL APPLICABILITY

Light emitting diode packages according to the embodiments may be used in lighting devices and automobile lamps.

The invention claimed is:

1. A light emitting diode package comprising:
    a package body having an upper surface, side surfaces, and a cavity formed at the upper surface;
    first to fourth lead frames disposed within the package body; and
    a first light emitting chip and a second light emitting chip each including a first semiconductor layer, an active layer, and a second semiconductor layer, the first light emitting chip and the second light emitting chip emitting light of different wavelength ranges,
    wherein each of the first to fourth lead frames includes:
        an upper surface portion exposed to the cavity; and
        a side surface portion bent from one side of the upper surface portion, the side surface portion being exposed from one of the side surfaces of the package body,
    wherein the first light emitting chip is placed on the upper surface portion of the first lead frame,
    wherein the second light emitting chip is placed on the upper surface portion of the third lead frame,
    wherein at least one of the first to fourth lead frames has at least one through-hole aligned with a boundary between the upper surface portion and the side surface portion, and
    wherein the side surface portion of each of the first lead frame and the third lead frame includes an upper end portion and a lower end portion, and the upper end portion and the lower end portion have stepped side surfaces.

2. The package according to claim 1, wherein the first lead frame is located between the second lead frame and the fourth lead frame, and the third lead frame is located between the first lead frame and the fourth lead frame.

3. The package according to claim 1, wherein the first light emitting chip is configured to emit red light having a wavelength range of 600 nm~690 nm, and the second light emitting chip is configured to emit amber light having a wavelength range of 550 nm~600 nm.

4. The package according to claim 1, wherein a first distance between the first lead frame and the second lead frame and a second distance between the third lead frame and the fourth lead frame, which are exposed by the cavity may be equal to each other.

5. The package according to claim 4, wherein a third distance between the first lead frame and the third lead frame is greater than the first distance and the second distance.

6. The package according to claim 1, wherein part of the package body is located between the first lead frame and the second lead frame, between the first lead frame and the third lead frame, and between the third lead frame and the fourth lead frame.

7. The package according to claim 6, wherein the first to fourth lead frames are separated from each other by the part of the package body.

8. The package according to claim 1, wherein an upper surface of each of the first to fourth lead frames is located on the same plane as the bottom of the cavity.

9. The package according to claim 1, wherein the upper surface portion of the second lead frame is configured to surround two neighboring side surfaces of the upper surface portion of the first lead frame, and the upper surface portion of the fourth lead frame is configured to surround two neighboring side surfaces of the upper surface portion of the second lead frame.

10. The package according to claim 1, wherein the side surface portion of each of the first lead frame and the third lead frame includes an upper end portion and a lower end portion, and the lower end portion protrudes from the upper end portion in a lateral direction.

11. The package according to claim 1, further comprising:
    a first wire configured to electrically connect the first light emitting chip and the upper surface portion of the second lead frame to each other; and a second wire configured to electrically connect the second light emitting chip and the upper surface portion of the fourth lead frame to each other.

12. The package according to claim 1, further comprising:
a first Zener diode placed on the upper surface portion of the second lead frame;
a second Zener diode placed on the upper surface portion of the fourth lead frame;
a third wire configured to electrically connect the first Zener diode and the upper surface portion of the first lead frame to each other; and
a fourth wire configured to electrically connect the second Zener diode and the upper surface portion of the third lead frame to each other.

13. The package according to claim 1, wherein each of the first light emitting chip and the second light emitting chip includes:
a first electrode layer disposed on the first semiconductor layer;
a reflective layer disposed under the second semiconductor layer; and
a second electrode layer disposed under the reflective layer.

14. The package according to claim 13, wherein the first semiconductor layer and the second semiconductor layer comprises any one of AlGaInP, AlN, AlGaN, InAlGaN, AlInN, AlGaAs and AlInP, and
wherein a content of Al in the second light emitting chip is greater than a content of Al in the first light emitting chip.

15. The package according to claim 14, wherein the content of Al in the first light emitting chip is 0.65~0.75, and the content of Al in the second light emitting chip is 0.85~0.95.

16. The package according to claim 1, wherein facing side surfaces of the upper surface portions of the first and second lead frames have stepped portions, and
wherein the stepped portions are located in proximity to locations where the upper surface portions and the side surface portions of the first and second lead frames meet each other.

17. The package according to claim 1, wherein the first lead frame and the third lead frame are symmetrical to each other, and the second lead frame and the fourth lead frame are symmetrical to each other.

18. A light emitting diode package comprising:
a package body having a cavity;
first to fourth lead frames disposed within the package body; and
a first light emitting chip and a second light emitting chip each including a first semiconductor layer, an active layer, and a second semiconductor layer, the first light emitting chip and the second light emitting chip emitting light of different wavelength ranges,
wherein each of the first to fourth lead frames includes:
an upper surface portion exposed to the cavity; and
a side surface portion bent from one side of the upper surface portion, the side surface portion being exposed from one surface of the package body,
wherein the first light emitting chip is placed on the upper surface portion of the first lead frame,
wherein the second light emitting chip is placed on the upper surface portion of the third lead frame, and
wherein the upper surface portion of the first lead frame and the upper surface portion of the third lead frame directly contact each other.

19. A light emitting diode package comprising:
a package body having a cavity;
first to fourth lead frames disposed within the package body; and
a first light emitting chip and a second light emitting chip each including a first semiconductor layer, an active layer, and a second semiconductor layer, the first light emitting chip and the second light emitting chip emitting light of different wavelength ranges,
wherein each of the first to fourth lead frames includes:
an upper surface portion exposed to the cavity; and
a side surface portion bent from one side of the upper surface portion, the side surface portion being exposed from one surface of the package body,
wherein the first light emitting chip is placed on the upper surface portion of the first lead frame,
wherein the second light emitting chip is placed on the upper surface portion of the third lead frame, and
wherein the side surface portion of the first lead frame and the side surface portion of the third lead frame directly contact each other.

* * * * *